(12) United States Patent
Hatate et al.

(10) Patent No.: US 7,064,367 B2
(45) Date of Patent: Jun. 20, 2006

(54) MAGNETORESISTIVE ELEMENT, MAGNETIC MEMORY CELL, AND MAGNETIC MEMORY DEVICE

(75) Inventors: Hitoshi Hatate, Tokyo (JP); Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 67 days.

(21) Appl. No.: 10/960,122

(22) Filed: Oct. 8, 2004

(65) Prior Publication Data

US 2005/0099865 A1  May 12, 2005

(30) Foreign Application Priority Data

Oct. 10, 2003  (JP) .............................. 2003-352844

(51) Int. Cl.
*H01L 29/76* (2006.01)
(52) U.S. Cl. .................................................... 257/295
(58) Field of Classification Search .................. None
See application file for complete search history.

(56) References Cited

U.S. PATENT DOCUMENTS

| | | | |
|---|---|---|---|
| 5,343,422 A | 8/1994 | Kung et al. | 365/173 |
| 5,587,943 A | 12/1996 | Torok et al. | 365/158 |
| 5,629,922 A | 5/1997 | Moodera et al. | 369/126 |
| 6,404,674 B1 | 6/2002 | Anthony et al. | 365/173 |
| 6,417,561 B1 | 7/2002 | Tuttle | 257/659 |
| 6,797,536 B1* | 9/2004 | Yoda et al. | 438/48 |
| 6,879,515 B1* | 4/2005 | Yoda et al. | 365/158 |
| 6,909,130 B1* | 6/2005 | Yoda et al. | 257/295 |
| 6,927,468 B1* | 8/2005 | Yoda et al. | 257/422 |
| 6,960,815 B1* | 11/2005 | Yoda et al. | 257/421 |
| 2003/0123283 A1 | 7/2003 | Amano et al. | 365/173 |
| 2004/0021189 A1* | 2/2004 | Yoda et al. | 257/421 |

FOREIGN PATENT DOCUMENTS

| | | |
|---|---|---|
| EP | 1 387 400 A2 | 2/2004 |
| JP | A 9-91949 | 4/1997 |
| JP | A 2001-273759 | 10/2001 |

* cited by examiner

*Primary Examiner*—David Nelms
*Assistant Examiner*—Hoang-Quan Ho
(74) *Attorney, Agent, or Firm*—Oliff & Berridge, PLC

(57) ABSTRACT

The present invention provides a magneto-resistive element capable of stably performing information writing operation by efficiently using a magnetic field generated by current flowing in a conductor and to a magnetic memory device having the same. A magneto-resistive element is constructed so that the area of a cross section orthogonal to the circumferential direction of a pair of magnetic yokes becomes the smallest in connection parts facing stacked bodies. With the configuration, magnetic flux density of return magnetic fields generated by passing write current to write bit lines and write word lines can be made the highest in the connection parts. Thus, information can be written efficiently and stably.

22 Claims, 34 Drawing Sheets

MAGNETORESISTIVE ELEMENT, MAGNETIC MEMORY CELL, AND MAGNETIC MEMORY DEVICE

BACKGROUND OF THE INVENTION

1. Field of the Invention

The present invention relates to a magnetoresistive element and a magnetic memory cell each including a magneto-sensitive layer of which magnetization direction changes according to an external magnetic field, and to a magnetic memory device for recording/reading information by using a change in the magnetization direction of the magneto-sensitive layer in the magnetoresistive element and the magnetic memory cell.

2. Description of the Related Art

Conventionally, as general memories used for information processors such as a computer and a communication device, volatile memories such as a DRAM (Dynamic Random Access Memory) and an SRAM (Static RAM) are used. The volatile memories have to be refreshed by always supplying current to hold stored information. When the power source is turned off, all of information is lost, so that a nonvolatile memory as means for recording information has to be provided in addition to the volatile memory. For example, a flash EEPROM, a magnetic hard disk drive, or the like is used.

In the nonvolatile memories, as the speed of information processing increases, increase in speed of an access is becoming an important subject. Further, as a portable information device is being rapidly spread and the performance is becoming higher, information device development aiming at so-called ubiquitous computing which means that information processing can be performed everywhere at any time is rapidly being progressed. Development of a nonvolatile memory adapted for higher-speed processing as a key device of such information device development is in strong demand.

As a technique effective to increase the speed of the nonvolatile memory, a magnetic random access memory (hereinbelow, described as MRAM) is known in which magnetic memory elements each for storing information in accordance with the magnetization direction along the axis of easy magnetization of a ferromagnetic layer are arranged in a matrix. The MRAM stores information by using a combination of the magnetization directions in two ferromagnetic members. On the other hand, stored information is read by detecting a resistance change (that is, a change in current or voltage) which occurs between the case where the magnetization direction is parallel with a reference direction and the case where the magnetization direction is not parallel with the reference direction. Since the MRAM operates with the principle, it is important that the resistance change ratio is as high as possible to perform stable writing and reading in the MRAM.

The MRAM currently used in practice utilizes the giant magneto-resistive (GMR) effect. The GMR effect is a phenomenon such that when two magnetic layers are disposed so that their axes of easy magnetization are parallel with each other, in the case where the magnetization directions of the layers are in parallel to the axis of easy magnetization, the resistance value becomes the minimum. In the case where the magnetization direction is antiparallel to the axis of easy magnetization, the resistance value becomes the maximum. An MRAM using a GMR element capable of obtaining such a GMR effect (hereinbelow, described as GMR-MRAM) is disclosed in, for example, U.S. Pat. No. 5,343,422.

Recently, aiming at further improvement in storing speed, access speed, and the like, an MRAM having a TMR element using tunneling magneto-resistive effect (TMR) is proposed in place of the GMR-MRAM. The TMR effect is an effect such that the tunnel current passing through an insulating layer changes in accordance with relative angles of the magnetization directions of two ferromagnetic layers sandwiching a very-thin insulating layer (tunnel barrier layer). When the magnetization directions of the two ferromagnetic layers are parallel to each other, the resistance value becomes the minimum. On the contrary, when the magnetization directions are antiparallel to each other, the resistance value becomes the maximum. In the TMR-MRAM, when the TMR element has a configuration of, for example, "CoFe/aluminum oxide/CoFe", the resistance change ratio is high as 40% and the resistance value is also large. Consequently, the TMR-MRAM can be easily matched with a semiconductor device such as an MOSFET. Therefore, the TMR-MRAM can easily obtain a higher output as compared with the GMR-MRAM, and improvement in storage capacity and access speed is expected. In the TMR-MRAM, a current magnetic field is generated by passing current to a conductor as a write line disposed near the TMR element. By using the current magnetic field, the magnetization direction of the magnetic layer in the TMR element is changed to a predetermined direction, thereby storing information. As a method of reading stored information, a method of passing current in the direction perpendicular to a tunnel barrier layer and detecting a resistance change in the TMR element is known. Such TMR-MRAM techniques are disclosed in U.S. Pat. No. 5,629,922 and Japanese Patent Laid-open No. Hei 9-91949.

Recently, higher packing density of a magnetic memory device is in increasing demand and, accordingly, reduction in the size of the TMR element is also required. As the TMR element is becoming finer, due to the influence of a demagnetizing field generated by magnetic poles at both ends of the TMR element, a stronger magnetic field is required to align the magnetization direction in a magnetic layer (free magnetization direction layer) for storing information to a predetermined direction, and write current necessary at the time of writing information is on increasing trend. To solve the problem, a structure in which a closed magnetic circuit is formed in cooperation with the free magnetization direction layer around a conductor (write line) near the TMR element is proposed (refer to, for example, Japanese Patent Laid-open No. 2001-273759). Since the closed magnetic circuit is constructed by a free magnetization direction layer related to recording, the adverse influence exerted by the demagnetizing field can be avoided and a magnetic memory device of high packing density can be realized. Further, in this case, both of two write lines extend in the closed magnetic circuit, so that magnetization can be efficiently inverted.

However, even in the magnetic memory device having the structure as disclosed in Japanese Patent Laid-open No. 2001-273759, if the write current fluctuates, the strength of a return current magnetic field generated in the closed magnetic circuit also fluctuates. Consequently, it is expected that as the write current is being weakened, it becomes difficult to perform sufficiently stable writing operation.

SUMMARY OF THE INVENTION

The present invention has been achieved in consideration of such problems and its object is to provide a magneto-resistive element, a magnetic memory cell, and a magnetic memory device including the magneto-resistive element and the magnetic memory cell, to which information can be stably written by efficiently using a magnetic field generated by current flowing in a conductor.

A magneto-resistive element according to the invention includes: a magnetic yoke disposed in a partial region along an extension direction of a conductor and disposed in the circumferential direction so as to surround the conductor; and a stacked body including a magneto-sensitive layer of which magnetization direction changes according to an external magnetic field, and magnetically coupled to the magnetic yoke, and area of a cross section orthogonal to the circumferential direction of the magnetic yoke is the smallest in a part connected to the stacked body. "Surround" in the invention includes not only surrounding by a completely closed annular shape and also surrounding in a state where a part is open (imperfect surrounding). The "circumferential direction" denotes a direction around the conductor. The "external magnetic field" denotes a magnetic field generated by current flowing in the conductor or a return magnetic field generated in the magnetic yoke.

A magnetic memory cell according to the invention has a pair of magneto-resistive elements each comprising: a magnetic yoke disposed in a partial region along an extension direction of a conductor and disposed in the circumferential direction so as to surround the conductor; and a stacked body including a magneto-sensitive layer of which magnetization direction changes according to an external magnetic field, and magnetically coupled to the magnetic yoke. The pair of magneto-resistive elements shares a part of the magnetic yoke, and area of a cross section orthogonal to the circumferential direction of the magnetic yoke is the smallest in a part connected to the stacked body.

A magnetic memory device according to the invention has: a first write line; a second write line extending so as to cross the first write line and constructed so as to extend parallel to the first write line in a portion corresponding to an area of intersection with the first write line; and a magnetic memory cell including a pair of magneto-resistive elements. Each of the pair of magneto-resistive elements has: a magnetic yoke disposed in a partial region along an extension direction of the first and second write lines and disposed in the circumferential direction so as to surround the first and second write lines; and a stacked body including a magneto-sensitive layer of which magnetization direction changes according to an external magnetic field, and magnetically coupled to the magnetic yoke, and shares a part of the magnetic yoke. The area of a cross section orthogonal to the circumferential direction of the magnetic yoke is the smallest in a part connected to the stacked body.

In the magneto-resistive element, the magnetic memory cell, and the magnetic memory device according to the invention, the area of a cross section orthogonal to the circumferential direction of the magnetic yoke is the smallest in the part connected to the stacked body. Consequently, the magnetic flux density of a return magnetic field generated in the magnetic yoke when current is passed to the conductor (first and second write lines) becomes the highest in the connection part.

In the magneto-resistive element, the magnetic memory cell, and the magnetic memory device according to the invention, the area of the cross section in the magnetic yoke may gradually decrease toward the connection part. In this case, the width of the magnetic yoke may gradually decrease toward the connection part and become the smallest in the connection part or thickness of the magnetic yoke may gradually decrease toward the connection part and become the smallest in the connection part. The "width" of the invention denotes length of the extending direction of the conductor (first and second write lines) and the "thickness" of the invention indicates length in the direction to/from the conductor. Concretely, when the magnetic yoke is regarded as one ring, the thickness denotes dimension of the magnetic yoke in the radial direction of the ring.

In the magneto-resistive element, the magnetic memory cell, and the magnetic memory device according to the invention, the magnetic yoke may include one beam yoke extending in the direction along a layer stack face of the stacked body and having the connection part. Alternately, the magnetic yoke may include: a pair of pillar yokes facing each other over the conductor (first and second write lines) and extending in the direction orthogonal to the layer stack face of the stacked body; and one beam yoke connected to one end on the stacked body side, of each of the pair of pillar yokes and having the connection part, and may have a partially opened sectional shape. The magnetic yoke may include: a pair of pillar yokes facing each other over the conductor (first and second write lines) and extending in the direction orthogonal to the layer stack face of the stacked body; a first beam yoke connected to one end on the stacked body side, of each of the pair of pillar yokes and having the connection part, and a second beam yoke connected to the other end of each of the pair of pillar yokes, and may have a closed sectional shape.

In the magneto-resistive element, the magnetic memory cell, and the magnetic memory device according to the invention, the connection part may also serve as the magneto-sensitive layer.

In the magneto-resistive element, the magnetic memory cell, and the magnetic memory device of the invention, the area of a cross section orthogonal to the circumferential direction of the magnetic yoke is the smallest in the part connected to the stacked body. Consequently, the magnetic flux density of the return magnetic field generated in the magnetic yoke by passing current to the conductor (first and second write lines) can be made the highest in the connection part. Therefore, the magnetization of the magneto-sensitive layer can be efficiently inverted by smaller write current. Further, the magnetic flux density of the return magnetic filed can be increased close to a saturated state in the connection part, so that stable writing operation can be performed. Thus, the magneto-resistive element, the magnetic memory cell, and the magnetic memory device of the invention can be adapted to higher packing density and higher integration.

Other and further objects, features and advantages of the invention will appear more fully from the following description.

BRIEF DESCRIPTION OF THE DRAWINGS

FIG. 40A is a plan view showing a sixth modification of the magnetic memory cell illustrated in FIG. 5.

FIG. 40B is a cross section showing the sixth modification of the magnetic memory cell illustrated in FIG. 5.

DETAILED DESCRIPTION OF THE PREFERRED EMBODIMENTS

Figure 1:
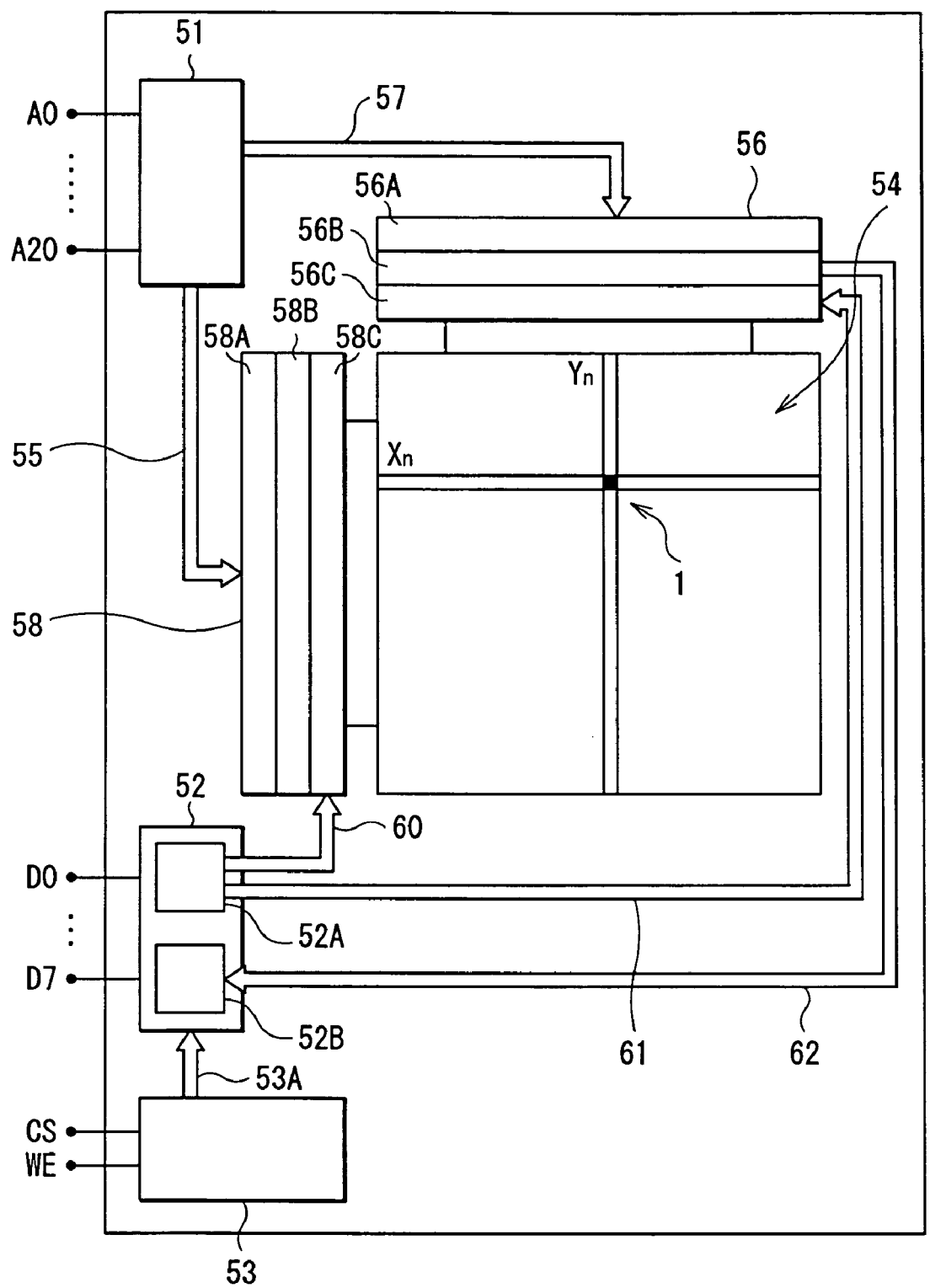
FIG. 1 is a block diagram showing a general configuration of a magnetic memory device according to a first embodiment of the invention.

Embodiments of the invention will be described in detail hereinbelow by referring to the drawings.

First, by referring to FIGS. 1 to 10, the configuration of a magnetic memory device according to a first embodiment of the invention will be described.

FIG. 1 is a conceptual diagram showing a general configuration of a magnetic memory device in the embodiment. The magnetic memory device has an address buffer 51, a data buffer 52, a control logic part 53, a memory cell group 54, a first drive control circuit part 56, a second drive control circuit part 58, external address input terminals A0 to A20, and external data terminals D0 to D7.

The memory cell group 54 has a matrix structure in which a number of memory cells 1 each having a pair of tunneling magneto-resistive elements (hereinbelow, called TMR elements) are arranged in a word line direction (X-direction) and a bit line direction (Y-direction) which are orthogonal to each other. The memory cell 1 is the minimum unit for storing data in the magnetic memory device and is a concrete example corresponding to a "magnetic memory cell" in the invention. The memory cell 1 will be described in detail later.

The first drive control circuit part 56 has an address decoder circuit 56A, a sense amplification circuit 56B, and a current drive circuit 56C in the Y-direction. The second drive control circuit part 58 has an address decoder circuit 58A, a constant current circuit 58B, and a current drive circuit 58C in the X-direction.

The address decoder circuits 56A and 58A are to select a word decode line 72 (which will be described later) and a bit decode line 71 (which will be described later) according to an input address signal. The sense amplification circuit 56B and the constant current circuit 58B are circuits driven at the time of performing reading operation. The current drive circuits 56C and 58C are circuits driven at the time of performing writing operation.

The sense amplification circuit 56B and the memory cell group 54 are connected to each other via a plurality of bit decode lines 71 in which the sense current flows at the time of reading operation. Similarly, the constant current circuit 58B and the memory cell group 54 are connected to each other via a plurality of word decode lines 72 in which the sense current flows at the time of reading operation.

The Y-direction current drive circuit 56C and the memory cell group 54 are connected to each other via write bit lines 5 (which will be described later) necessary at the time of writing operation. Similarly, the X-direction current drive circuit 58C and the memory cell group 54 are connected to each other via write word lines 6 (which will be described later) necessary at the time of writing operation.

The address buffer 51 has the external address input terminals A0 to A20 and is connected to the Y-direction address decoder circuit 56A in the first drive control circuit part 56 via a Y-direction address line 57 and to the X-direction address decoder circuit 58A in the second drive control circuit part 58 via an X-direction address line 55. The address buffer 51 receives an address signal from the outside via the external address input terminals A0 to A20 and amplifies the address signal to a voltage level required in the Y-direction address decoder circuit 56A and the X-direction address decoder circuit 58A by a buffer amplifier (not shown) provided in the address buffer 51. Further, the address buffer 51 functions to divide the amplified address signal into two signals and output the signals to the Y-direction address decoder circuit 56A via the Y-direction address line 57 and to the X-direction address decoder circuit 58A via the X-direction address line 55.

The data buffer 52 is constructed by an input buffer 52A and an output buffer 52B, has the external data terminals D0 to D7, is connected to the control logic part 53, and operates by an output control signal 53A from the control logic part 53. The input buffer 52A is connected to the Y-direction current drive circuit 56C in the first drive control circuit part 56 and the X-direction current drive circuit 58C in the second drive control circuit part 58 via a Y-direction write data bus 61 and an X-direction write data bus 60, respectively. At the time of performing an operation of writing data to the memory cell group 54, the input buffer 52A functions to receive signal voltages of the external data terminals D0 to D7, amplify the signal voltage to a required voltage level by an internal buffer amplifier (not shown), and transmit the resultant voltage to the X-direction current drive circuit 58C and the Y-direction current drive circuit 56C via the X-direction write data bus 60 and the Y-direction write data bus 61, respectively. The output buffer 52B is connected to the sense amplification circuit 56B via a Y-direction read data bus 62. At the time of reading an information signal stored in the memory cell group 54, the output buffer 52B functions to amplify the information signal supplied from the sense amplification circuit 56B by an internally provided buffer amplifier (not shown) and to output the resultant signal with low impedance to the external data terminals D0 to D7.

The control logic part 53 has a chip select terminal CS and a write enable terminal WE and is connected to the data buffer 52. The control logic part 53 functions to receive a signal voltage from the chip select terminal CS for selecting a memory cell to be subject to reading/writing from the group 54 of plural memory cells and a signal voltage from the write enable terminal WE for outputting a write permit signal and to output the output control signal 53A to the data buffer 52.

The configuration related to information writing operation in the magnetic memory device shown in FIG. 1 will now be described.

Figure 2:
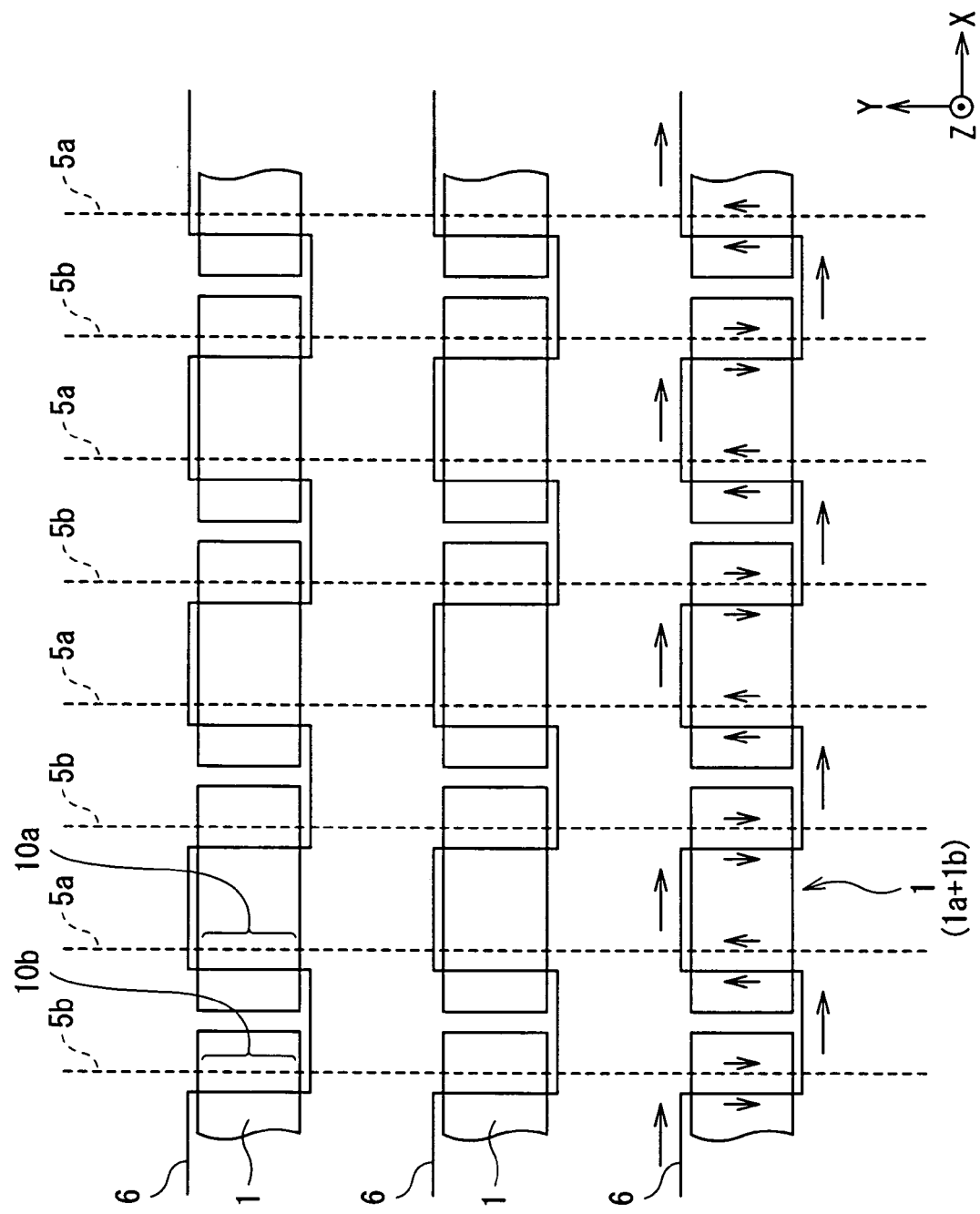
FIG. 2 is a plan view showing the configuration of a write line of the magnetic memory device illustrated in FIG. 1.

FIG. 2 is a conceptual diagram showing a configuration in plan view of a main part related to the writing operation in the memory cell group 54. As shown in FIG. 2, the magnetic memory device of the embodiment includes a plurality of write bit lines 5a and 5b and the plurality of write word lines 6 extending so as to cross the plurality of write bit lines 5a and 5b. Each region where the write bit lines 5a and 5b and the write word line 6 cross each other includes a parallel part 10a in which the write bit line 5a and the write word line 6 extend parallel with each other and a parallel part 10b in which the write bit line 5b and the write word line 6 extend parallel with each other. Concretely, as shown in FIG. 2, the write word lines 6 extend in the X-direction in a rectangular wave shape and the write bit lines 5a and 5b extend in the Y-direction alternately and linearly. The rising and falling portions of the rectangular wave shape of the write word lines 6 form the plurality of parallel parts 10a and 10b in cooperation with the write bit lines 5a and 5b. The memory cell 1 is provided in each of the regions where the write bit lines 5a and 5b cross the write word line 6 so as to include at least a part of the parallel parts 10a and 10b. The configuration that the memory cell 1 is provided in the crossing region includes a case where the memory cell 1 is provided next to the intersecting point. The memory cell 1 is constructed by TMR elements 1a and 1b, the TMR element 1a is provided in a region where the write bit line 5a and the write word line 6 cross each other, and the other TMR element 1*b* is provided in the region where the write bit line 5*b* and the write word line 6 cross each other. The TMR elements 1*a* and 1*b* are a concrete example of "a pair of magneto-resistive elements" of the invention.

To the write bit lines 5*a* and 5*b* and the write word line 6, currents from the Y-direction current drive circuit 56C and the X-direction current drive circuit 58C flow. The current flowing in the write bit line 5*a* and the current flowing in the write bit line 5*b* are always in the opposite directions. For example, as shown by the arrows in FIG. 2, when the current direction in the write bit lines 5*a* is set as +Y direction, the current direction in the write bit lines 5*b* is −Y direction. Therefore, in this case, when the current directions in the write word lines 6 are set as +X direction as a whole (from left to right in the drawing sheet), the direction of current in the write bit line 5*a* and that in the write word line 6 in the TMR element la are parallel with each other. The direction of current in the write bit line 5*b* and that in the write word line 6 flowing in the other TMR element 1*b* are also parallel with each other. In the following, if it is unnecessary to discriminate the current directions from each other, the write bit lines 5*a* and 5*b* will be simply referred to as the write bit lines 5. The write word line 6 is a concrete example corresponding to a "first write line" of the invention, and the write bit line 5 is a concrete example corresponding to a "second write line" of the invention.

Figure 3:
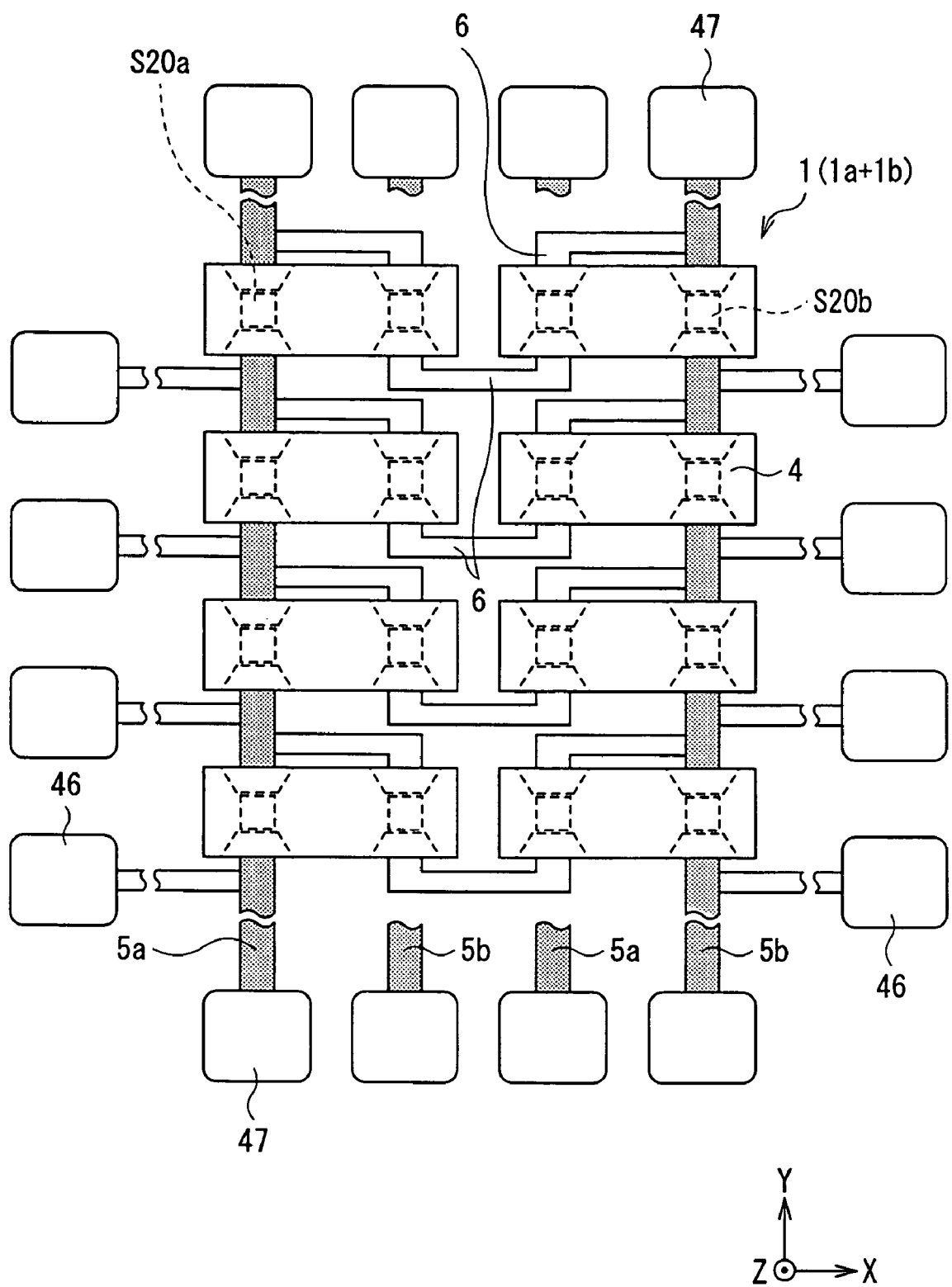
FIG. 3 is a partial plan view showing the configuration of a main part of a memory cell group in the magnetic memory device illustrated in FIG. 1.

FIG. 3 shows the configuration in plan view of the main part of the memory cell group 54 more specifically. The write bit lines 5*a* and 5*b*, write word lines 6, and memory cells 1 (TMR elements 1*a* and 1*b*) shown in FIG. 3 correspond to those in FIG. 2. The TMR elements 1*a* and 1*b* are disposed in the parallel parts 10*a* and 10*b* of the write bit lines 5*a* and 5*b* and the write word lines 6. The TMR elements 1*a* and 1*b* have stacked bodies S20*a* and S20*b* each including a magneto-sensitive layer and the magnetic yokes 4*a* and 4*b*, respectively, and the magnetization direction of the magneto-sensitive layer changes according to the magnetic field generated by the currents flowing in the write bit lines 5*a* and 5*b* and the write word lines 6 in the parallel parts 10*a* and 10*b* (that is, the external magnetic field in the magnetic yokes 4*a* and 4*b*). In this case, the write bit lines 5*a* and 5*b* and the write word line 6 in the parallel parts 10*a* and 10*b* are provided in almost matched positions in the XY plane. In the Z direction, however, they are disposed with a predetermined interval and are electrically insulated from each other.

At both ends of each write bit line 5, write bit line lead electrodes 47 are provided. One of the write bit line lead electrodes 47 is connected to the Y-direction current drive circuit 56C and the other one is connected so as to be finally grounded. Similarly, write word line lead electrodes 46 are provided at both ends of each write word line 6. One end of each write word line lead electrode 46 is connected to the X-direction current drive circuit 58C and the other end is connected so as to be finally grounded. In FIG. 3, the write bit lines 5 are partially omitted so that the shape of the write word lines 6 can be seen well.

Figure 4:
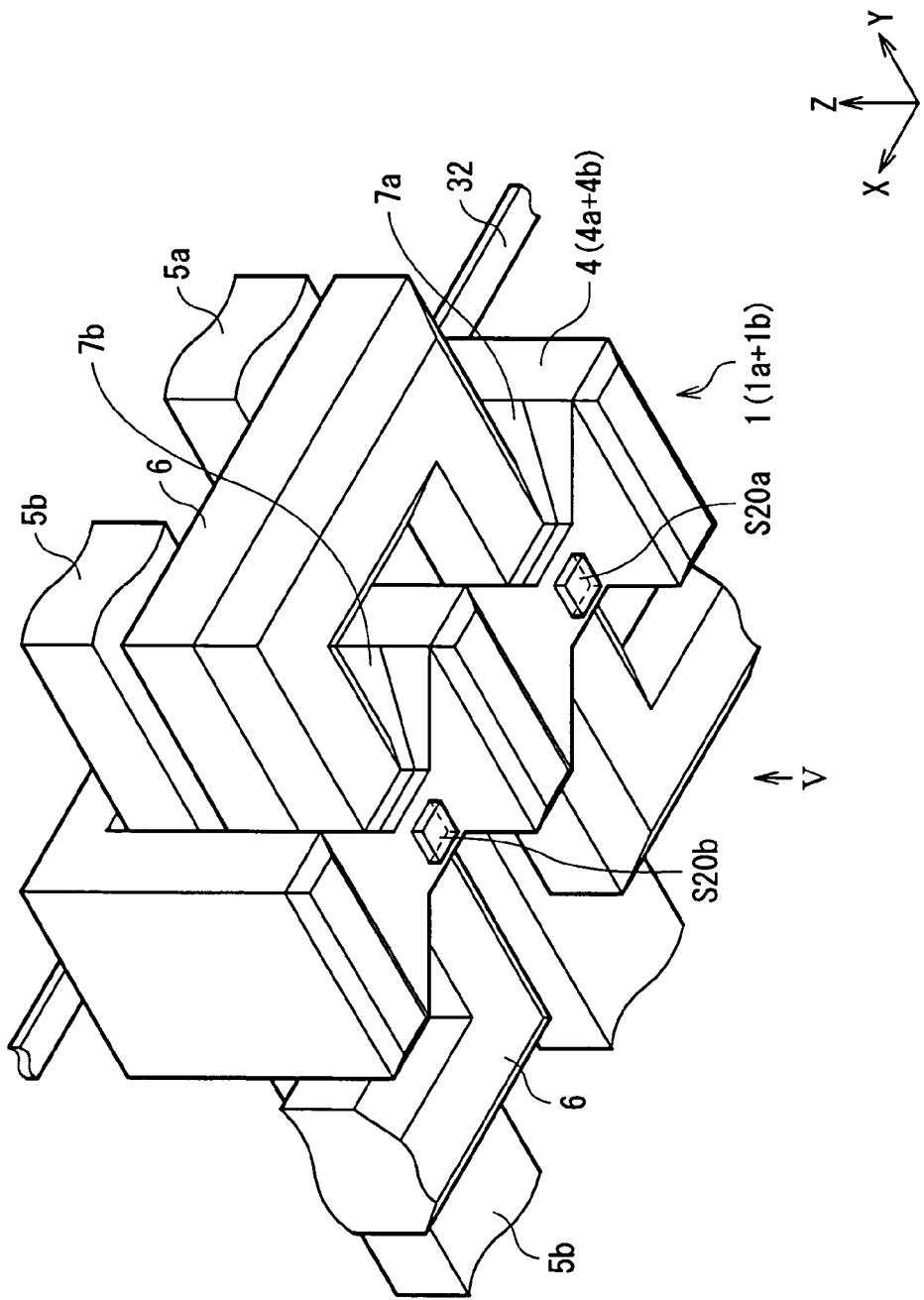
FIG. 4 is a perspective view showing the configuration of a main part of the memory cell group in the magnetic memory device illustrated in FIG. 1.
Figure 5:
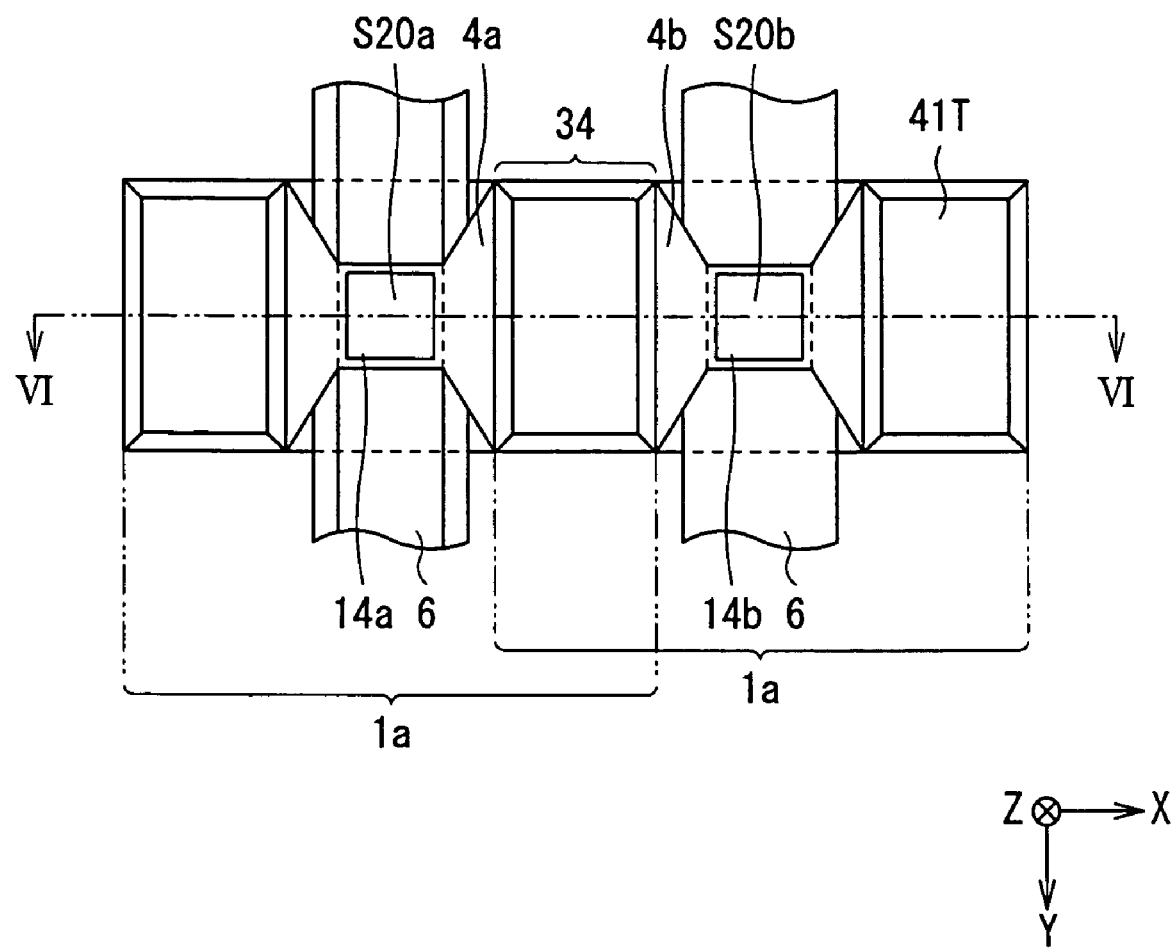
FIG. 5 is a plan view showing the configuration seen from the direction of the arrow V of the magnetic memory cell illustrated in FIG. 4.
Figure 6:
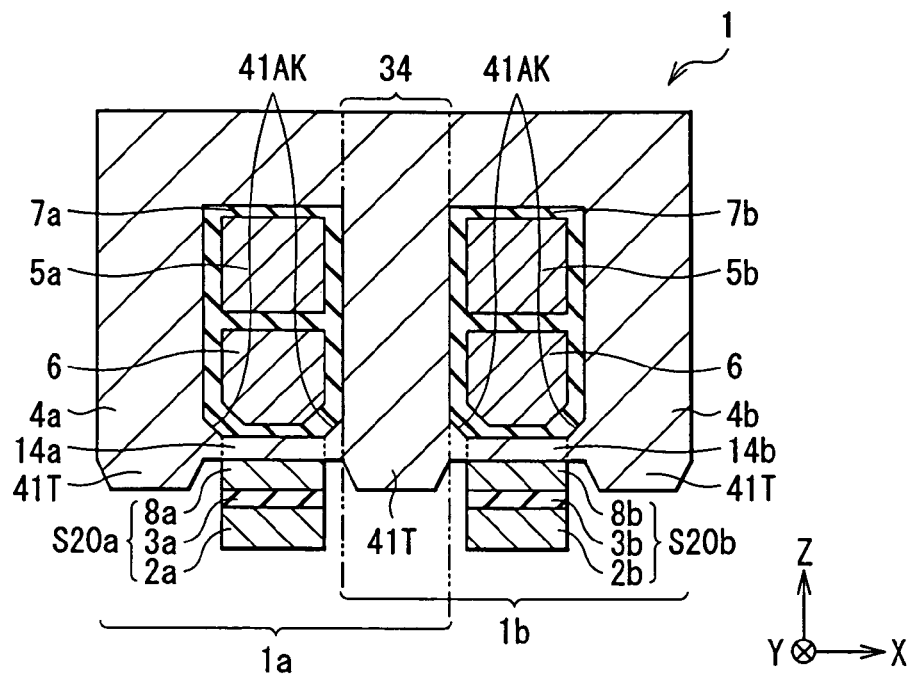
FIG. 6 is a cross section showing the configuration of a plane taken along line VI—VI of the magnetic memory cell illustrated in FIG. 5.
Figure 7:
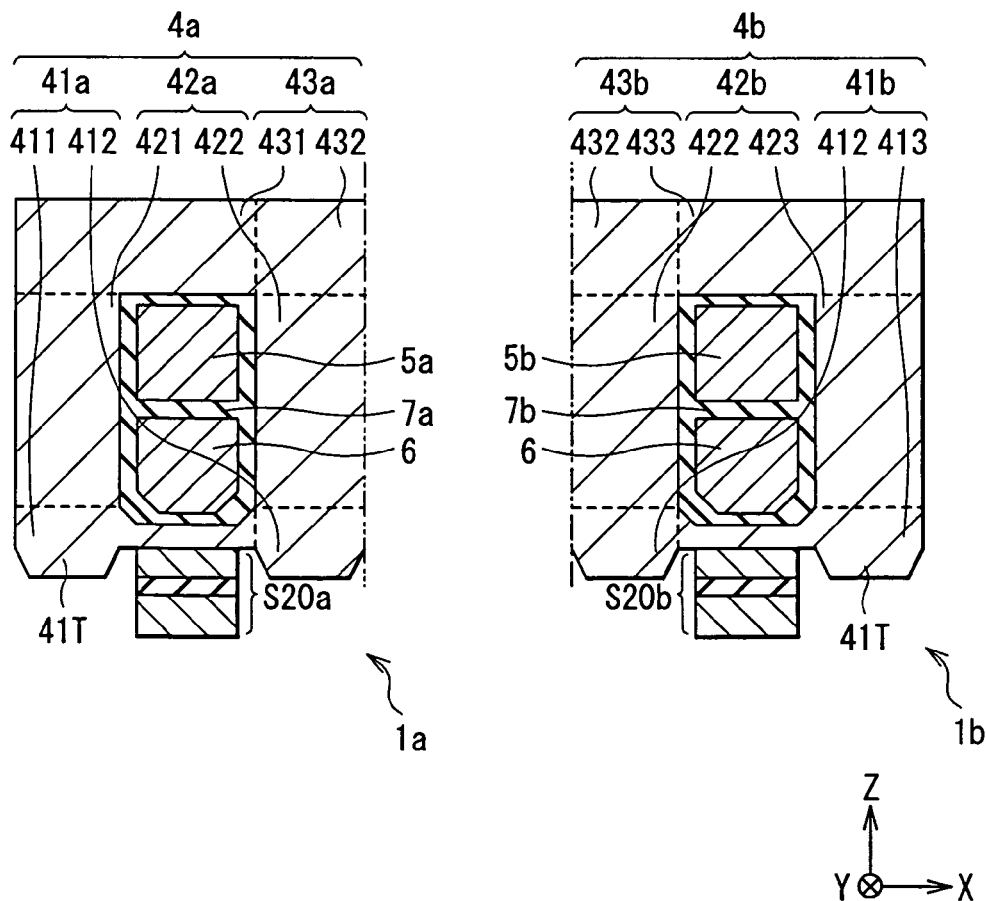
FIG. 7 is a cross section showing that the magnetic memory cell in FIG. 6 is conceptually divided into two TMR elements.

FIG. 4 is an enlarged perspective view of the memory cell 1. FIG. 5 is a plan view seen from the direction of the arrow V shown in FIG. 4. FIG. 6 is a cross section taken along line VI—VI of FIG. 5. FIG. 7 shows that the memory cell 1 in FIG. 6 is conceptually divided into the TMR elements 1*a* and 1*b*.

As shown in FIGS. 4 to 7, the memory cell 1 has the pair of TMR elements 1*a* and 1*b* having magnetic yokes 4*a* and 4*b* and stacked bodies S20*a* and S20*b*, respectively. The write word line 6, write bit lines 5*a* and 5*b* and magnetic yokes 4*a* and 4*b* are electrically insulated from each other via insulating films 7*a* and 7*b*. The stacked bodies S20*a* and S20*b* are formed on the surface of the magnetic yokes 4*a* and 4*b* on the side opposite to the write bit lines 5*a* and 5*b* over the write word lines 6, respectively. A read word line 32 is provided so as to extend in the X-direction on the side opposite to the face where the stacked bodies S20*a* and S20*b* are formed, of the magnetic yokes 4*a* and 4*b*. The pair of stacked bodies S20*a* and S20B is connected to conductive layers 36*a* and 36*b* (which will be described later) formed on the side opposite to the magnetic yokes 4*a* and 4*b*. The pair of conductive layers 36*a* and 36*b* is a part of a pair of Schottky diodes 75*a* and 75*b* (which will be described later) and the other end of each of the Schottky diodes 75*a* and 75*b* is connected to read bit lines 33*a* and 33*b* (which will be described later) extending in the Y-direction. The Schottky diodes 75*a* and 75*b* are buried in a substrate 31 (which will be described later). The stacked bodies S20*a* and S20*b* are provided on the bottom side of the magnetic yokes 4*a* and 4*b* (the substrate 31 side). FIG. 4 shows the memory cell from below so that the positional relation between the stacked bodies S20*a* and S20*b* and the magnetic yokes 4*a* and 4*b* and the shape of the magnetic yokes 4*a* and 4*b* can be easily grasped.

The TMR element 1*a* in the memory cell 1 has: the magnetic yoke 4*a* disposed in correspondence with the area (parallel part 10*a*) where the write bit line 5*a* and the write word line 6 cross each other and disposed in the circumferential direction so as to surround the periphery of the write bit line 5*a* and the write word line 6; and the stacked body S20*a* including a second magnetic layer 8*a* as a magneto-sensitive layer of which magnetization direction changes according to an external magnetic field, magnetically coupled to the magnetic yoke 4*a*, and disposed so that current flows in the direction perpendicular to the stacked face. The other TMR element 1*b* has: the magnetic yoke 4*b* disposed in correspondence with the area (parallel part 10*b*) where the write bit line 5*b* and the write word line 6 cross each other and disposed in the circumferential direction so as to surround the periphery of the write bit line 5*b* and the write word line 6; and the stacked body S20*b* including a second magnetic layer 8*b* as a magneto-sensitive layer of which magnetization direction changes according to an external magnetic field, is magnetically coupled to the magnetic yoke 4*b*, and constructed so that current flows in the direction perpendicular to the stacked face. The pair of TMR elements 1*a* and 1*b* share a common part 34 as a part of the magnetic yokes 4*a* and 4*b*. As shown in FIGS. 5 and 6, the pair of magnetic yokes 4*a* and 4*b* are constructed so that their sectional areas orthogonal to the circumferential direction gradually decrease toward the connection parts 14*a* and 14*b* with the stacked bodies S20*a* and S20*b* and become the smallest in the connection parts 14*a* and 14*b*. That is, the width and thickness of the magnetic yokes 4*a* and 4*b* gradually decrease toward the connection parts 14*a* and 14*b* and become the smallest in the connection parts 14*a* and 14*b*. The connection parts 14*a* and 14*b* are part of the magnetic yokes 4*a* and 4*b* and magnetically coupled to the stacked bodies S20*a* and S20*b*, respectively.

As shown in FIGS. 6 and 7, the stacked bodies S20*a* and S20*b* are TMR films including, in order from the side of the magnetic yokes 4*a* and 4*b* (connection parts 14*a* and 14*b*), the second magnetic layers 8*a* and 8*b*, tunnel barrier layers 3*a* and 3*b*, and first magnetic layers 2*a* and 2*b* whose magnetization direction is fixed and are constructed so that current flows in the direction perpendicular to the stacked face. In FIGS. 6 and 7, to clarify the configuration of the stacked bodies S20a and S20b, the stacked bodies S20a and S20b are exaggerated so as to be larger relative to the peripheral parts. The second magnetic layers 8a and 8b as magneto-sensitive layers (also called free magnetization direction layers) are magnetic-exchange-coupled with the connection parts 14a and 14b.

When the magnetization directions of the pair of TMR elements 1a and 1b are inverted in the directions which are antiparallel to each other, in the common part 34, the directions of current magnetic fields generated by the write bit lines 5a and 5b and the write word line 6 become the same and the magnetic flux density increases. Consequently, the current magnetic field can be used more efficiently, and the current necessary to invert the magnetization directions of the connection parts 14a and 14b of the magnetic yokes 4a and 4b and the second magnetic layers 8a and 8b can be further decreased. Since the magnetic yoke 4 is shared, the pair of TMR elements 1a and 1b can be easily formed, the formation area of the memory cell 1 can be reduced, and capacity of stored information can be increased.

In the stacked bodies S20a and S20b, when a voltage is applied in the direction perpendicular to the stacked face between the first magnetic layers 2a and 2b and the second magnetic layers 8a and 8b, for example, electrons in the first magnetic layers 2a and 2b pass through the tunnel barrier layers 3a and 3b and move to the second magnetic layers 8a and 8b, and tunnel current flows. The tunnel current changes according to a relative angle between the spin in the first magnetic layers 2a and 2b in the interface with the tunnel barrier layer 3 and the spin in the second magnetic layers 8a and 8b. Specifically, when the spin of the first magnetic layers 2a and 2b and that of the second magnetic layers 8a and 8b are parallel to each other, the resistance value becomes the minimum. When they are antiparallel to each other, the resistance value becomes the maximum. By using the resistance values, the magneto-resistance change ratio (MR ratio) is defined as Equation (1).

$$MR\ ratio = dR/R \quad (1)$$

where "dR" denotes the difference between the resistance value in the case where the spins are parallel to each other and that in the case where the spins are antiparallel to each other, and "R" indicates the resistance value in the case where the spins are parallel to each other.

The resistance value against the tunnel current (hereinbelow, called tunnel resistance Rt) strongly depends on the thickness T of the tunnel barrier layer 3. In a low voltage region, as shown in Equation (2), the tunnel resistance Rt exponentially increases with the thickness T of the tunnel barrier layer 3.

$$Rt \propto \exp(2\chi^T), \chi = \{8\pi^2 m^*(\phi \cdot Ef)^{0.5}\}/h \quad (2)$$

where $\phi$ denotes the height of the barrier, "$m^*$" denotes effective mass of electrons, "Ef" indicates Fermi energy, and h indicates a Planck's constant. Generally, in a memory element using the TMR element, to match with a semiconductor device such as a transistor, it is said that the proper tunnel resistance Rt is about tens $k\Omega \cdot (\mu m)^2$. However, to realize higher packing density in the magnetic memory device and higher operating speed, the tunnel resistance Rt is set to, preferably, $10\ k\Omega \cdot (\mu m)^2$ or less, more preferably, $1\ k\Omega \cdot (\mu m)^2$ or less. Therefore, to realize the tunnel resistance Rt, it is desirable to set the thickness T of the tunnel barrier layers 3a and 3b to 2 nm or less, more preferably, 1.5 nm or less.

By reducing the thickness T of the tunnel barrier layers 3a and 3b, the tunnel resistance Rt can be reduced but on the other hand, a leak current occurs due to roughness of the junction interfaces with the first magnetic layers 2a and 2b and the second magnetic layers 8a and 8b so that the MR ratio deteriorates. To prevent this, the thickness T of the tunnel barrier layers 3a and 3b has to be large to an extent that leak current does not flow. Concretely, the thickness T is desirably 0.3 nm or larger.

Desirably, the stacked bodies S20a and S20b have a coercive force differential structure and the coercive force of the first magnetic layers 2a and 2b is larger than that of the second magnetic layers 8a and 8b. Concretely, the coercive force of the first magnetic layer 2 is preferably larger than $(50/4\pi) \times 10^3$ A/m, more preferably, $(100/4\pi) \times 10^3$ A/m. With the configuration, the magnetization direction of the first magnetic layers 2a and 2b can be prevented from being influenced by undesirable magnetic fields such as external scattered magnetic fields or the like. The first magnetic layers 2a and 2b are made of, for example, cobalt iron alloy (CoFe) and have a thickness of 5 nm. Alternately, cobalt (Co), cobalt platinum alloy (CoPt), nickel iron cobalt alloy (NiFeCo), or the like can be applied to the first magnetic layers 2a and 2b. The second magnetic layers 8a and 8b are made of, for example, cobalt (Co), cobalt iron alloy (CoFe), cobalt platinum alloy (CoPt), nickel iron alloy (NiFe), or nickel iron cobalt alloy (NiFeCo). The axes of easy magnetization of the first magnetic layers 2a and 2b and the second magnetic layers 8a and 8b are preferably parallel to each other so that the magnetization direction of the first magnetic layers 2a and 2b and that of the second magnetic layers 8a and 8b are stabilized in a parallel or antiparallel state.

The magnetic yokes 4a and 4b extend so as to annularly surround at least a part of the parallel parts 10a and 10b in the write bit lines 5a and 5b and the write word line 6 and are constructed so that a return magnetic field is generated in the magnetic yokes 4a and 4b by current flowing in the parallel parts 10a and 10b. More specifically, as shown in FIG. 7, the magnetic yoke 4a includes: a pair of pillar yokes 42a (421 and 422) extending in the direction (Z direction) orthogonal to a stacked layer face of the stacked body S20a while facing each other over the write bit line 5a and the write word line 6; a first beam yoke 41a connected to one end on the side of the stacked body S20a of each of the pair of pillar yokes 42a (421 and 422); and a second beam yoke 43a connected to the other end of each of the pair of pillar yokes 42a (421 and 422). The magnetic yoke 4a has a closed sectional shape. The other magnetic yoke 4b includes: a pair of pillar yokes 42b (422 and 423) extending in the direction (Z direction orthogonal to the stacked layer face of the stacked body S20b while facing each other over the write bit line 5a and the write word line 6; a first beam yoke 41b connected to one end on the side of the stacked body S20b of each of the pair of pillar yokes 42b (422 and 423); and a second beam yoke 43b connected to the other end of each of the pair of pillar yokes 42b (422 and 423). The magnetic yoke 4b also has a closed sectional shape. The first beam yoke 41a has an inherent region 411 and a common region 412, and the other first beam yoke 41b has an inherent region 413 and the common region 412. The pair of pillar yokes 42a has the inherent pillar yoke 421 and the common pillar yoke 422, and the other pair of pillar yokes 42b has the inherent pillar yoke 423 and the common pillar yoke 422. The second beam yoke 43a has the inherent region 431 and the common region 432, and the other second beam yoke 43b has the inherent region 433 and the common region 432. The TMR elements 1a and 1b share the common region 412 of the first beam yokes 41a and 41b, the common pillar yoke 422 of the pillar yokes 42a and 42b, and the common region 432 of the second beam yokes 43a and 43b. The common regions form the common part 34 as shown in FIG. 5.

The magnetization direction of each of such magnetic yokes 4a and 4b is inverted by the return magnetic field generated on the inside of the magnetic yokes 4a and 4b. Accompanying the inversion of the magnetization direction of the magnetic yokes 4a and 4b by the return magnetic field, the magnetization direction of the second magnetic layers 8a and 8b is inverted, so that the second magnetic layers 8a and 8b function as storage layers for storing information.

The section parallel to the layer stack face of the stacked bodies S20a and S20b, of each of the first beam yokes 41a and 41b in the magnetic yokes 4a and 4b has, for example, as shown in FIG. 5, a dumbbell shape. The width in the extending direction (Y-direction) of the write bit lines 5a and 5b and the write word line 6 decreases toward the connection parts 14a and 14b and becomes the minimum in the connection parts 14a and 14b. Further, for example, as shown in FIGS. 6 and 7, the first beam yokes 41a and 41b are constructed so that the length in the stacking direction (Z direction), that is, the thickness of the stacked bodies S20a and S20b in the connection parts 14a and 14b decreases toward the connection parts 14a and 14b and becomes the minimum in the connection parts 14a and 14b. Concretely, each of the first beam yokes 41a and 41b has inclined faces 41AK in adjacent parts sandwiching the connection parts 14a and 14b. The first beam yokes 41a and 41b are constructed so that the thickness is increased toward the side opposite to the stacked bodies S20a and S20b in the stacking direction (Z direction) of the stacked bodies S20a and S20b with distance from the connection parts 14a and 14b. The first beam yokes 41a and 41b also have projections 41T projected toward the stacked bodies S20a and S20b and are thicker than the connection parts 14a and 14b. With the configuration, write current flows to the write bit lines 5a and 5b and the write word line 6. When the return magnetic field is generated in the magnetic yokes 4a and 4b, the highest and stable magnetic flux density can be obtained in the connection parts 14a and 14b.

Preferably, the coercive force of the connection parts 14a and 14b is smaller than that of the first magnetic layers 2a and 2b within the range of $(100/4\pi) \times 10^3$ A/m or less for the following reason. When the coercive force exceeds $(100/4\pi) \times 10^3$ A/m, there is the possibility that the stacked bodies S20a and S20b themselves as the TMR films deteriorate due to heat generation caused by increase in write current. Further, when the coercive force of the connection parts 14a and 14b is equal to or larger than that of the first magnetic layers 2a and 2b, the write current increases, the magnetization direction of the first magnetic layers 2a and 2b as the magnetization fixed layer changes, and the stacked bodies S20a and S20b as storage elements are destroyed. To make the current magnetic fields by the write bit lines 5a and 5b and the write word line 6 concentrated on the magnetic yokes 4a and 4b, preferably, the magnetic permeability of the magnetic yokes 4a and 4b is higher. Concretely, the magnetic permeability is preferably 2000 or higher and, more preferably, 6000 or higher.

Each of the write bit line 5 and the write word line 6 has a structure in which a film of titanium (Ti) having a thickness of 10 nm, a film of titanium nitride (TiN) having a thickness of 10 nm, and a film of aluminum (Al) having a thickness of 500 nm are sequentially stacked and are electrically insulated from each other via the insulating films 7. The write bit line 5 and the write word line 6 may be made of at least one of, for example, aluminum (Al), copper (Cu), and tungsten (W). A more concrete operation of writing information to the memory cell 1 by using the write bit line 5 and the write word line 6 will be described later.

Figure 8:
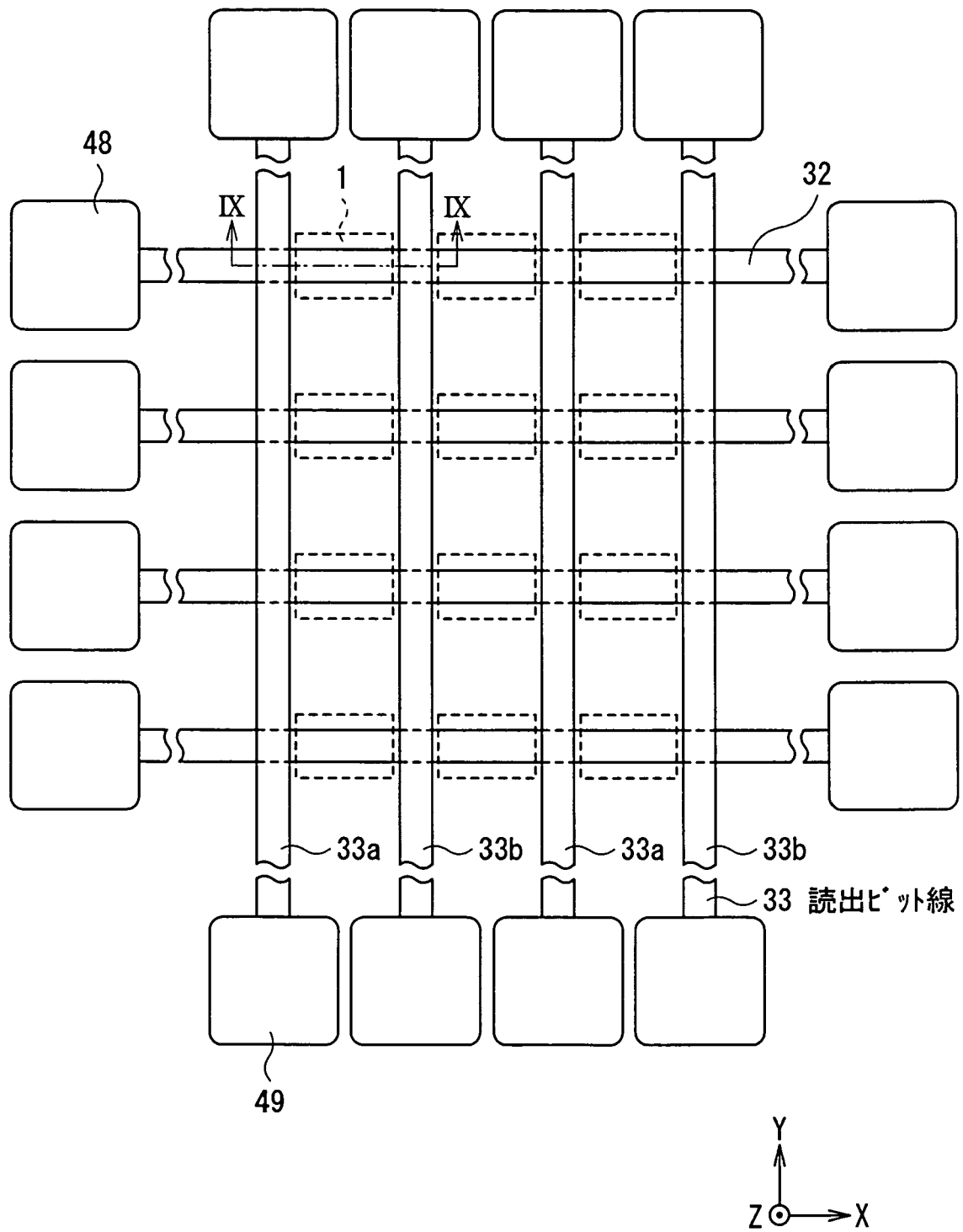
FIG. 8 is another partial plan view showing the configuration of the main part of the memory cell group in the magnetic memory device illustrated in FIG. 1.
Figure 9:
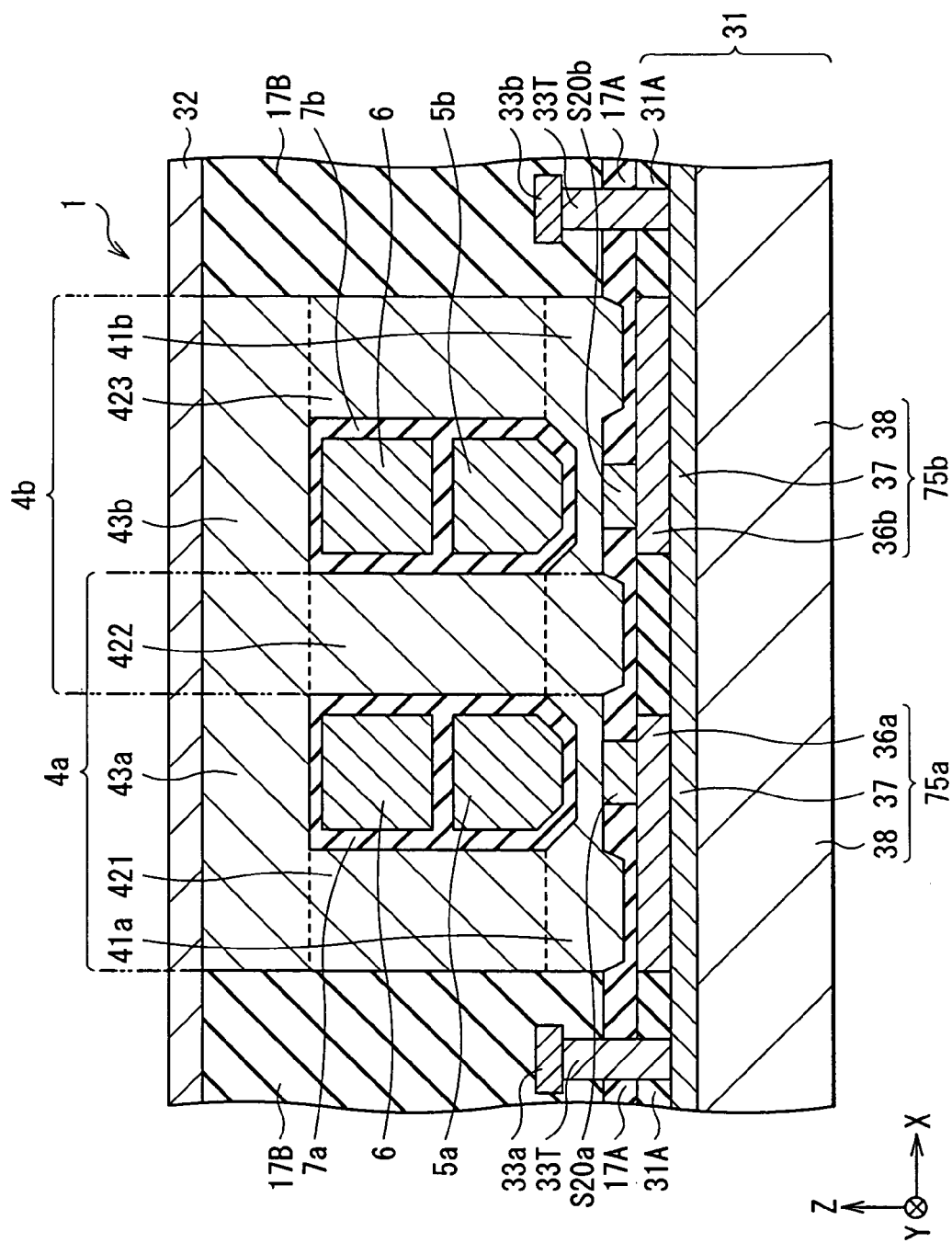
FIG. 9 is a cross section showing the configuration of a plane taken along line IX—IX of the memory cell illustrated in FIG. 8.

The configuration related to information reading operation, in the magnetic memory device shown in FIG. 1 will now be described by referring to FIGS. 8 and 9. FIG. 8 is a plan view showing the configuration of a main part related to the reading operation of the memory cell group 54 and corresponds to FIG. 3. FIG. 9 is a cross section taken along line IX—IX of FIG. 8.

As shown in FIG. 8, each memory cell 1 is disposed at each of the intersecting points of the plurality of read word lines 32 and the plurality of read bit lines 33 in the XY plane. The stacked bodies S20a and S20b on the under face of the memory cell 1 are in connected to the pair of read bit lines 33a and 33b via the Schottky diodes 75a and 75b, and the top face (the side opposite to the stacked bodies S20a and S20b) is in contact with the read word line 32. The read bit lines 33a and 33b supply read current to the pair of TMR elements 1a and 1b in each memory cell 1 and the read word line 32 leads the read current passed to the TMR elements 1a and 1b to the ground. At both ends of each read bit line 33, read bit line lead electrodes 49 are provided. On the other hand, at both ends of each read word line 32, read word line lead electrodes 48 are provided.

As shown in FIG. 9, a magnetic memory device of the embodiment is constructed so that, in a region including the memory cell 1, a pair of stacked bodies S20a and S20b and the magnetic yokes 4a and 4b are sequentially formed on the substrate 31 provided with the Schottky diode 75 (hereinbelow, simply called diode 75) functioning as a rectifier.

The pair of diodes 75a and 75b have the conductive layers 36a and 36b, an epitaxial layer 37, and a substrate 38 in order from the side of the stacked bodies S20a and S20b. Between the conductive layers 36a and 36b and the epitaxial layer 37, a Schottky barrier is formed. The diodes 75a and 75b do not have parts electrically connected to each other except for connection to the annular magnetic layer 4 while sandwiching the stacked bodies S20a and S20b. The substrate 38 is an n type silicon wafer. Generally, in the n type silicon wafer, an impurity of phosphorus (P) is diffused. As the substrate 38, a wafer of an $n^{++}$ type obtained by being highly doped with phosphorus is used. As the epitaxial layer 37, a wafer of the $n^-$ type obtained by being lightly doped with phosphorus is used. By making the epitaxial layer 37 as an $n^-$ type semiconductor and the conductive layers 36a and 36b made of a metal come into contact with each other, a band gap is created and a Schottky barrier is formed. Further, the pair of diodes 75a and 75b are connected to the read bit lines 33a and 33b, respectively, via a connection layer 33T.

Figure 10:
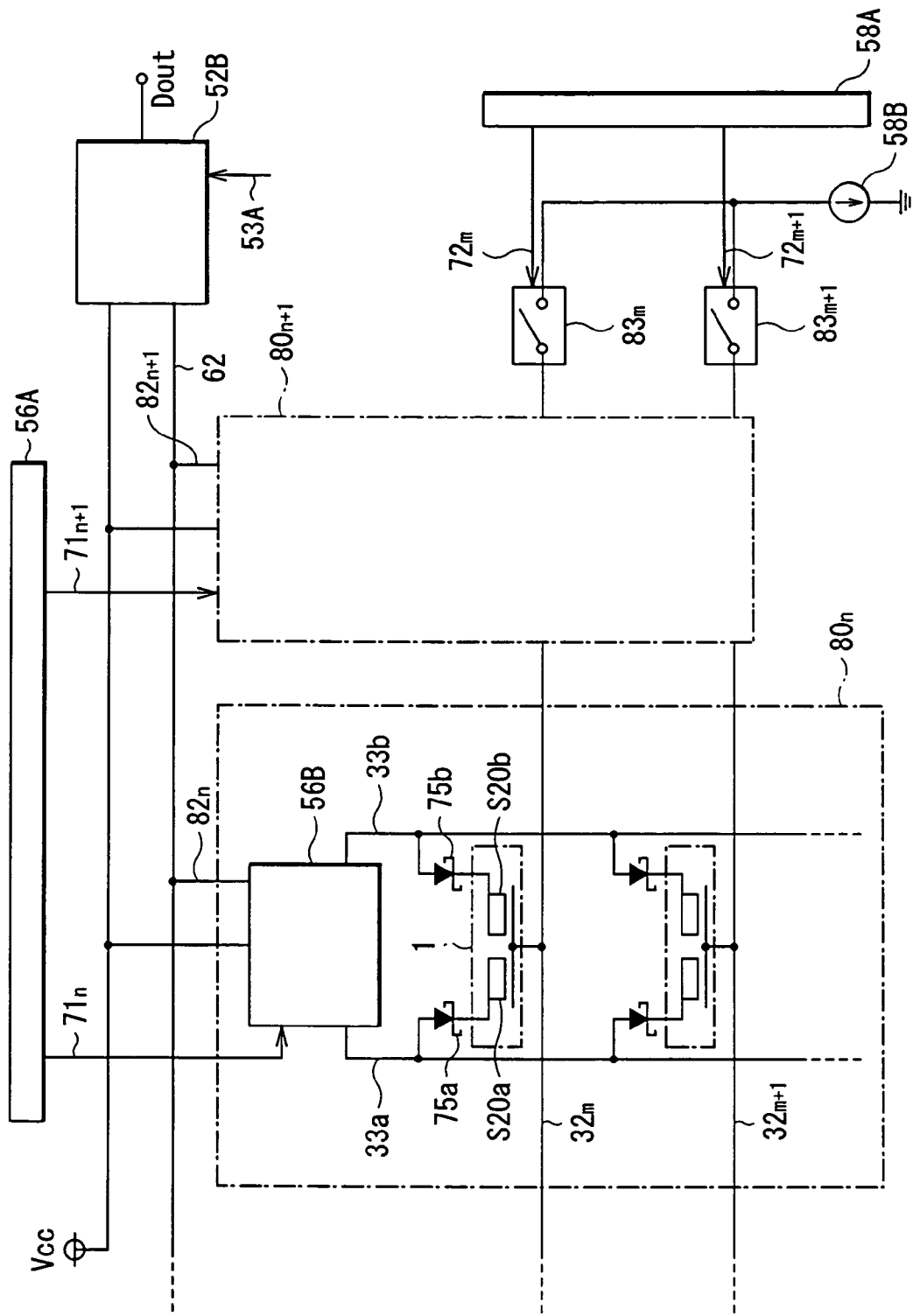
FIG. 10 is a circuit diagram showing the circuit configuration of the magnetic memory device illustrated in FIG. 1.

Referring now to FIG. 10, the circuit configuration related to the reading operation in the magnetic memory device of the embodiment will be described.

FIG. 10 is a configuration diagram of a circuit system constructed by the memory cell group 54 and a read circuit. In the read circuit system, the memory cell 1 is of a differential amplifier type constructed by the pair of TMR elements 1a and 1b. Information in the memory cell 1 is read by outputting a differential value of read currents passed to the TMR elements 1a and 1b (currents passed from the read bit lines 33a and 33b to the TMR elements 1a and 1b and output to the common read word line 32).

In FIG. 10, a unit read circuit 80 ( . . . , 80n, 80n+1, . . . ) as a unit of repetition of the read circuit is constructed by the memory cells 1 of each bit line in the memory cell group 54 and a part of the read circuit including the sense amplification circuit 56B, and the unit read circuits 80n are arranged in the bit line direction. Each of the unit read circuits 80n is connected to the Y-direction address decoder circuit 56A via the bit decode line 71 ( . . . , 71n, 71n+1, . . . ) and is connected to the output buffer 52B via the Y-direction read data bus 62.

In the memory cell group 54, the read word lines 32 ( . . . , 32m, 32m+1, . . . ) arranged in the X-direction and the pair of read bit lines 33a and 33b arranged in the Y-direction are disposed in a matrix. Each of the memory cells 1 is disposed at a position intersecting with the read word line 32 in a region sandwiched by the pair of read bit lines 33a and 33b. One end of each of the TMR elements 1a and 1b in each memory cell 1 is connected to the read bit lines 33a and 33b via the pair of diodes 75a and 75b, respectively, and the other ends are connected to the common read word line 32.

One end of each read word line 32 is connected to a read switch 83 ( . . . , $83_m$, $83_{m+1}$, . . . ) via the read word line lead electrode 48 and is also connected to a common constant current circuit 58B. Each read switch 83 is connected to the X-direction address decoder circuit 58A via the word decode line 72 ( . . . , $72_m$, $72_{m+1}$, . . . ). The read switch 83 is made conductive when a selection signal from the X-direction address decoder circuit 58A is supplied. The constant current circuit 58B has the function of making the current flowing in the read word line 32 constant.

One end of each read bit line 33 is connected to the sense amplification circuit 56B via the read bit line lead electrode 49, and the other end is finally grounded. One sense amplification circuit 56B is provided per unit read circuit 80 and has the function of receiving the potential difference between the pair of read bit lines 33a and 33b in each unit read circuit 80 and amplifying the potential difference. The sense amplification circuit 56B is connected to the output line 82 ( . . . , 82n, 82n+1, . . . ) and is finally connected to the output buffer 52B via the Y-direction read data bus 62.

The operation in the magnetic memory device of the embodiment will now be described.

Figure 11A:
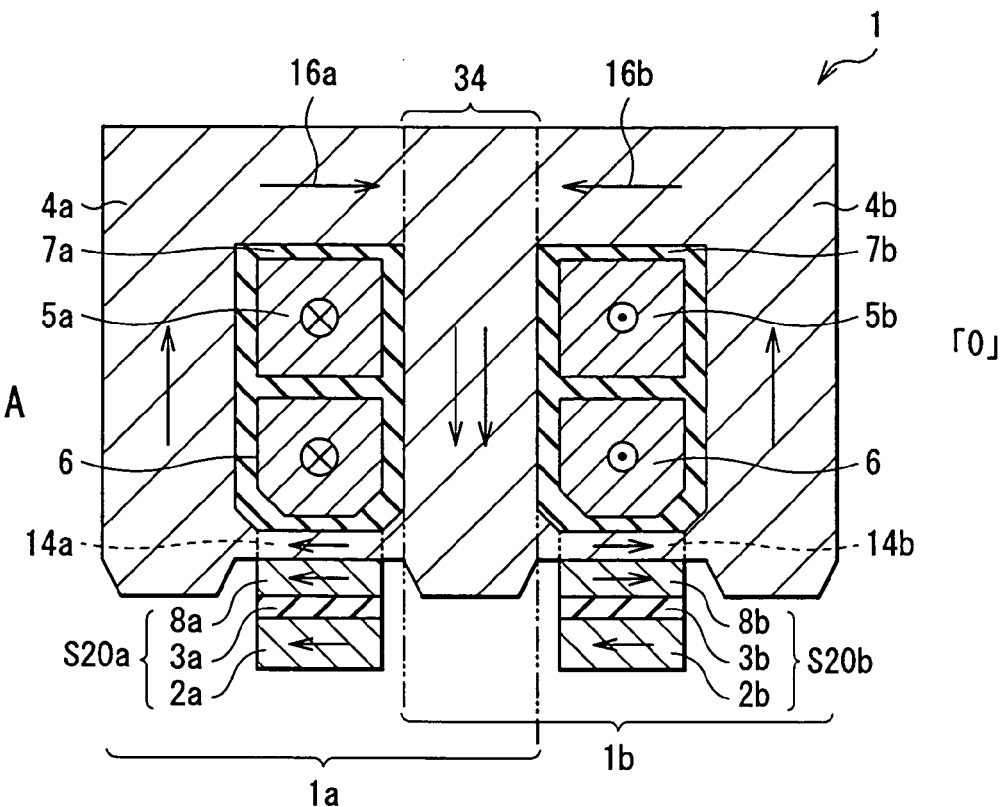
FIG. 11A is a first explanatory diagram showing the relation between a write current direction and a return magnetic field direction (magnetization direction) in the sectional configuration of the magnetic memory cell illustrated in FIG. 6.
Figure 11B:
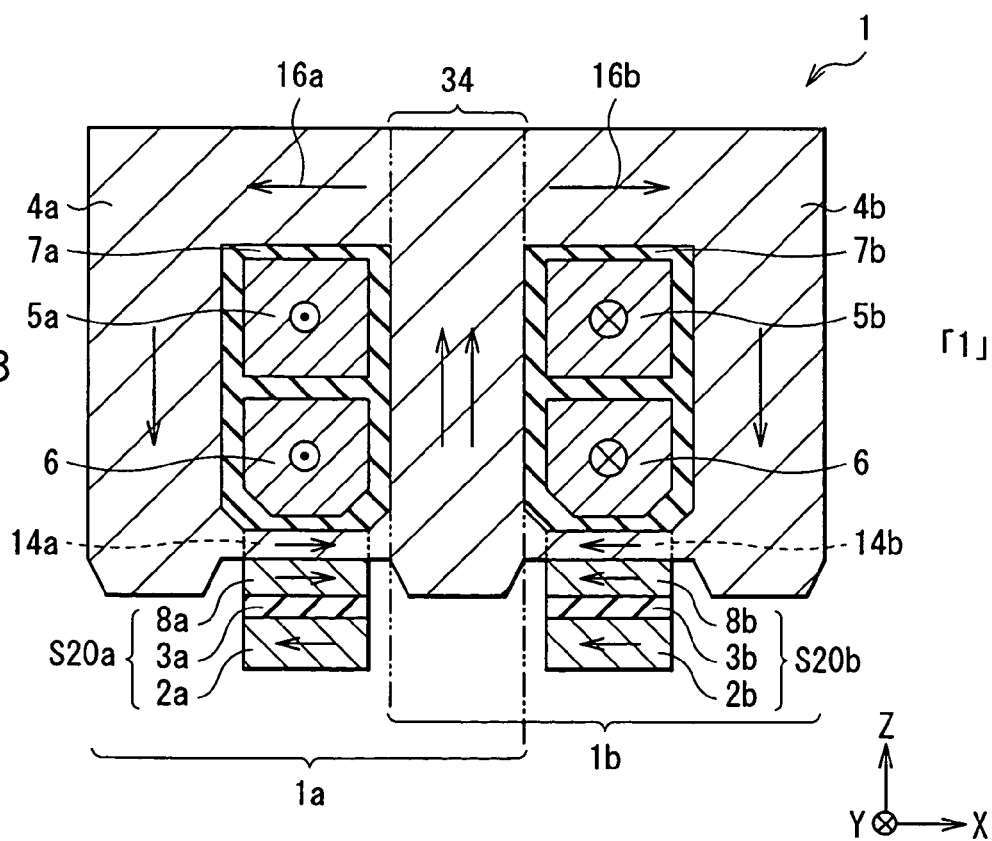
FIG. 11B is a second explanatory diagram showing the relation between the write current direction and the return magnetic field direction (magnetization direction) in the sectional configuration of the magnetic memory cell illustrated in FIG. 6.

First, by referring to FIG. 2 and FIGS. 11A and 11B, the operation of writing information in the memory cell 1 will be described. FIGS. 11A and 11B express the relation between the write current direction and the return magnetic field direction (magnetization direction) in the sectional configuration of the memory cell 1 shown in FIG. 6. The arrows indicated in magnetic layers in FIGS. 11A and 11B indicate the magnetization directions of the magnetic layers. With respect to the magnetic yokes 4a and 4b, the magnetic field directions of a magnetic path formed on the inside are also shown. The magnetization of the first magnetic layers 2a and 2b is fixed to the −X direction. FIGS. 11A and 11B show the case where write current flows in the same direction to the write bit line 5 and the write word line 6 which extend in the memory cell 1 and are parallel with each other. FIG. 11A corresponds to the write current direction shown in FIG. 2. FIG. 11A shows a case where write current flows from this side to the depth in the direction perpendicular to the drawing sheet (to the +Y direction) in the TMR element 1a, a return magnetic field 16a is generated in the clockwise direction in the magnetic yoke 4a surrounding the write bit line 5a and the write word line 6, write current flows from the depth to this side in the direction perpendicular to the drawing sheet (to the −Y direction) in the TMR element 1b, and the return magnetic field 16b is generated in the counterclockwise direction in the magnetic yoke 4b surrounding the write bit line 5b and the write word line 6. In this case, the magnetization direction of the connection part 14a and the second magnetic layer 8a is the −X direction and the magnetization direction of the connection part 14b and the second magnetic layer 8b is the +X direction. FIG. 11B corresponds to the case where the directions of current flowing in the write bit line 5 and the write word line 6 are opposite to those shown in FIG. 11A. Specifically, FIG. 11B shows a case where write current flows from the depth to this side in the direction perpendicular to the drawing sheet (to the −Y direction) in the TMR element 1a, the return magnetic field 16a is generated in the counterclockwise direction in the magnetic yoke 4a surrounding the write bit line 5a and the write word line 6, write current flows from this side to the depth in the direction perpendicular to the drawing sheet (to the +Y direction) in the TMR element 1b, and the return magnetic field 16b is generated in the clockwise direction in the magnetic yoke 4b surrounding the write bit line 5b and the write word line 6. In this case, the magnetization direction of the connection part 14a and the second magnetic layer 8a is the +X direction and the magnetization direction of the connection part 14b and the second magnetic layer 8b is the −X direction.

In the cases of FIGS. 11A and 11B, the current direction of the write bit line 5a and the write word line 6 penetrating the TMR element 1a and that of the write bit line 5b and the write word line 6 penetrating the TMR element 1b are opposite to each other. Consequently, the directions of the return magnetic fields 16a and 16b flowing in the pillar yoke 422 (refer to FIG. 6) corresponding to the common part 34 of the magnetic yokes 4a and 4b can be made the same (the −Z direction in FIG. 11A and the +Z direction in FIG. 11B).

As obvious from FIGS. 11A and 11B, according to the directions of the return magnetic field 16a and 16b generated by the currents flowing in the write bit line 5 and the write word line 6 penetrating the magnetic yokes 4a and 4b, the magnetization direction of the connection part 14a and the second magnetic layer 8a and that of the connection part 14b and the second magnetic layer 8b change so as to be opposite to each other. By using the phenomenon, information can be stored in the memory cell 1.

In short, when current flows in the same direction in the write bit lines 5a and 5b and the write word line 6, the magnetization directions of the magnetic yokes 4a and 4b are inverted and, accompanying the inversion, the magnetization directions of the second magnetic layers 8a and 8b change, thereby enabling binary information of "0" or "1" to be stored. In the case where "0" corresponds to, for example, the state of FIG. 11A, specifically, the state where the connection part 14a and the second magnetic layer 8a are magnetized in the −X direction and the other connection part 14b and the second magnetic layer 8b are magnetized in the +X direction, "1" corresponds to the state of FIG. 11B, specifically, the state where the connection part 14a and the second magnetic layer 8a are magnetized in the +X direction and the other connection part 14b and the second magnetic layer 8b are magnetized in the −X direction. In such a manner, information can be stored.

In this case, in the TMR elements 1a and 1b, when the magnetization direction of the first magnetic layers 2a and 2b and that of the second magnetic layers 8a and 8b are parallel, a low resistance state in which large tunnel current flows is obtained. When they are antiparallel to each other, a high resistance state in which only small tunnel current flows is obtained. That is, one of the pair of TMR elements 1a and 1b is always in the low resistance state and the other is in the high resistance state, thereby storing information. In the case where the write currents flow in the opposite directions in the write bit line 5 and the write word line 6 or in the case where the write current flows in only one of the write bit line 5 and the write word line 6, the magnetization direction of the second magnetic layer 8 is not inverted and the data is not rewritten.

In the memory cell 1 in the magnetic memory device of the embodiment having the configuration as described above, by passing the currents in the same direction to both of the write bit line 5 and the write word line 6, the direction of the current magnetic field generated by the write bit line 5 and that of the current magnetic field generated by the write word line 6 become the same in the magnetic yoke 4, so that a synthetic magnetic field can be generated. Consequently, as compared with the case where the magnetic yoke 4 is not provided and the case where the write bit line 5 and the write word line 6 perpendicularly cross each other, higher magnetic flux density is obtained. Thus, the current magnetic field can be used more efficiently and the current necessary to invert the magnetization in the second magnetic layer 8 can be reduced.

Further, by providing the second magnetic layer 8 between the tunnel barrier layer 3 and the connection part 14 of the magnetic yoke 4, the following advantages are obtained. Exchange coupling between the connection part 14 and the second magnetic layer 8 can be made and the magnetization direction in the second magnetic layer 8 is aligned more excellently, so that more stable writing can be performed. Further, the coercive force of the connection part 14 can be suppressed more, so that a heat generation amount can be decreased by reducing the current value in the writing operation, and the functions of the magnetic memory device can be fully displayed.

In the magnetic memory device of the embodiment, as described above, by passing current to both of the write bit line 5 and the write word line 6, a closed magnetic path can be formed. Consequently, magnetization inversion in the magnetic yokes 4a and 4b in the TMR elements 1a and 1b can be performed efficiently and a magnetic influence on memory cells adjacent to the memory cell 1 to be subject to writing can be reduced. Further, by the shield effect of the magnetic yokes 4a and 4b, adjacent memory cells on the substrate can be disposed at narrower intervals. Thus, it is advantageous for realizing higher integration and higher packing density of the magnetic memory device.

In the embodiment, it is constructed so that the area of the cross section orthogonal to the circumferential direction of the pair of magnetic yokes 4a and 4b becomes the smallest in the connection parts 14a and 14b facing the stacked bodies S20a and S20b. Consequently, the magnetic flux density of the return magnetic fields 16a and 16b generated by passing the write current to the write bit lines 5a and 5b and the write word line 6 can be made highest in the connection parts 14a and 14b and can be stabilized. Therefore, the magnetization of the second magnetic layers 8a and 8b can be efficiently inverted even by a smaller write current, and stabler writing operation can be performed.

Referring now to FIGS. 1, 10, 12A, and 12B, the reading operation in the magnetic memory device of the embodiment will be described.

First, one of the plurality of bit decode lines 71 is selected by the address decoder circuit 56A in the first drive control circuit part 56 and a control signal is transmitted to the corresponding sense amplification circuit 56B. As a result, read current flows in the read bit lines 33a and 33b and the positive potential is given to the side of the stacked bodies S20a and S20b in the TMR elements 1a and 1b. Similarly, by the X-direction address decoder circuit 58A in the second drive control circuit part 58, one of the plurality of word decode lines 72 is selected and the read switch 83 in the corresponding part is driven. The selected read switch 83 is made conductive, read current flows in the corresponding read word line 32, and a negative potential is given to the side opposite to that of the stacked bodies S20a and S20b. Therefore, read current necessary for reading can be passed to one memory cell 1 selected by the Y-direction address decoder circuit 56A and the X-direction address decoder circuit 58A. Based on the read current, the magnetization directions of the pair of second magnetic layers 8a and 8b are detected, thereby enabling stored information to be read.

Figure 12A:
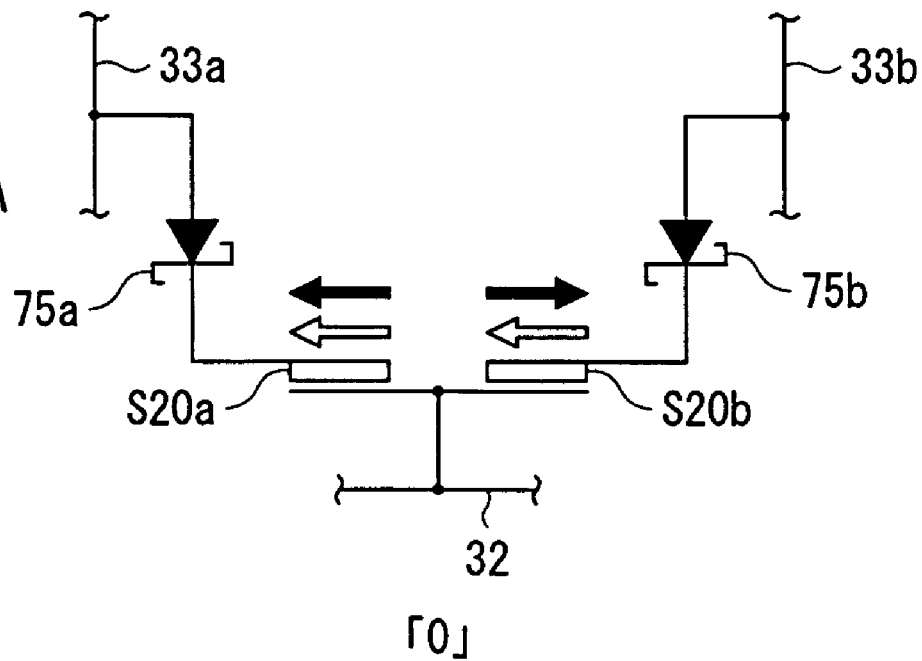
FIG. 12A is a first partial enlarged view of the circuit configuration illustrated in FIG. 10.
Figure 12B:
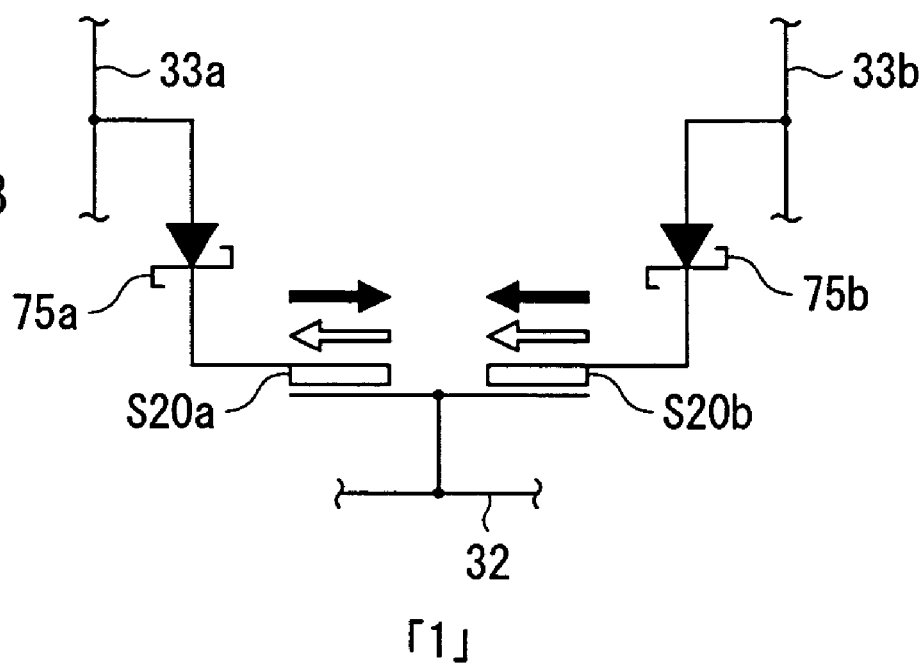
FIG. 12B is a second partial enlarged view of the circuit configuration illustrated in FIG. 10.

FIGS. 12A and 12B are circuit diagrams each showing a portion around the memory cell 1. The magnetization directions of the first magnetic layers 2a and 2b in the stacked bodies S20a and S20b are indicated by hollow arrows and those of the second magnetic layers 8a and 8b are indicated by solid arrows. Both of the magnetization directions of the first magnetic layers 2a and 2b are fixed to the left directions. In FIG. 12A, the magnetization direction of the first magnetic layer 2a and that in the second magnetic layer 2b in the stacked body S20a are parallel, and the magnetization direction of the first magnetic layer 2b and that of the second magnetic layer 2b in the other stacked body S20b are antiparallel to each other. In this case, the stacked body S20a is in the low resistance state, and the stacked body S20b is in the high resistance state. This case corresponds to, for example, "0". In the other case of FIG. 12B, different from the case of FIG. 12A, the stacked body S20a is in the high resistance state and the stacked body S20b is in the low resistance state. This case corresponds to, for example, "1". Such binary information can be obtained by utilizing the fact that the resistance values of the stacked bodies S20a and S20b are different from each other and detecting the difference between the current values.

A method of manufacturing the magnetic memory cell of the embodiment having the configuration as described above and a method of manufacturing the magnetic memory device will now be explained.

A method of manufacturing, mainly, the memory cell 1 in the magnetic memory device will be concretely described hereinbelow with reference to FIGS. 13 to 29. FIGS. 13 to 29 are cross sections corresponding to FIG. 9 and show manufacturing processes in order.

In the first process, a first beam yoke 41 is formed on the substrate 31 via the stacked bodies S20a and S20b.

Figure 13:
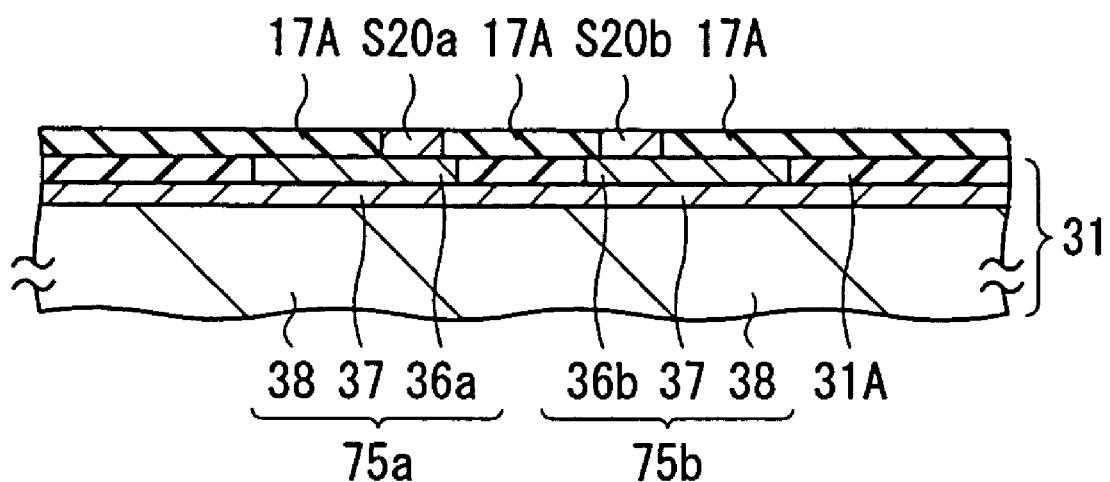
FIG. 13 is an enlarged cross section showing a process in a method of manufacturing the magnetic memory device illustrated in FIG. 1.
Figure 14:
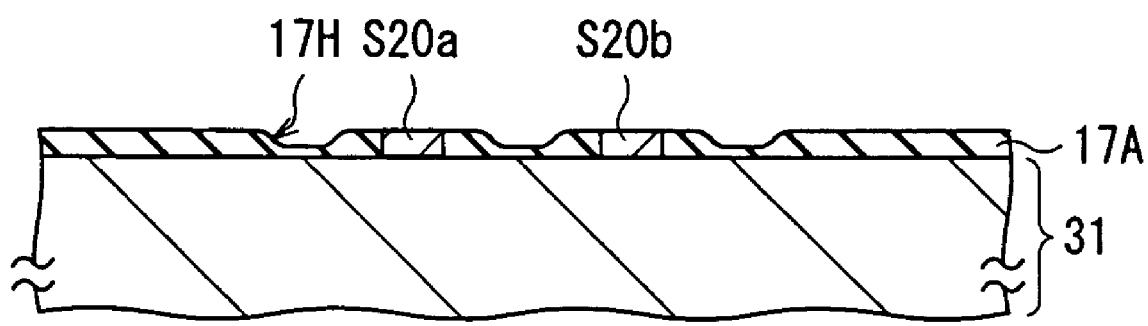
FIG. 14 is an enlarged cross section showing a process subsequent to FIG. 13.
Figure 15A:
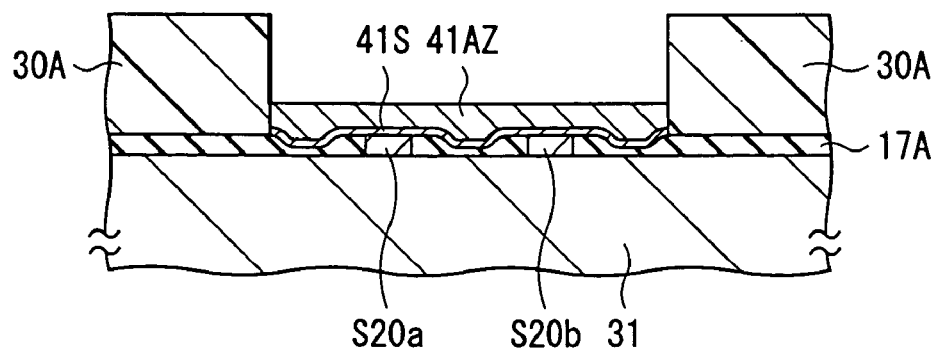
FIG. 15A is an enlarged cross section showing a process subsequent to FIG. 14
Figure 15B:
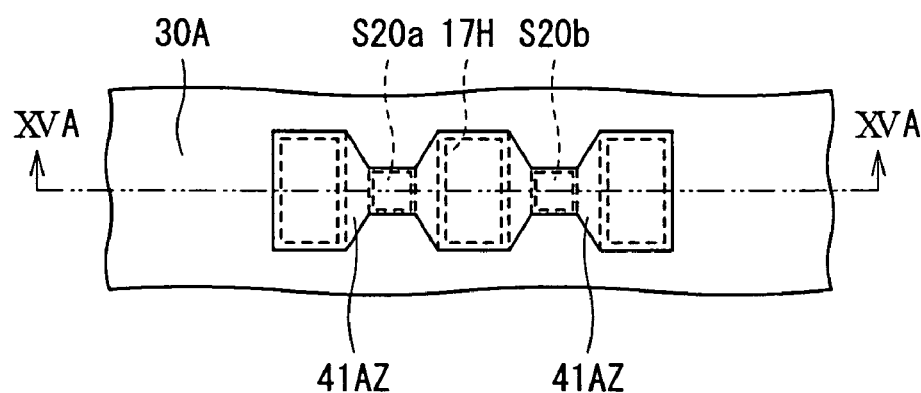
FIG. 15B is an enlarged plan view showing a configuration corresponding to FIG. 15A.
Figure 16A:
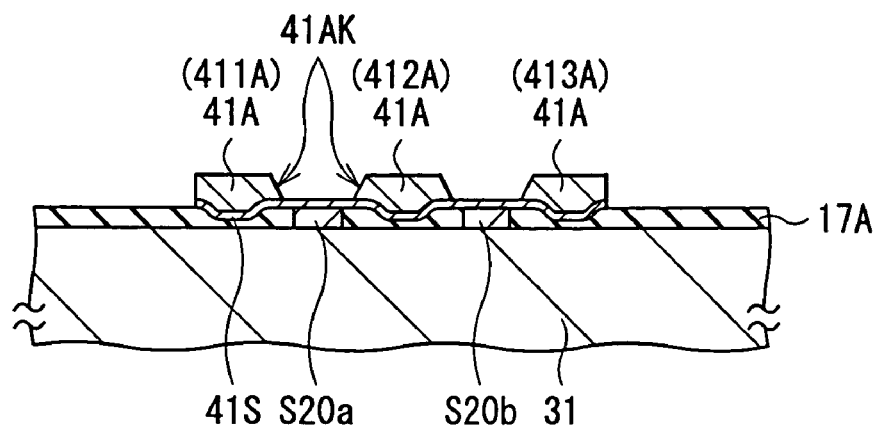
FIG. 16A is an enlarged cross section showing a process subsequent to FIG. 15A.
Figure 16B:
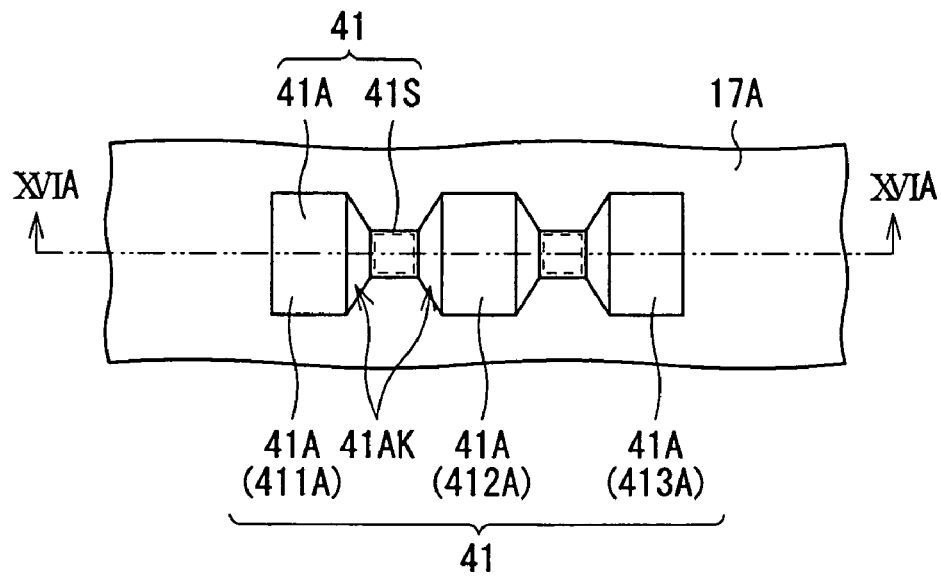
FIG. 16B is an enlarged plan view showing a configuration corresponding to FIG. 16A.

First, as shown in FIG. 13, the substrate 31 in which the diodes 75a and 75b are buried and on which the stacked bodies S20a and S20b and the insulating film 17A surrounding the stacked bodies S20a and S20b are formed is prepared. In FIGS. 14 to 29 subsequent to FIG. 13, the details of the substrate 31 will be omitted. Subsequently, as shown in FIG. 14, a trench 17H is selectively formed in an insulating film 17A. As shown in FIG. 15A, a resist pattern 30A in a predetermined shape is formed on the insulating film 17A, and an underplating film 41S made of NiFe or the like is formed, for example, by sputtering on the insulating film 17A and the stacked bodies S20a and S20b in the region which is not covered with the resist pattern 30A. The thickness of the underplating film 41S is, for example, 20 nm. After that, the resultant is soaked in a plating bath and a plating process using the underplating film 41S as an electrode is performed, thereby forming a magnetic layer precursor 41AZ. Generally, such a thin film patterning method is called a frame plating method. FIG. 15B corresponds to FIG. 15A and is a plan view showing a state where the magnetic layer precursor 41AZ is formed. Specifically, a cross section taken along line XV(A)—XV(A) of FIG. 15B is corresponding to FIG. 15A. After forming the magnetic layer precursor 41AZ, as shown in FIGS. 16A and 16B, the magnetic layer precursor 41AZ in the regions corresponding to the stacked bodies S20a and S20b is selectively etched as shown in FIGS. 16A and 16B, thereby forming a magnetic layer 41A (411A, 412A, and 413A) having the inclined faces 41AK. In such a manner, the first beam yoke 41 which is narrowed in the stacking direction (Z direction) of the stacked bodies S20a and S20b in the parts corresponding to the stacked bodies S20a and S20b and is narrowed also in the direction (Y-direction) in which the write bit lines 5a and 5b and the write word line 6 formed in the following processes extend is completed.

In the following second process, on the first beam yoke 41, three bottom pillar yokes 42B (421B, 422B, and 423B) and the write word line 6 are formed on the first beam yoke 41.

Figure 17:
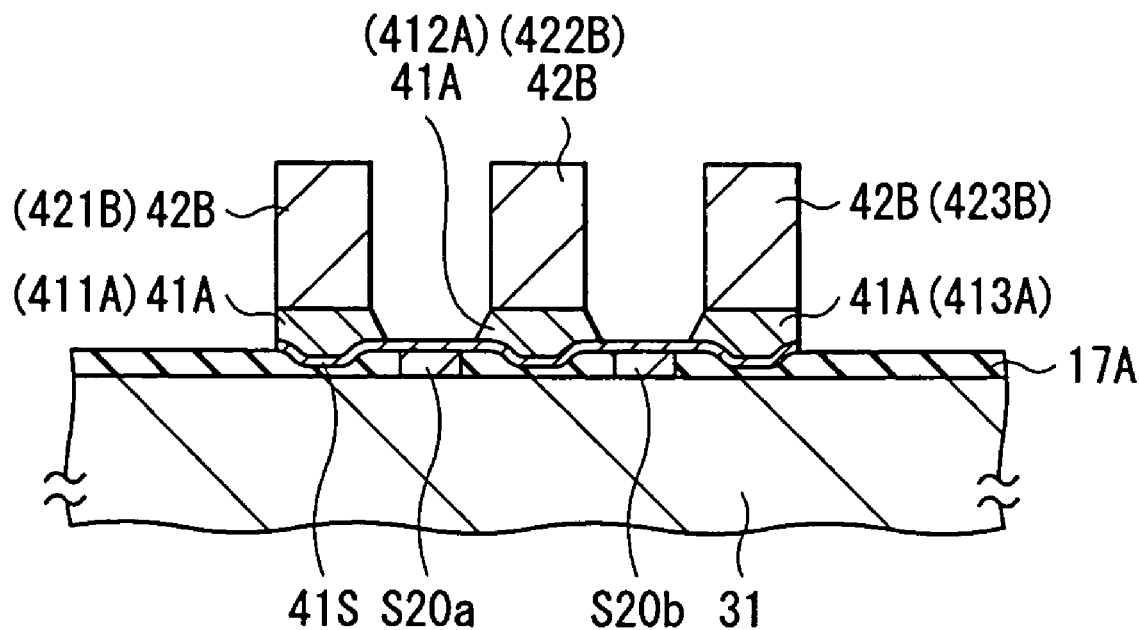
FIG. 17 is an enlarged cross section showing a process subsequent to FIG. 16.
Figure 18:
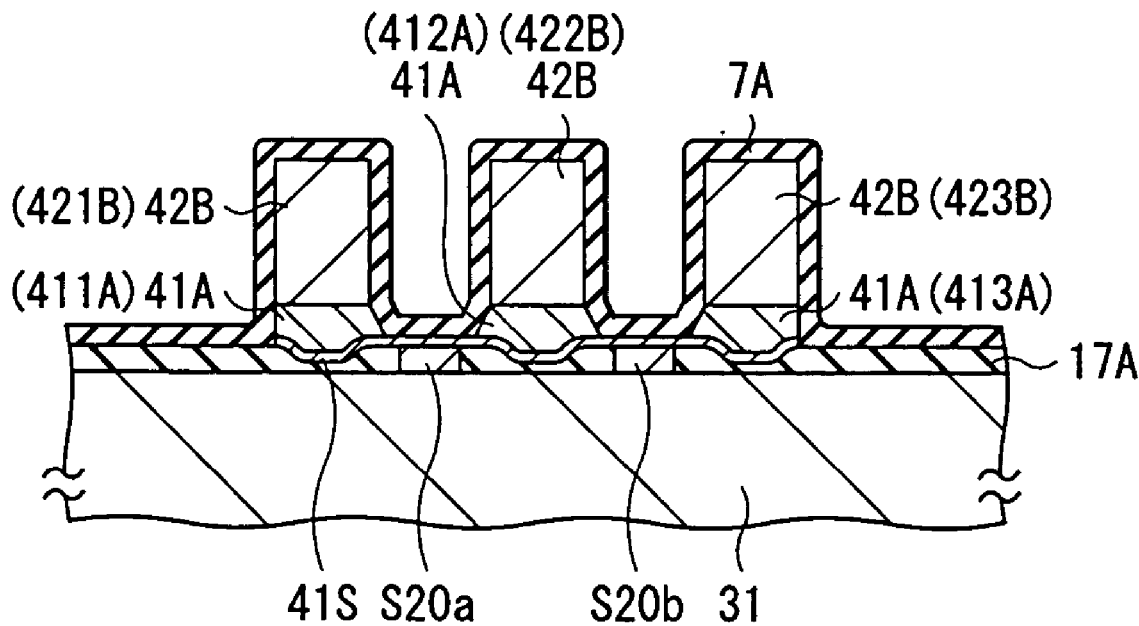
FIG. 18 is an enlarged cross section showing a process subsequent to FIG. 17.
Figure 19:
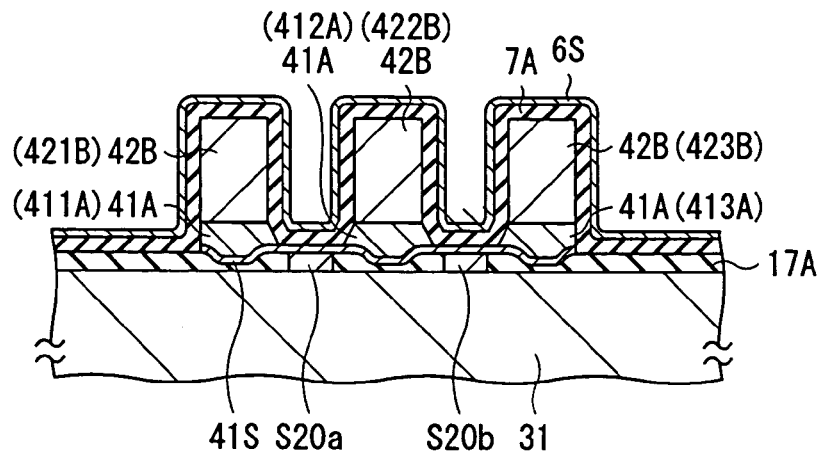
FIG. 19 is an enlarged cross section showing a process subsequent to FIG. 18.
Figure 20:
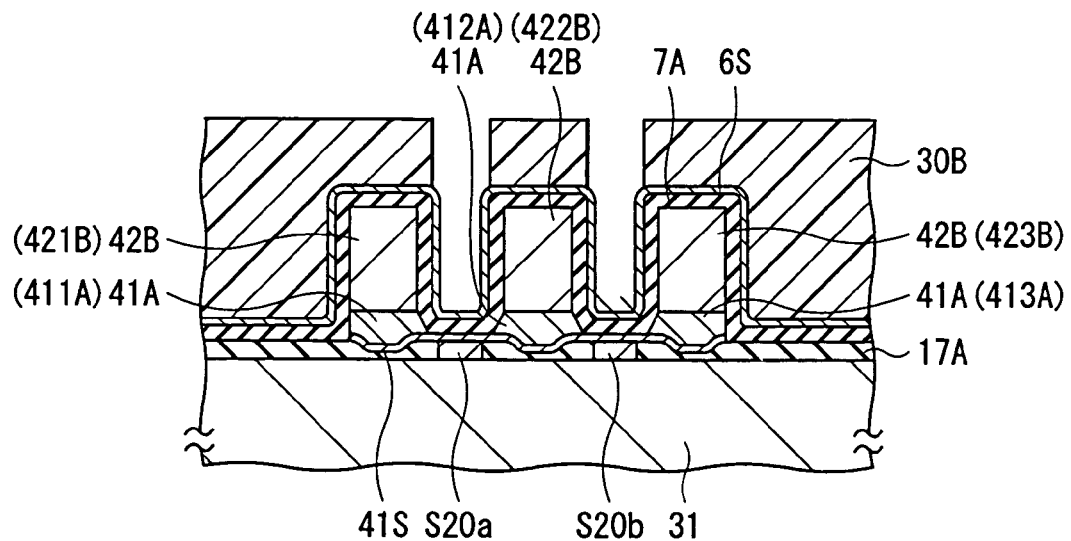
FIG. 20 is an enlarged cross section showing a process subsequent to FIG. 19.
Figure 21:
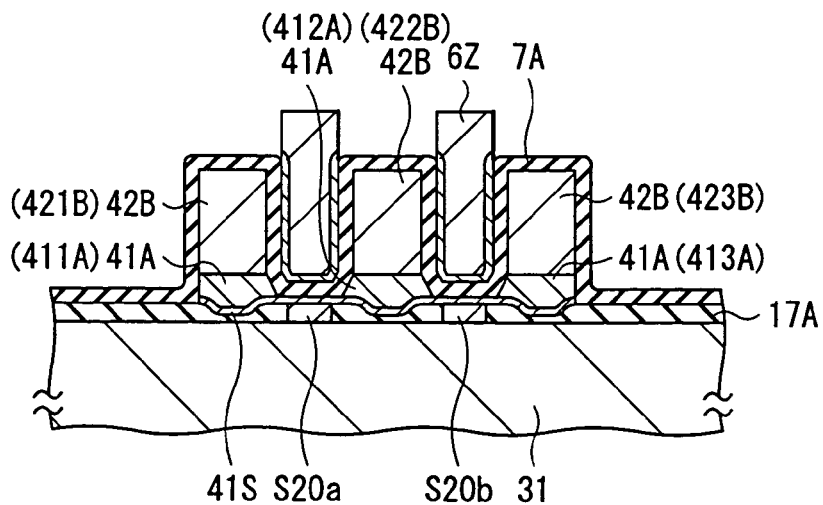
FIG. 21 is an enlarged cross section showing a process subsequent to FIG. 20.
Figure 22:
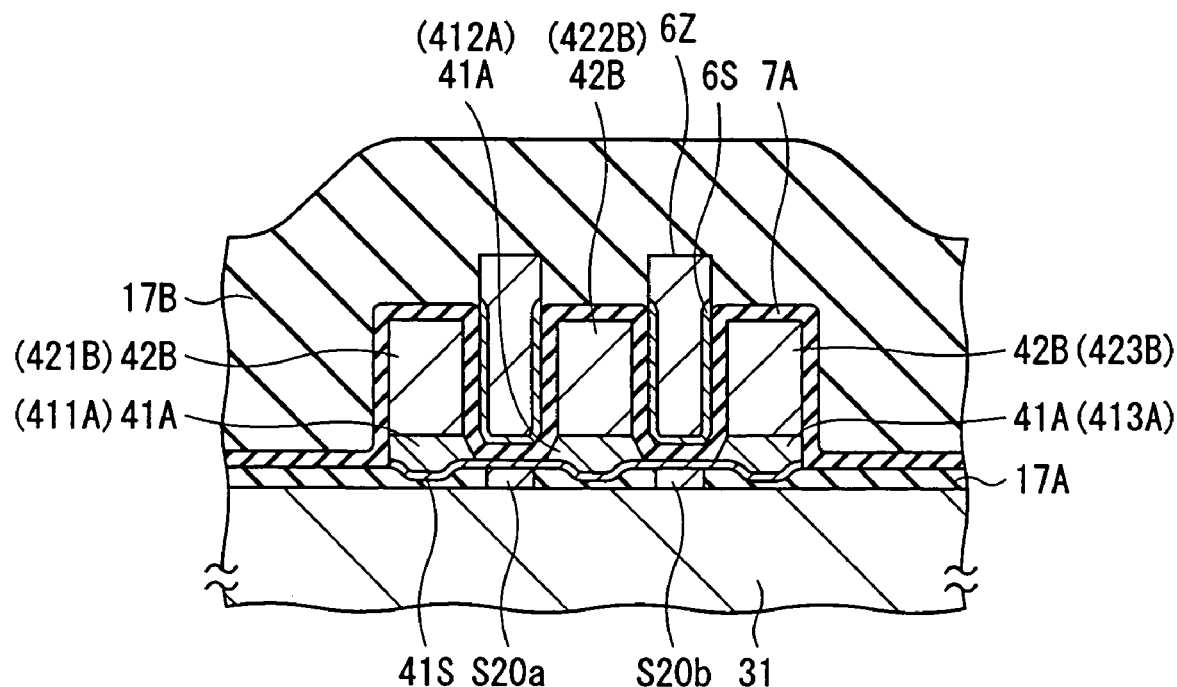
FIG. 22 is an enlarged cross section showing a process subsequent to FIG. 21.
Figure 23:
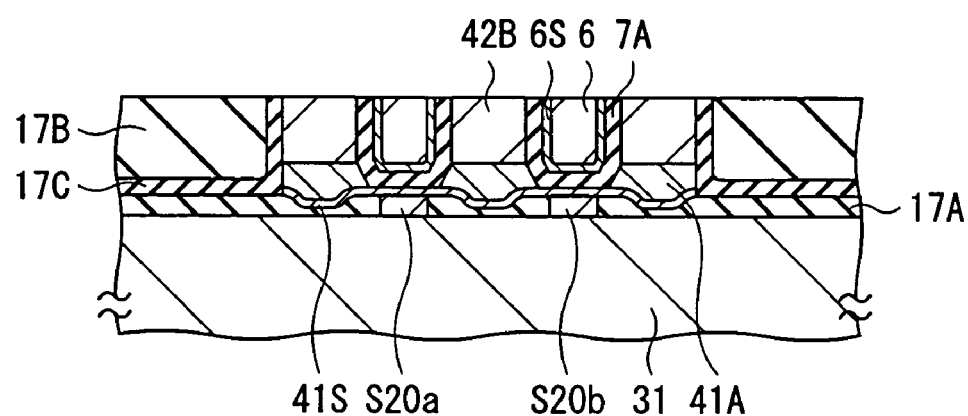
FIG. 23 is an enlarged cross section showing a process subsequent to FIG. 22.

In the second process, first, as shown in FIG. 17, the three bottom pillar yokes 42B made of $Ni_{0.8}Fe_{0.2}$ are formed on the magnetic layers 411A, 412A, and 413A by, for example, the frame plating method. After that, the write word line 6 is formed via the insulating film 7A between the three bottom pillar yokes 42B. First, as shown in FIG. 18, the insulating film 7A made of $Al_2O_3$ or the like is formed so as to cover the whole by using, for example, a CVD apparatus. Next, as shown in FIG. 19, an underplating film 6S made of copper or the like is formed so as to cover the insulating film 7A by sputtering or the like. After that, a resist pattern 30B is selectively formed so as to leave the regions between the bottom pillar yokes 42B as shown in FIG. 20 and, further, a metal layer 6Z is formed so as to bury at least the regions between the bottom pillar yokes 42B as shown in FIG. 21. In this case, by soaking the resultant in a plating bath and performing a plating process using the underplating film 6S as an electrode, the metal layer 6Z made of copper is formed. After that, the resist pattern 30B is peeled off, and the exposed underplating film 6S is removed by milling or the like. An insulating film 17B made of $Al_2O_3$ or the like is formed so as to cover the whole by sputtering or the like as shown in FIG. 22 and, after that, the whole surface is polished to predetermined thickness and planarized by using, for example, a CMP apparatus. In such a manner, the write word lines 6 are formed.

Figure 24:
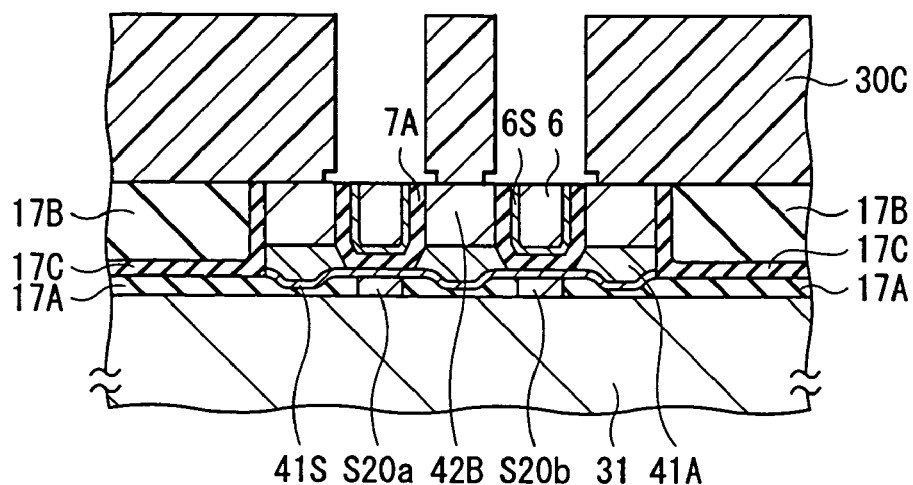
FIG. 24 is an enlarged cross section showing a process subsequent to FIG. 23.
Figure 25:
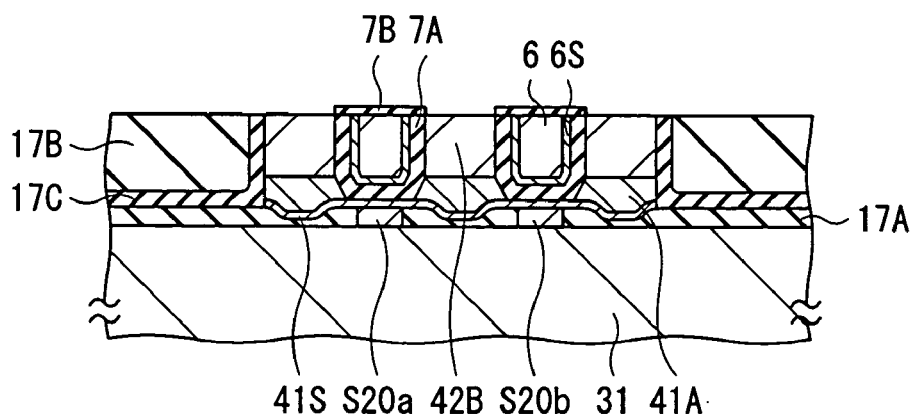
FIG. 25 is an enlarged cross section showing a process subsequent to FIG. 24.
Figure 26:
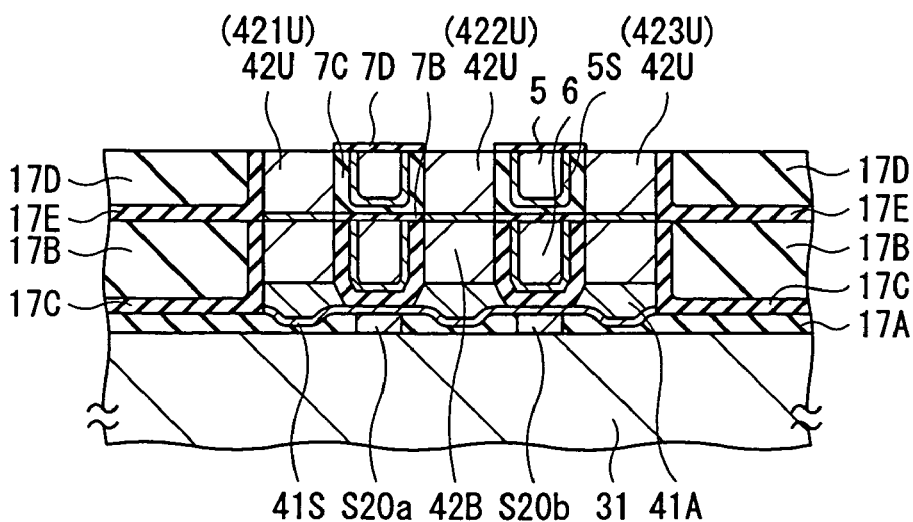
FIG. 26 is an enlarged cross section showing a process subsequent to FIG. 25.

In the following third process, an insulating film 7B is formed so as to cover the top face of the write word line 6 and surround the periphery of the write word line 6 in cooperation with the insulating film 7A. Concretely, as shown in FIG. 24, a resist pattern 30C is selectively formed in regions except for the region in which the write word line 6, underplating film 6S, and insulating film 7A are exposed in the surface. After that, the resist pattern 30C is used as a mask and sputtering is performed, thereby forming the insulating film 7B made of, for example, $Al_2O_3$ as shown in FIG. 25. Further, by removing the resist pattern 30C, the insulating film 7B covering the write word line 6, underplating film 6S, and the insulating film 7A appears. By forming an undercut in a lower part of the end face of the resist pattern 30C, the resist pattern 30C can be easily peeled off.

In a fourth process, three top pillar yokes 42U (421U, 422U, and 423U) made of $Ni_{0.8}Fe_{0.2}$ are formed on the three bottom pillar yokes 42B (421B, 422B, and 423B), respectively, by using the frame plating method. In a fifth process, the write bit lines 5 (5a and 5b) are formed via the insulating film 7C between the top pillar yokes 42U. The write bit lines 5 can be formed by an operation similar to that of forming the write lines 6 shown in FIGS. 18 to 25. Further, in a sixth process, an insulating film 7D is formed so as to cover the top face of the write bit line 5 and surround the periphery of the write bit line 5 in cooperation with the insulating film 7C. Hereinbelow, by referring to FIG. 26, the fifth and sixth processes will be described concretely.

After forming the top pillar yoke 42U in the fourth process, the resist pattern used for the plating process is peeled off, and the exposed underplating film is removed by milling or the like. In the following fifth process, the insulating film 7C made of $Al_2O_3$ or the like is formed so as to cover the whole by using, for example, a CVD apparatus. After that, the underplating film 5S made of, for example, copper is formed so as to cover the insulating film 7C by sputtering or the like. A resist pattern (not shown) is selectively formed so as to leave the regions between the top pillar yokes 42U. Further, the write bit lines 5 are formed so as to bury at least the regions between the top pillar yokes 42U. In this case, the resultant is soaked in a plating bath and a plating process using the underplating film 5S as an electrode is performed, thereby forming the write bit line 5 made of copper. After formation of the write bit line 5, the resist pattern is peeled off and the underplating film 5S is removed by milling or the like. Further, an insulating film 17D made of, for example, $Al_2O_3$ is formed so as to cover the whole by sputtering or the like. After that, the whole face is polished to a predetermined thickness so as to be planarized by using, for example, a CMP (Chemical Mechanical Polishing) apparatus. In the following sixth process, a resist pattern (not shown) is selectively formed in regions except for the region in which the write bit line 5, underplating film 5S, and insulating film 7C are exposed in the surface. The resist pattern is used as a mask and sputtering is performed, thereby forming the insulating film 7D made of, for example, $Al_2O_3$. By removing the resist pattern, the insulating film 7D covering the write bit line 5, underplating film 5S, and the insulating film 7C appears.

Figure 27:
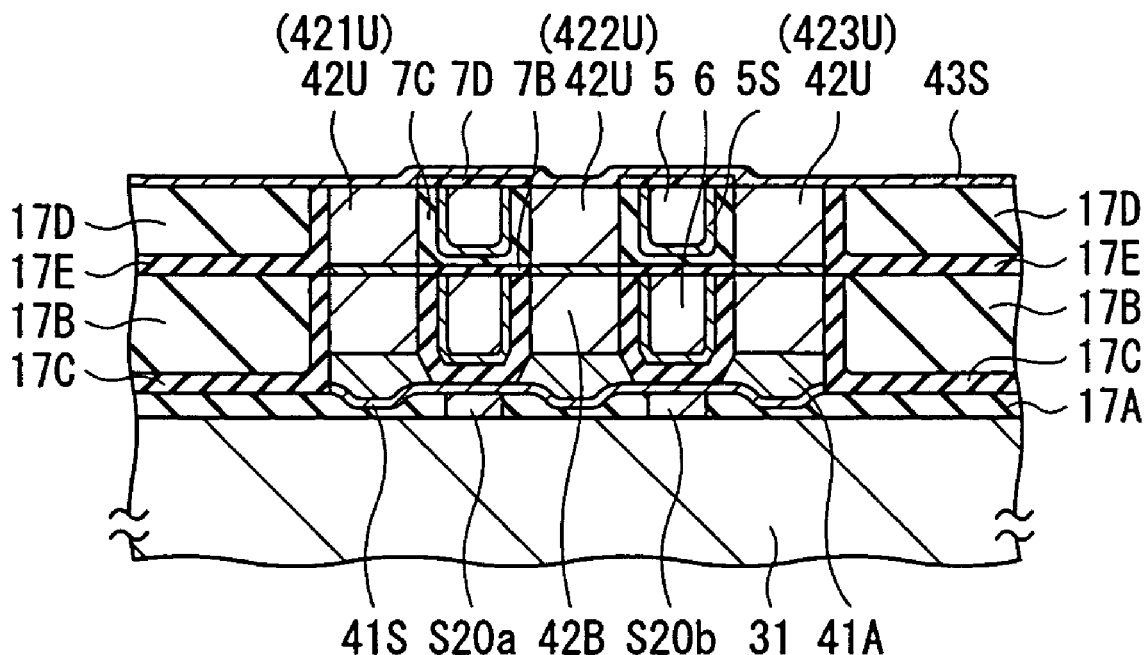
FIG. 27 is an enlarged cross section showing a process subsequent to FIG. 26.
Figure 28:
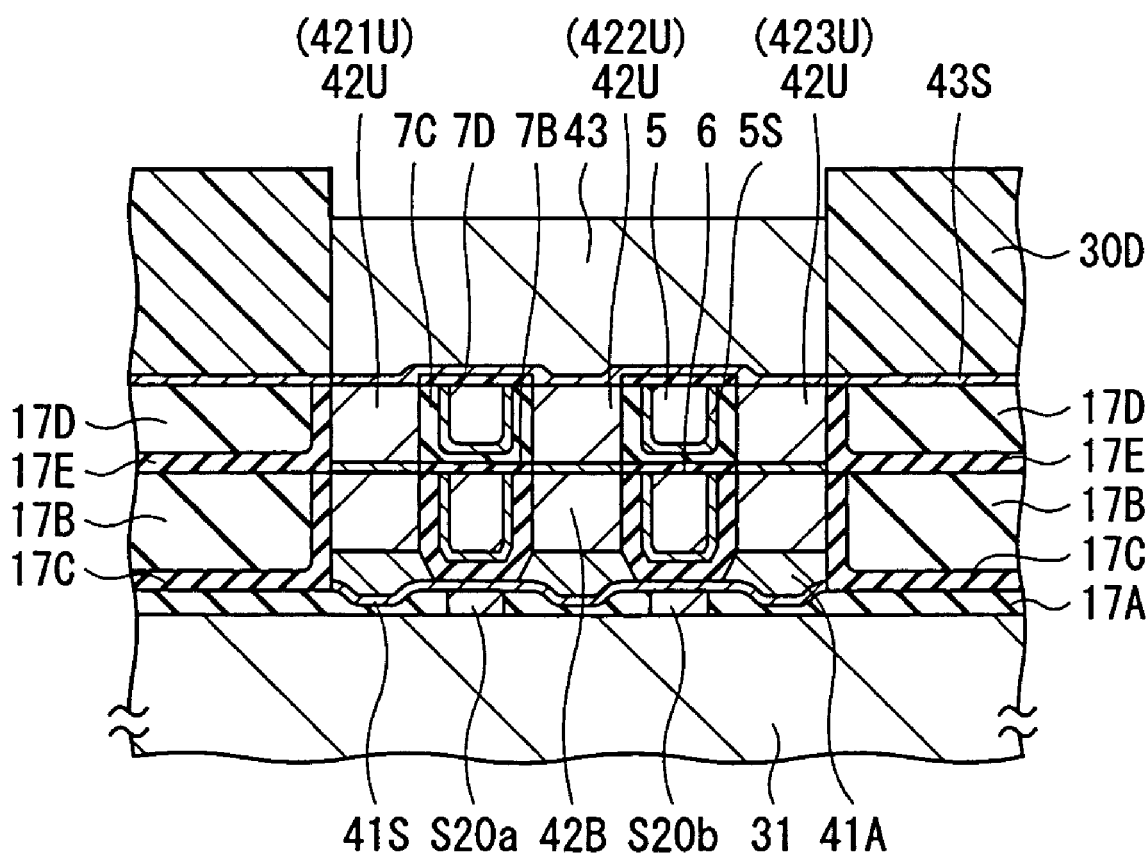
FIG. 28 is an enlarged cross section showing a process subsequent to FIG. 27.
Figure 29:
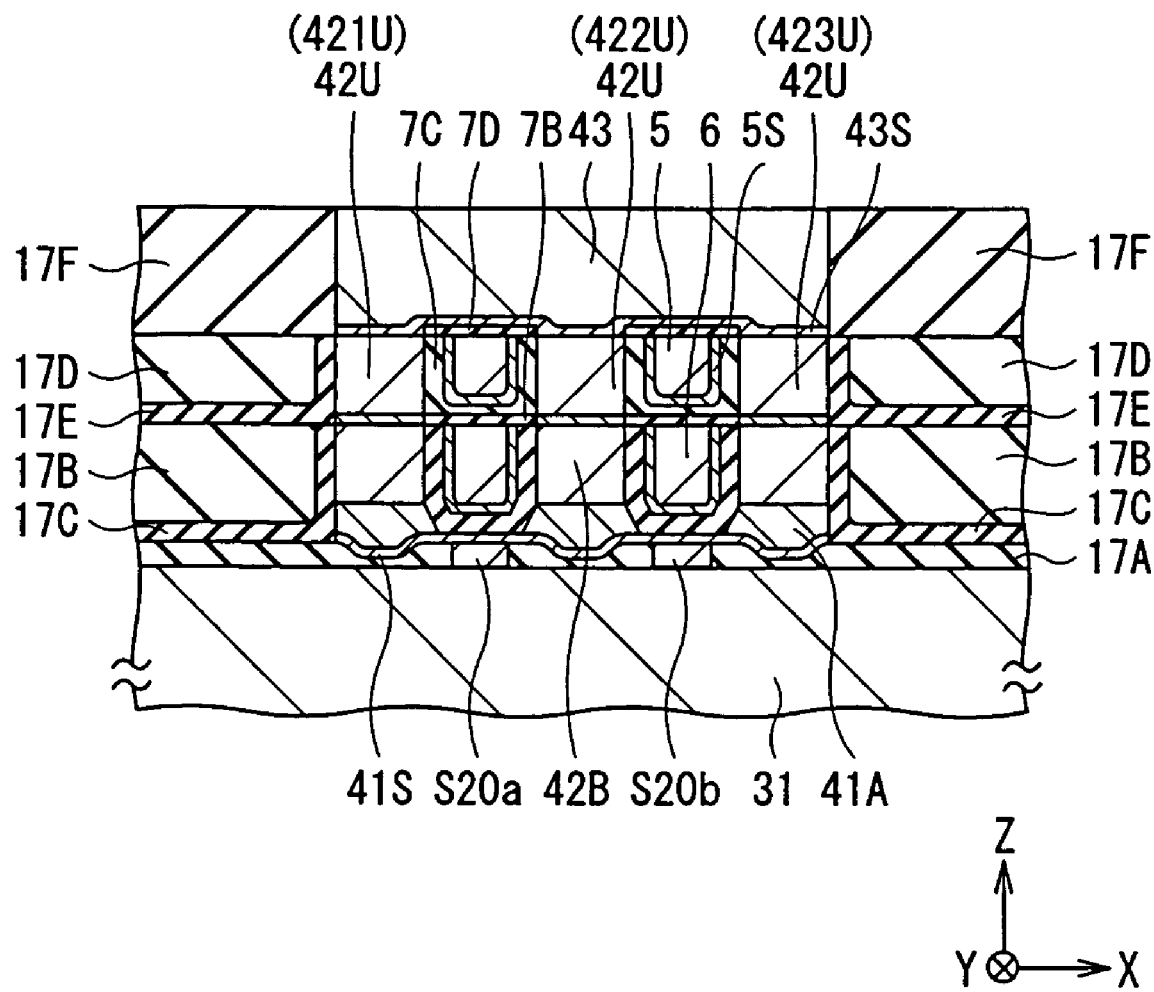
FIG. 29 is an enlarged cross section showing a process subsequent to FIG. 28.

In the following seventh process, by providing the second beam yoke 43 so as to cover the top pillar yoke 42U and the insulating film 7D, formation of the magnetic yoke 4 constructed by the first beam yoke 41, the pillar yokes 421 to 423 (bottom and top pillar yokes 42B and 42U), and the second beam yoke 43 is completed. Concretely, first, as shown in FIG. 27, the underplating film 43S is formed so as to cover the whole by sputtering or the like. Next, as shown in FIG. 28, a resist pattern 30D is selectively formed on the underplating film 43S except for the region corresponding to the formation region of the first beam yoke 41. The resist pattern 30D is used as a mask and a plating process using the underplating film 43S is performed, thereby forming the second beam yoke 43 made of, for example, $Ni_{0.8}Fe_{0.2}$. After formation of the second beam yoke 43, the resist pattern 30D is peeled off and the exposed underplating film 43S is removed by milling or the like. Subsequently, an insulating film 17F made of $Al_2O_3$ or the like is formed on the whole face. As shown in FIG. 29, the whole face is polished to a predetermined thickness by using, for example, a CMP apparatus and planarized. The formation of the magnetic yoke 4 is completed and the memory cell 1 is completed. Further, the read word line 32 having a desired width is formed so as to be electrically connected to the second beam yoke 43.

After that, the write word line lead electrodes 46 are formed at both ends of the write word line 6, the write bit line lead electrodes 47 are formed at both ends of the write bit line 5, the read word line lead electrodes 48 are formed at both ends of the read word line 32 and, further, the read bit line lead electrodes 49 are formed at both ends of the read bit line 33.

In such a manner, formation of the memory cell group 54 including the memory cells 1 is completed.

Further, by performing a process of forming a protection layer made of silicon oxide ($SiO_2$), $Al_2O_3$, or the like by a sputtering apparatus, a CVD apparatus, or the like and a process of polishing the protection layer to expose the lead electrodes 46 to 49, manufacture of the magnetic memory device is completed.

As described above, in the embodiment, the bottom and top pillar yokes 42 and the second beam yokes 43 in the magnetic yoke 4, write bit line 5, and write word line 6 are formed by plating. They can be also formed by a combination of a dry film forming method such as sputtering and a dry patterning method such as milling, reactive ion etching, or the like. However, as compared with the case where they are formed by a dry method such as sputtering, the case of forming them by plating is more preferable since the edge angle can be increased more easily and the yoke 4, write bit line 5 and write word line 6 can be formed with high precision and with sufficient thickness.

Modifications

Referring to FIGS. 30A to 32B, three modifications of the embodiment will be described hereinbelow. Memory cells as modifications shown in FIGS. 30A to 32B have magnetic yokes 4V1 to 4V3 of shapes different from the magnetic yoke 4 in the memory cell 1 shown in FIGS. 4 to 6 and will be described in order.

First Modification

Figure 30A:
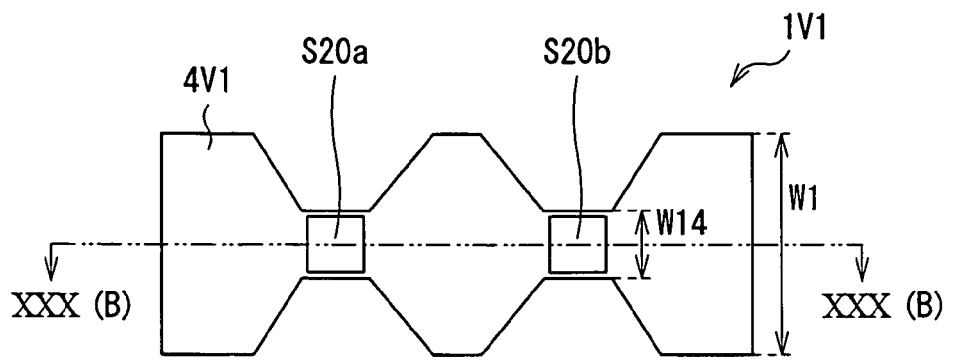
FIG. 30A is a plan view showing a first modification of the magnetic memory cell illustrated in FIG. 5.
Figure 30B:
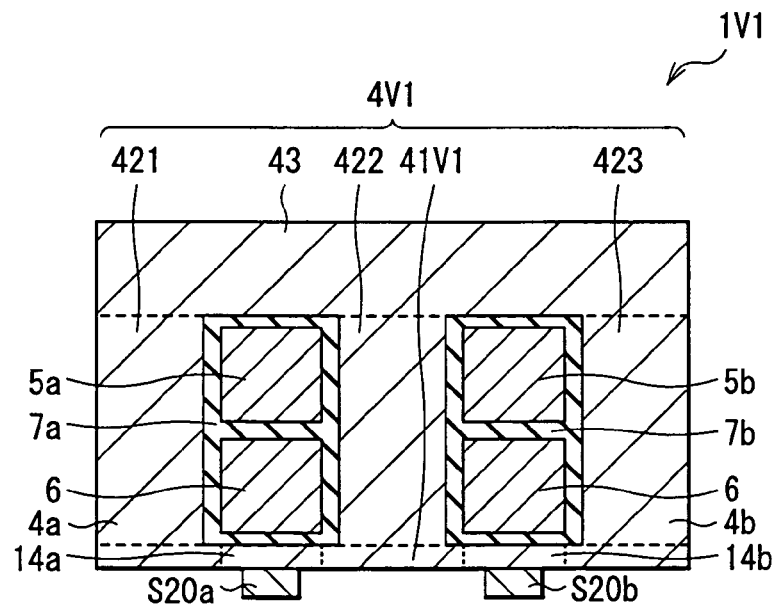
FIG. 30B is a cross section showing the first modification of the magnetic memory cell illustrated in FIG. 5.

FIGS. 30A and 30B show the configuration of a memory cell 1V1 as a first modification of the embodiment. FIG. 30A shows the configuration of an XY plane parallel to the stacked face of the stacked bodies S20a and S20b. FIG. 30B is a cross section taken along line XXX(B)—XXX(B) of FIG. 30A. As described above, in the embodiment, the first beam yokes 41a and 41b in the magnetic yokes 4a and 4b are constructed so that the width in the extending direction (Y-direction) of the write bit lines 5a and 5b and the write word line 6 becomes the minimum in the connection parts 14a and 14b and the width of the stacking direction (Z direction) of the stacked bodies S20a and S20b in the connection parts 14a and 14b, that is, the thickness becomes the minimum in the connection parts 14a and 14b. In contrast, in the memory cell 1V1 of the modification, the magnetic yoke 4V1 is constructed so that the thickness of the first beam yoke 41 becomes uniform and width W14 in the Y-direction of the connection parts 14a and 14b becomes narrower than the width W1 of the adjacent part.

Second Modification

Figure 31A:
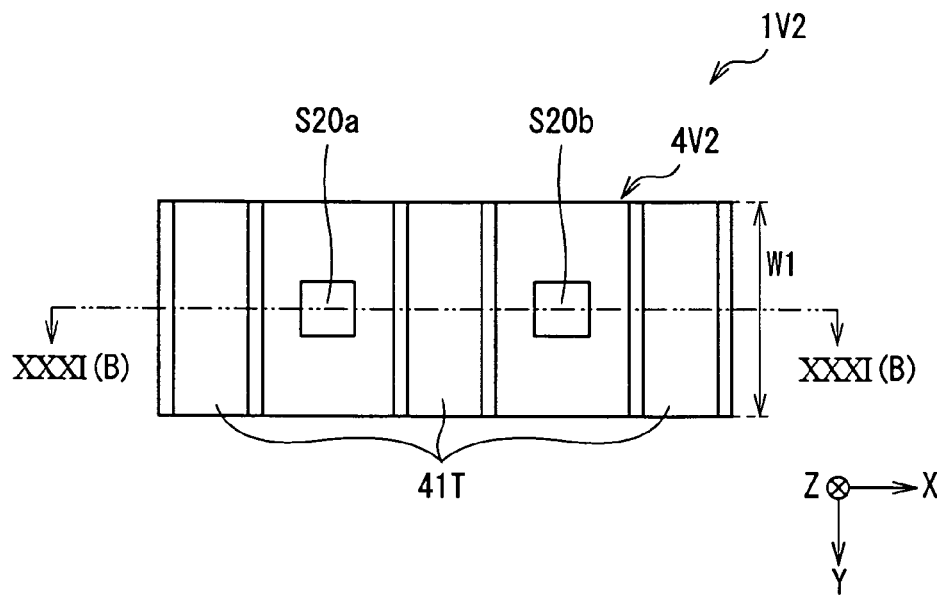
FIG. 31A is a plan view showing a second modification of the magnetic memory cell illustrated in FIG. 5.
Figure 31B:
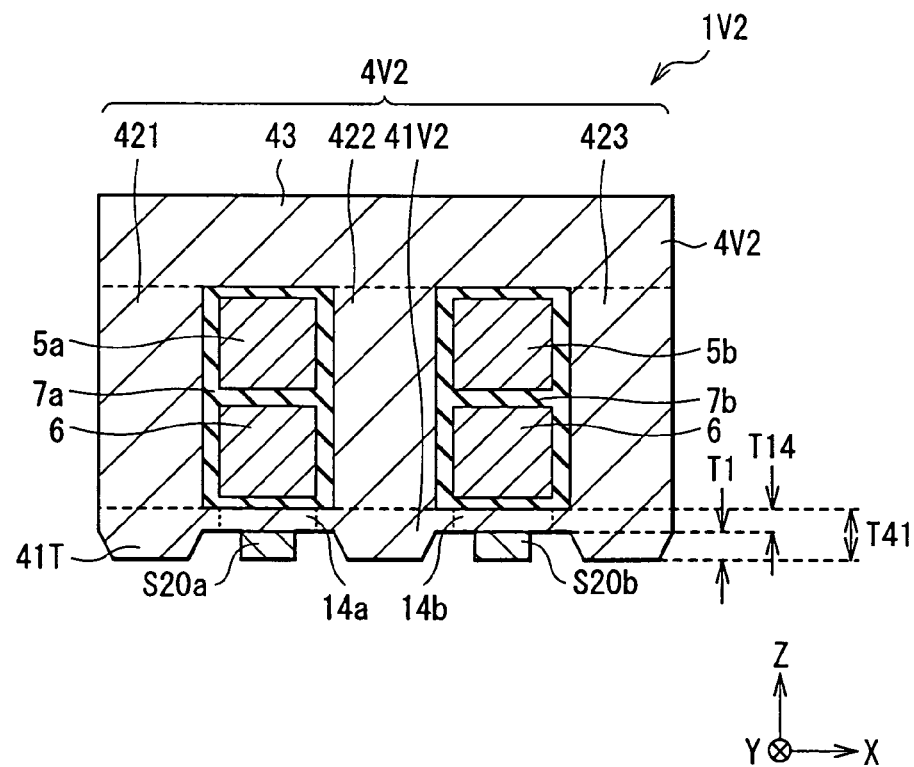
FIG. 31B is a cross section showing the second modification of the magnetic memory cell illustrated in FIG. 5.

FIGS. 31A and 31B show the configuration of a memory cell 1V2 as a second modification of the embodiment. FIG. 31A shows the configuration of an XY plane parallel to the stacked face of the stacked bodies S20a and S20b. FIG. 31B is a cross section taken along line XXXI(B)—XXXI(B) of FIG. 31A. In the memory cell 1V1 of the first modification, the thickness of the first beam yoke 41V1 is made uniform and the width in the Y-direction of the connection parts 14a and 14b is made narrower than the adjacent parts. It is also possible to make the width W1 in the Y-direction of a first beam yoke 41V2 uniform and make the thickness T14 of the connection parts 14a and 14b smaller than the adjacent parts. Concretely, the memory cell 1V2 is constructed to have thickness T41 larger than the thickness T14 of the connection parts 14a and 14b only by height T1 by making the first beam yoke 41V2 have the projection 41T projected toward the stacked bodies S20a and S20b only by the height T1.

Third Modification

Figure 32A:
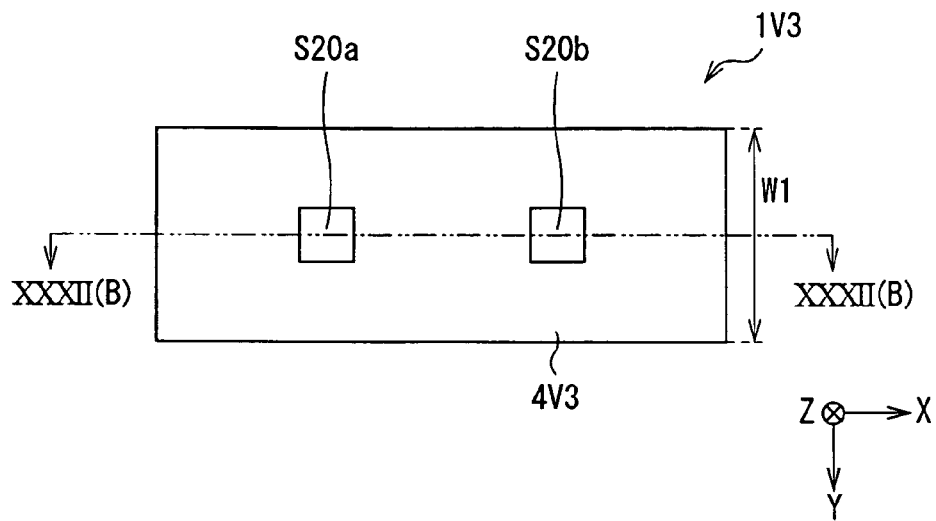
FIG. 32A is a plan view showing a third modification of the magnetic memory cell illustrated in FIG. 5.
Figure 32B:
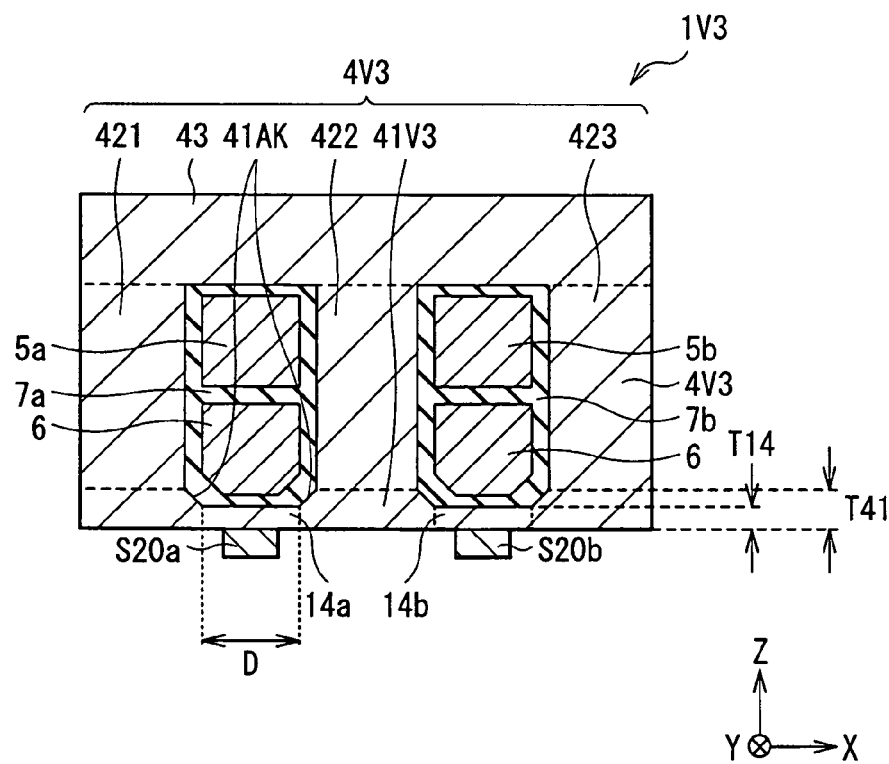
FIG. 32B is a cross section showing the third modification of the magnetic memory cell illustrated in FIG. 5.

FIGS. 32A and 32B show the configuration of a memory cell 1V3 as a third modification of the embodiment. FIG. 32A shows the configuration of an XY plane parallel to the stacked face of the stacked bodies S20a and S20b. FIG. 32B is a cross section taken along line XXXII(B)—XXXII(B) of FIG. 32A. In the memory cell 1V2 of the second modification, the projection 41T projected toward the stacked bodies S20a and S20b is provided. Alternately, like a memory cell 1V3 shown in FIGS. 32A and 32B, a first beam yoke 41V3 may have inclined faces 41AK on both sides of the connection parts 14a and 14b and the thickness increases to the side opposite to the stacked bodies S20a and S20b in the stacking direction (Z direction) of the stacked bodies S20a and S20b with distance from the connection parts 14a and 14b. Also in the configuration, the thickness T14 of the connection parts 14a and 14b can be made smaller than the thickness T41 of the portion adjacent to the connection parts 14a and 14b in the first beam yoke 41V3.

Also in the memory cells 1V1 to 1V3 as the first to third modifications, the area of the cross section orthogonal to the circumferential direction around the write bit lines 5a and 5b and the write word line 6 can be made smallest in the connection parts 14a and 14b, so that the highest magnetic flux density can be obtained in the connection parts 14a and 14b. Therefore, the magnetization of the second magnetic layers 8a and 8b can be inverted efficiently by even smaller write current and stabler writing operation can be performed.

Second Embodiment

A magnetic memory device of a second embodiment of the invention will now be described with reference to FIGS. 33A and 34B.

Figure 33A:
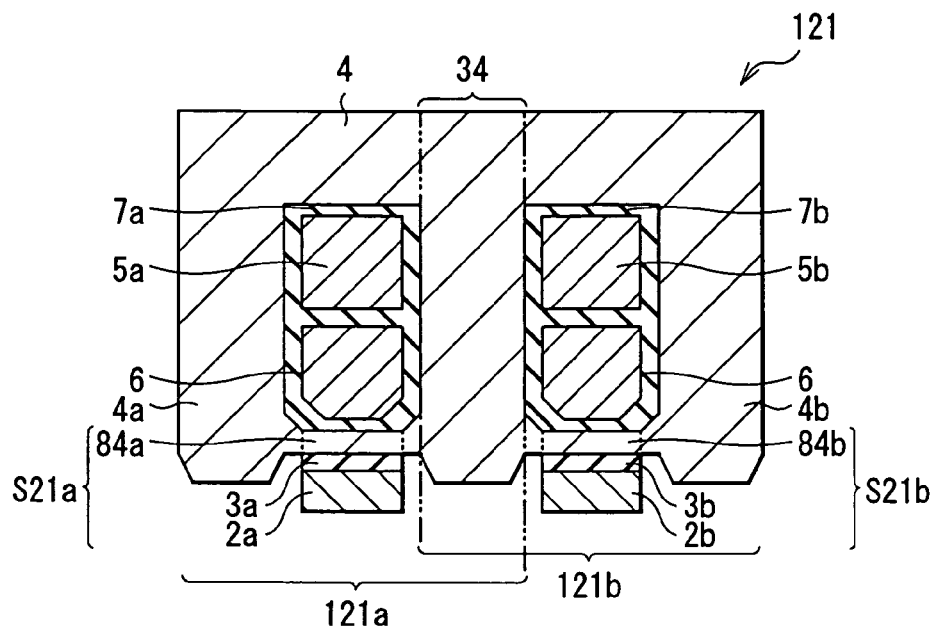
FIG. 33A is a cross section showing the configuration of a main part of a magnetic memory device according to a second embodiment of the invention.
Figure 33B:
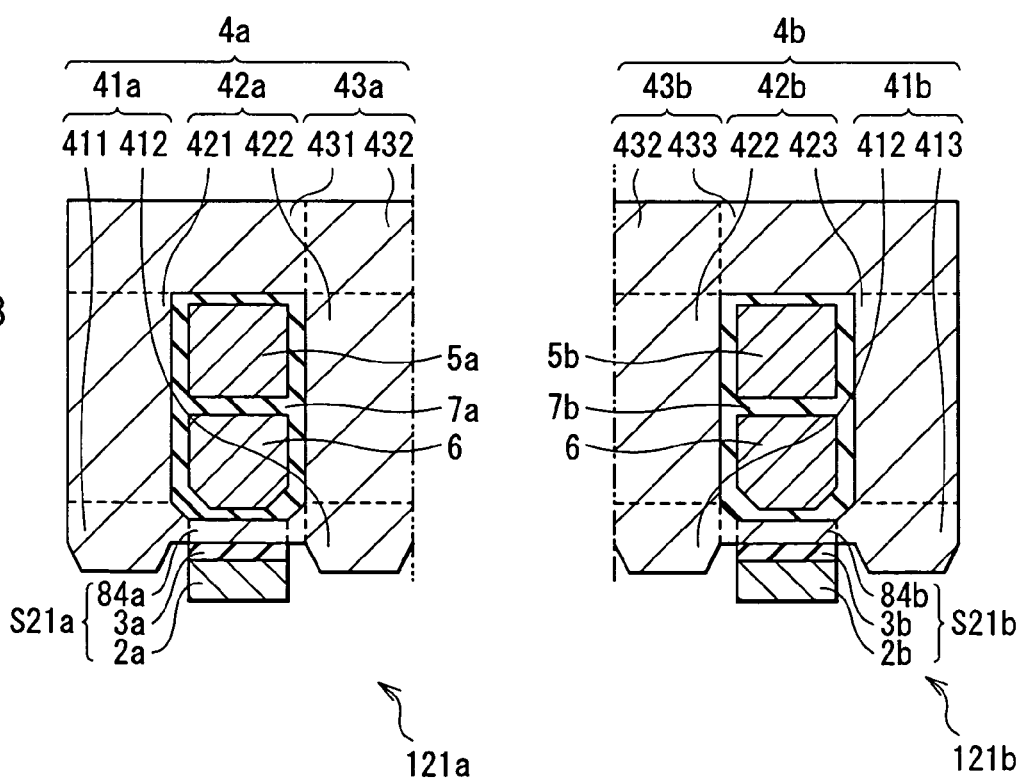
FIG. 33B is a cross section showing that the magnetic memory cell in FIG. 33A is conceptually divided into two TMR elements.

FIGS. 33A and 33B show a sectional configuration of a memory cell 121 in a magnetic memory device of the second embodiment, which corresponds to the memory cell 1 in FIG. 5 of the first embodiment. In FIGS. 33A and 33B, the same reference numerals are assigned to components substantially the same as those shown in FIGS. 6 and 7.

In the following, with respect to the configuration of the magnetic memory device of the second embodiment and a method of manufacturing the magnetic memory device, the points different from the first embodiment will be mainly described and the other description will be omitted appropriately.

In the memory cell 1 of the first embodiment, the pair of the TMR elements 1a and 1b have: the magnetic yokes 4a and 4b constructed so as to surround the whole periphery of the write bit lines 5a and 5b and the write word line 6, respectively; and the stacked bodies S20a and S20b including the second magnetic layers 8a and 8b as a magneto-sensitive layer of which magnetization direction changes according to an external magnetic field, magnetically coupled to the magnetic yokes 4a and 4b, and constructed so that current flows in the direction perpendicular to the stacked face. The magnetic yokes 4a and 4b have the common part. In contrast, in the memory cell 121 of the second embodiment, as shown in FIGS. 33A and 33B, connection parts 84a and 84b as part of the magnetic yoke 4 also serve as magneto sensitive layers in the stacked bodies S21a and S21b.

Specifically, in the TMR 121a and TMR 121b, the connection parts 84a and 84b as part of the magnetic yokes 4a and 4b also function as the magneto-sensitive layer in the stacked bodies S21a and S21b. Therefore, the second magnetic layers 8a and 8b provided for the TMR elements 1a and 1b can be omitted. The memory cell 121 can have a configuration simpler than that of the memory cell 1.

In this case, it is preferable that the axes of easy magnetization of the first magnetic layers 2a and 2b and the connection parts 84a and 84b be parallel to each other so that the magnetization direction of the first magnetic layers 2a and 2b and that of the coupled parts 84a and 84b are stabilized to be parallel or antiparallel to each other. The thickness in the section direction in the connection parts 84a and 84b of the magnetic yokes 4a and 4b is, for example, 20 nm. The coercive force of the connection parts 84a and 84b is preferably in the range from $(50/4\pi) \times 10^3$ A/m to $(100/4\pi) \times 10^3$ A/m and is smaller than that of the first magnetic layers 2a and 2b. With the coercive force smaller than $(50/4\pi) \times 10^3$ A/m, the magnetization direction of the connection parts 84a and 84b may be disturbed by undesirable magnetic fields such as external scattered magnetic fields or the like. On the other hand, with the coercive force exceeding $(100/4\pi) \times 10^3$ A/m, there is the possibility that the TMR elements 121a and 121b themselves deteriorate due to heat generation caused by increase in the write current. Further, when the coercive force of the connection parts 84a and 84b becomes equal to or larger than that of the first magnetic layers 2a and 2b, write current increases and the magnetization direction of the first magnetic layers 2a and 2b as a magnetization fixed layer changes and the TMR elements 121a and 121b as memory elements are destroyed.

Figure 33B:
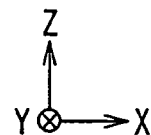
Figure 34A:
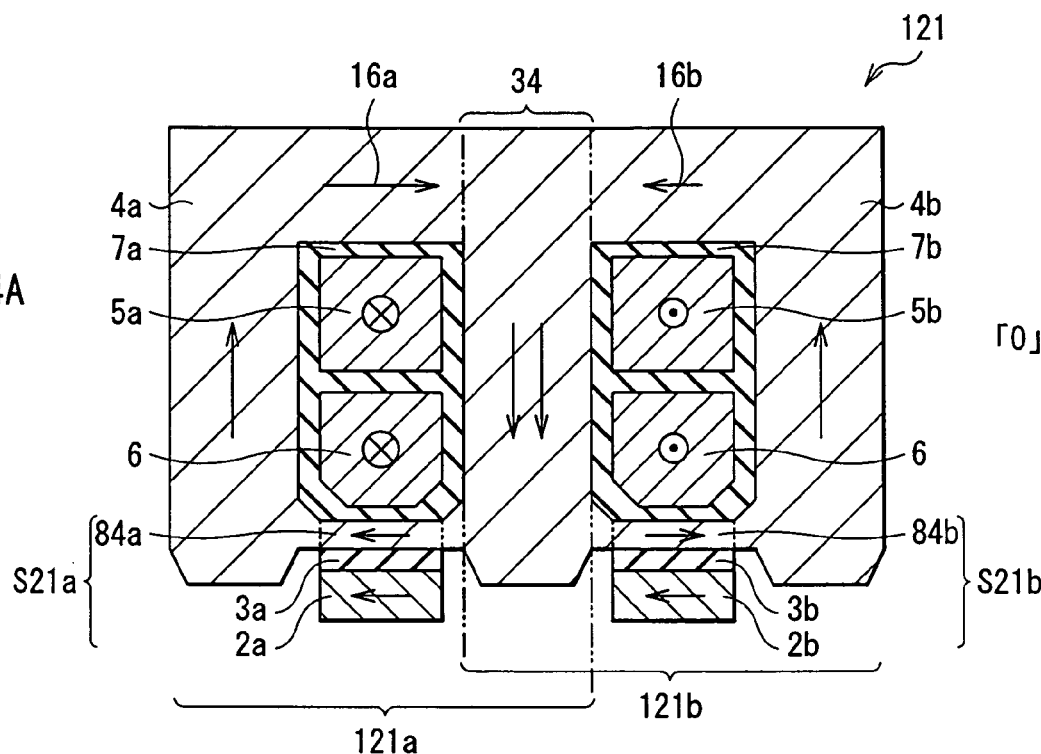
FIG. 34A is a first explanatory diagram showing the relation between a write current direction and a return magnetic field direction (magnetization direction) in the sectional configuration of the magnetic memory cell illustrated in FIG. 33A.

In the memory cell 121, the connection parts 84a and 84b function as memory layers for storing information. Specifically, the magnetization direction of the connection parts 84a and 84b is inverted by a return magnetic field generated by the write current flowing in the write bit line 5 and the write word line 6 and information is stored. In the following, with reference to FIGS. 34A and 34B, the writing operation in the memory cell 121 will be concretely described. FIGS. 34A and 34B show the relation between the write current direction and the return magnetic field direction (magnetization direction) in a sectional configuration of the memory cell 121 illustrated in FIG. 33.

Figure 34B:
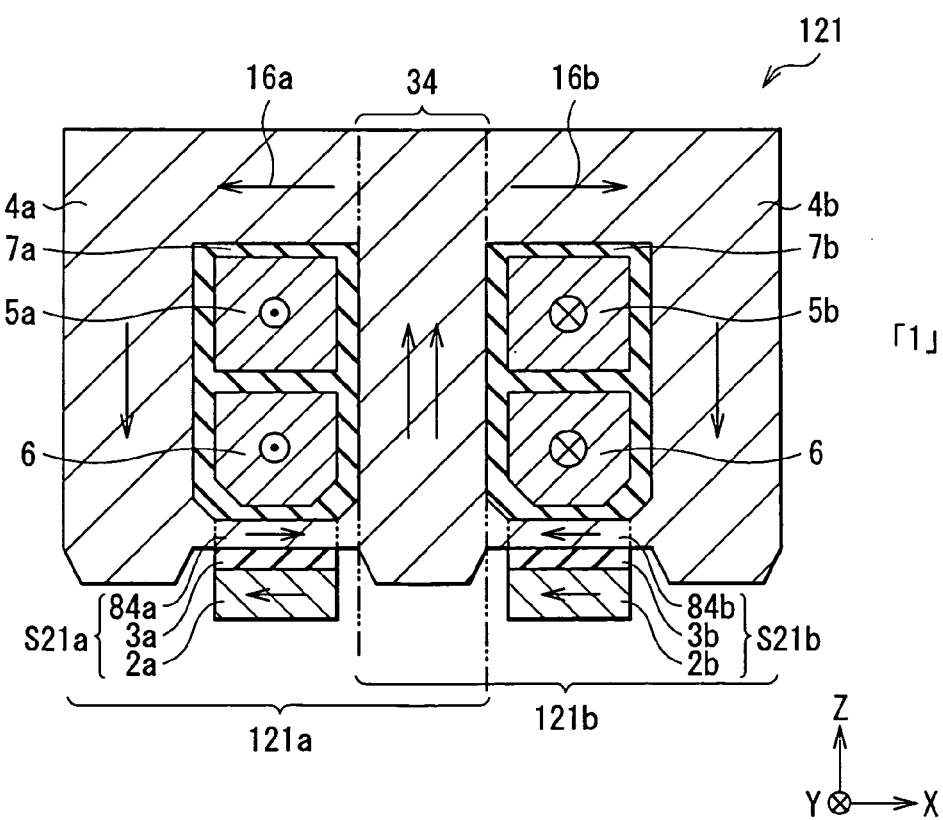
FIG. 34B is a second explanatory diagram showing the relation between the write current direction and the return magnetic field direction (magnetization direction) in the sectional configuration of the magnetic memory cell illustrated in FIG. 33A.

FIGS. 34A and 34B show the case where the write current flows in the same direction in the write bit lines 5a and 5b and the write word line 6 which are parallel to each other and extend in the TMR elements 121a and 121b. FIG. 34A shows a case where write current flows from this side to the depth in the direction perpendicular to the drawing sheet (to the +Y direction) in the TMR element 121a, the return magnetic field 16a is generated in the clockwise direction in the magnetic yoke 4 surrounding the write bit line 5a, write current flows from the depth to this in the direction perpendicular to the drawing sheet side (to the −Y direction) in the TMR element 121b, and the return magnetic field 16b is generated in the counterclockwise direction in the magnetic yoke 4 of the portion surrounding the write bit line 5b. In this case, the magnetization direction of the connection part 84a is the −X direction and the magnetization direction of the connection part 84b is the +X direction. FIG. 34B corresponds to the case where the directions of current flowing in the write bit line 5 and the write word line 6 are opposite to those shown in FIG. 34A. Specifically, FIG. 34B shows a case where write current flows from the depth to this side in the direction perpendicular to the drawing sheet (to the −Y direction) in the TMR element 121a, the return magnetic field 16a is generated in the counterclockwise direction in the magnetic yoke 4 of the portion surrounding the write bit line 5a, write current flows from this side to the depth in the direction perpendicular to the drawing sheet (to the +Y direction) in the TMR element 121b, and the return magnetic field 16b is generated in the clockwise direction in the annular magnetic yoke 4 of the portion surrounding the write bit line 5b. In this case, the magnetization direction of the connection part 84a is the +X direction and the magnetization direction of the connection part 84b is the −X direction.

When current flows in the same direction in the write bit line 5 and the write word line 6, the magnetization directions of the connection parts 84a and 84b are inverted and 0 or 1 is recorded. For example, in the case where the "0" corresponds to the state of FIG. 34A, the state of FIG. 34B is identified as "1". In the case where the write currents flow in the opposite directions or the write current flows only in one of the lines, the magnetization directions of the connection parts 84a and 84b are not inverted and data is not rewritten.

As described above, in the magnetic memory device of the embodiment, the connection parts 84a and 84b as parts of the magnetic yokes 4a and 4b also function as the magneto-sensitive layers in the stacked bodies S21a and S21b, so that the memory cell 121 having a simpler configuration can be obtained. In addition, the magnetic memory device of the embodiment is constructed so that the area of the cross section orthogonal to the circumferential direction of the pair of magnetic yokes 4a and 4b is the smallest in the connection parts 84a and 84b with the stacked bodies S21a and S21b. Consequently, the magnetic flux density in the connection parts 84a and 84b in the return magnetic fields 16a and 16b generated when the write current is passed to the write bit lines 5a and 5b and the write word line 6 can be increased and stabilized. Therefore, the magnetization of the connection parts 84a and 84b as the magneto-sensitive layers can be efficiently inverted even by smaller write current, and stabler writing operation can be performed.

EXAMPLES

Concrete examples of the first embodiment will now be described. In the examples, samples of the magnetic memory device of the first to third modifications were formed on the basis of the manufacturing method described in the foregoing first embodiment.

First Example

Figure 35:
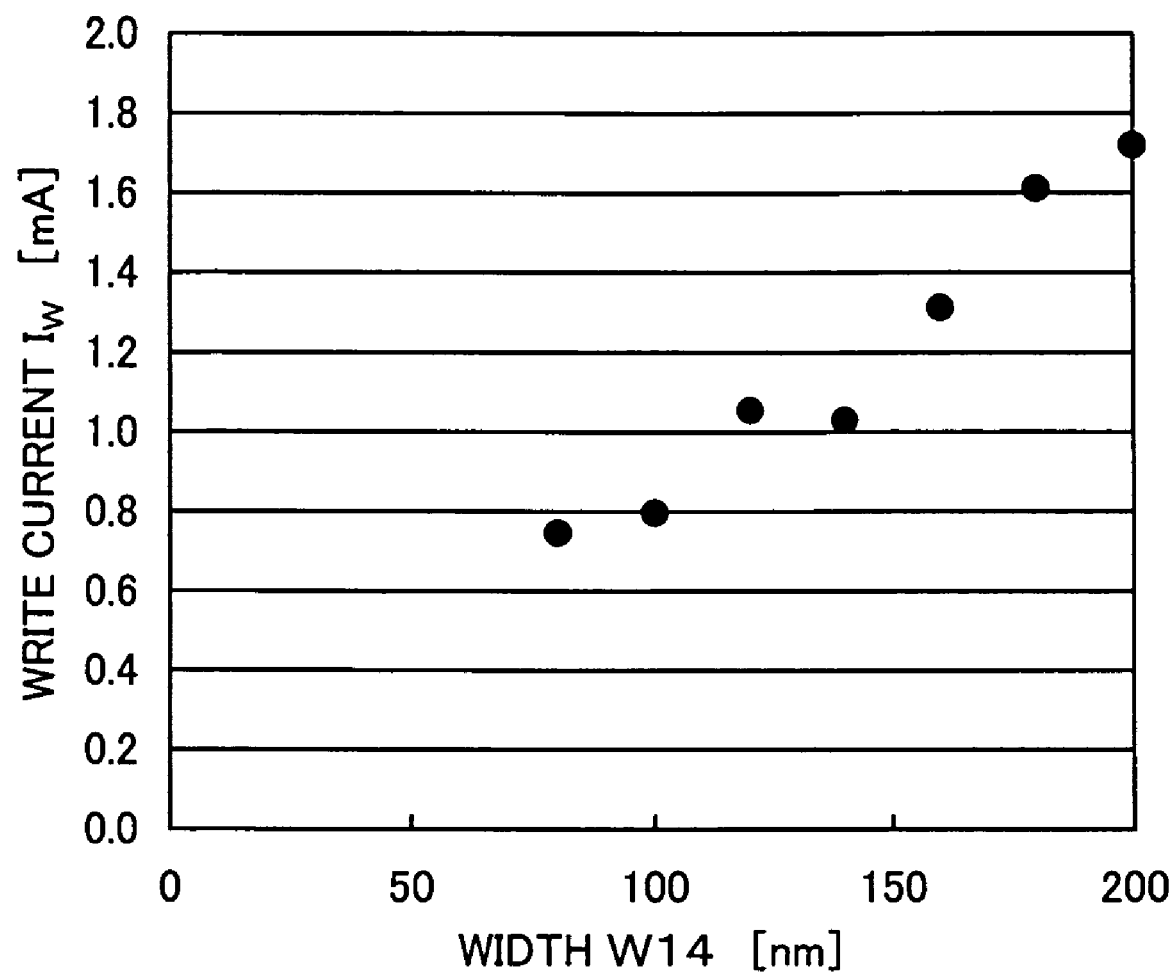
FIG. 35 is a characteristic diagram showing the relation between the width of a connection part and write current required to invert the magnetization of a magneto-sensitive layer in the magnetic memory cell as the first modification shown in FIGS. 30A and 30B.

In the first example, the relation between the width W14 of the connection part 14 in the magnetic yoke 4 and write current $I_W$ necessary for inverting the magnetization of the second magnetic layers 8a and 8b in the memory cell 1V1 shown in FIGS. 30A and 30B was measured. It was assumed that the width W1 in the Y-direction of the adjacent parts sandwiching the connection parts 14a and 14b in the first beam yoke 41V1 is 200 nm, the size of each side of the XY plane of each of the stacked bodies S20a and S20b is 100 nm, and the distance between the stacked bodies S20a and S20b is 600 nm. It was also assumed that the thickness in the Z direction of the connection parts 14a and 14b is 20 nm, the height in the Z direction of the pillar yokes 421 to 423 is 420 nm, the length in the X-direction of the pillar yokes 421 and 423 is 250 nm, the length in the X-direction of the pillar yoke 422 is 300 nm, and the thickness in the Z direction of the second beam yoke 43 is 200 nm. Further, it was also assumed that the length in the X-direction of the write bit lines 5a and 5b and the write word line 6 is 200 nm and the thickness in the Z direction is 150 nm. FIG. 35 shows the result of measurement of the memory cell 1V1. In the graph of FIG. 35, the horizontal axis indicates the width W14 (unit:

nanometer (nm)) and the vertical axis indicates write current $I_W$ (unit: milliampere (mA)). In the state where the first beam yoke 41V1 does not have any narrowed part, the width W14 is 200 nm. It is understood from FIG. 35 that the write current $I_W$ is the highest numerical value at the width W14=200 nm in the state where the first beam yoke 41V1 does not have any narrowed part, and can be decreased as the width W14 is narrowed.

Second Example

Figure 36:
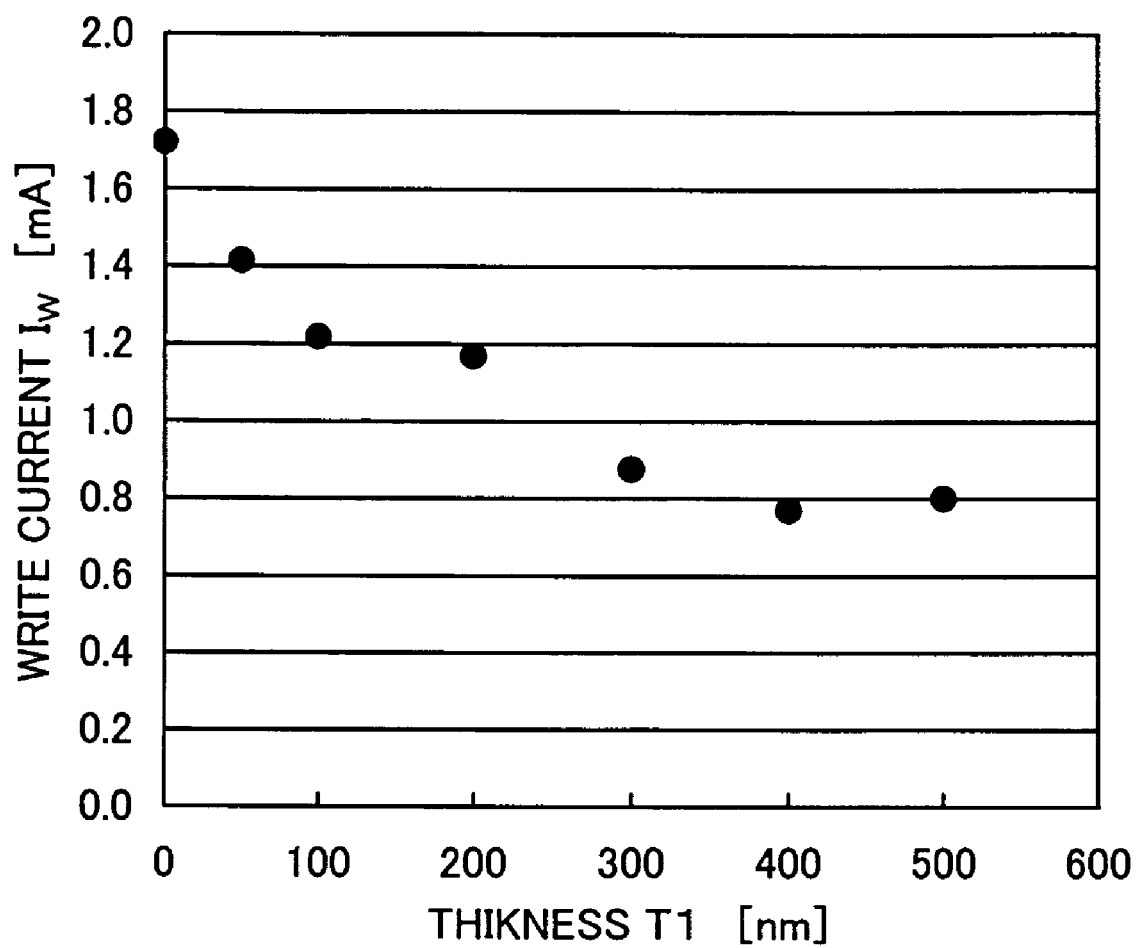
FIG. 36 is a characteristic diagram showing the relation between the thickness of projections provided on both sides of the connection part and the write current required to invert the magnetization of a magneto-sensitive layer in the magnetic memory cell as the second modification shown in FIGS. 31A and 31B.

In the second example, the relation between the thickness T1 of the projection 41T and write current $I_W$ necessary for inverting the magnetization of the second magnetic layers 8a and 8b in the memory cell 1V2 shown in FIGS. 31A and 31B was measured. It was assumed that the width W1 in the Y-direction in the first beam yoke 41V2 is 200 nm, the size of each side of the XY plane of each of the stacked bodies S20a and S20b is 100 nm, and the distance between the stacked bodies S20a and S20b is 600 nm. It was also assumed that the thickness in the Z direction of the connection parts 14a and 14b is 20 nm, the height in the Z direction of the pillar yokes 421 to 423 is 420 nm, the length in the X-direction of the pillar yokes 421 and 423 is 250 nm, the length in the X-direction of the pillar yoke 422 is 300 nm, and the thickness in the Z direction of the second beam yoke 43 is 200 nm. Further, it was also assumed that the length in the X-direction of the write bit lines 5a and 5b and the write word line 6 is 200 nm and the thickness in the Z direction is 150 nm. FIG. 36 shows the result of measurement of the memory cell 1V2. In the graph of FIG. 36, the horizontal axis indicates the thickness T1 (unit: nanometer (nm)) and the vertical axis indicates write current $I_W$ (unit: milliampere (mA)). In the state where the first beam yoke 41V2 does not have any projection 41T (in the case where the surface facing the stacked body S20 of the first beam yoke 41 is flat), the thickness T1 is 0 nm. It is understood from FIG. 36 that the write current $I_W$ has the highest numerical value at the thickness T1=0 nm in the state where the first beam yoke 41V2 does not have any projection, and can be decreased as the thickness T1 is increased.

Third Example

Figure 37:
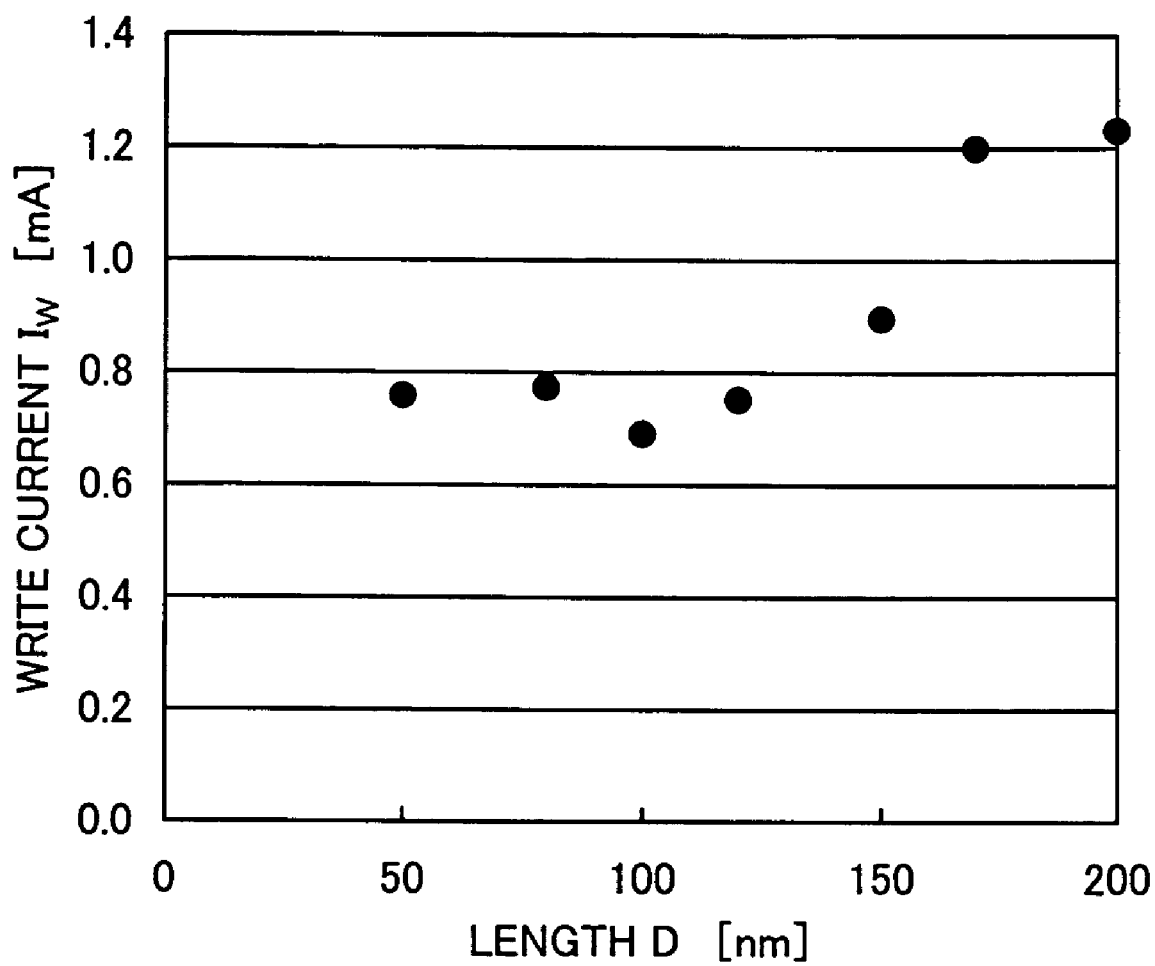
FIG. 37 is a characteristic diagram showing the relation between the length of a region having a thickness equal to the connection part in the magnetic yoke 4 and the write current required to invert the magnetization of the magneto-sensitive layer in the magnetic memory cell as the third modification shown in FIGS. 32A and 32B.

In the third example, the relation between length D of a region having thickness equivalent to that of the connection part 14 in the magnetic yoke 4 and the write current $I_W$ necessary for inverting the magnetization of the second magnetic layers 8a and 8b in the memory cell 1V3 shown in FIGS. 32A and 32B was measured. It was assumed that the width W1 in the Y-direction of the first beam yoke 41V3 is 200 nm, the size of each side of the XY plane of each of the stacked bodies S20a and S20b is 100 nm, and the distance between the stacked bodies S20a and S20b is 600 nm. It was also assumed that the thickness T14 in the Z direction of the connection parts 14a and 14b is 20 nm, the height in the Z direction of the pillar yokes 421 to 423 is 420 nm, the length in the X-direction of the pillar yokes 421 and 423 is 250 nm, the length in the X-direction of the pillar yoke 422 is 300 nm, and the thickness in the Z direction of the second beam yoke 43 is 200 nm. Further, it was also assumed that the length in the X-direction of the write bit lines 5a and 5b and the write word line 6 is 200 nm and the thickness in the Z direction is 150 nm. The inclination angle of the inclined face 41AK was 45° from the stacked face of the stacked bodies S20a and S20b. FIG. 37 shows the result of measurement of the memory cell 1V3. In the graph of FIG. 37, the horizontal axis indicates the length D (unit: nanometer (nm)) and the vertical axis indicates write current $I_W$ (unit: milliampere (mA)). In the state where the first beam yoke 41V3 does not have any inclined face 41AK, the length D is 200 nm. It is understood from FIG. 37 that the write current $I_W$ can be reduced by decreasing the length D to a length almost equal to the length (100 nm) of the stacked bodies S20a and S20b.

Although the invention has been described above by some embodiments and examples, the invention is not limited to the embodiments and examples but can be variously modified. For example, in the foregoing first and second embodiments and examples, as the shapes of the magnetic yoke, three patterns (and a combination of the patterns) of the first to third modifications have been described. However, the invention is not limited to the configurations. It is sufficient that the area of a cross section orthogonal to the circumferential direction of the magnetic yoke is the smallest in the connection part to the stacked body.

Figure 38:
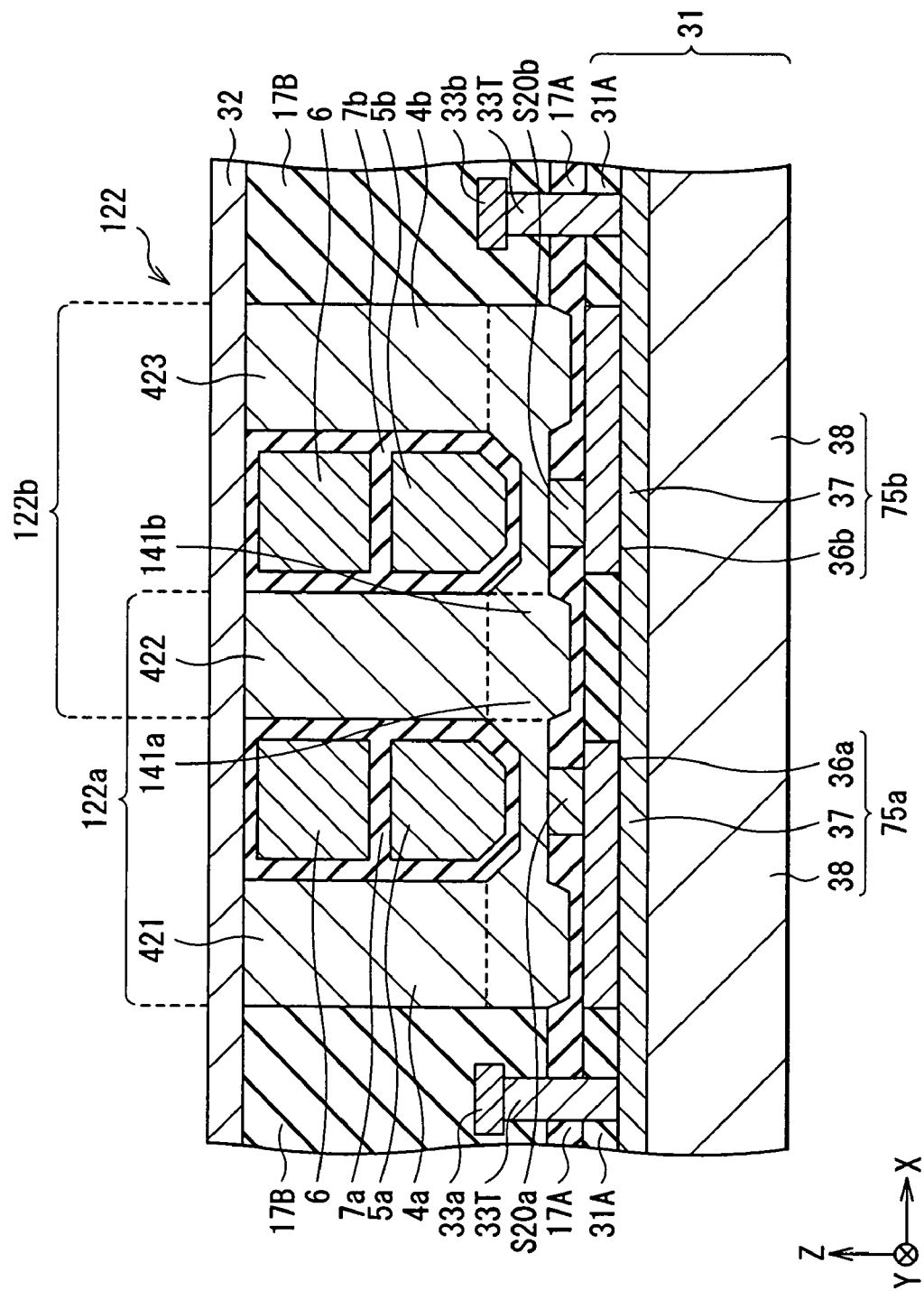
FIG. 38 is a cross section showing a fourth modification of the magnetic memory cell illustrated in FIG. 5.

In the foregoing first and second embodiments and examples, the case where a part of the magnetic yoke formed so as to surround the whole periphery of the first and second write lines is shared by the pair of magneto-resistive elements in the magnetic memory cell has been described, but the invention is not limited to the case. To be concrete, like a memory cell 122 (fourth modification) shown in FIG. 38, two U-shaped magnetic yokes (magnetic yokes each having a sectional shape a part of which is open) constructed to surround a part of the periphery of the first and second write lines and each having an opening on the side opposite to the stacked body may be connected to each other. The memory cell 122 has: a TMR element 122a including the magnetic yoke 4a constructed by a pair of pillar yokes 421 and 422 facing each other and extending in the direction orthogonal to the layer stacked face of the stacked body S20a and a beam yoke 141a connected to one end on the side of the stacked body S20a of each of the pair of pillar yokes 421 and 422; and a TMR element 122b including the magnetic yoke 4b constructed by a pair of pillar yokes 422 and 423 facing each other and extending in the direction orthogonal to the layer stacked face of the stacked body S20b and a beam yoke 141b connected to one end on the side of the stacked body S20b of each of the pair of pillar yokes 422 and 423. The pair of TMR elements 122a and 122b share the pillar yoke 422. Also in the memory cell 122 having such a configuration, by constructing so that the area of a cross section orthogonal to the circumferential direction of the magnetic yoke is the smallest in the connection part with the stacked body, the highest magnetic flux density can be obtained in the connection part. Therefore, the magnetization of the magneto-sensitive layers of the stacked bodies S20a and S20b can be efficiently inverted even by smaller write current, and stabler writing operation can be performed. Further, in this case, it is not always necessary to provide the pillar yokes 421 to 423. That is, a memory cell having a shape obtained by eliminating the pillar yokes 421 to 423 in the memory cell 122 shown in FIG. 38 can be also employed.

Figure 39:
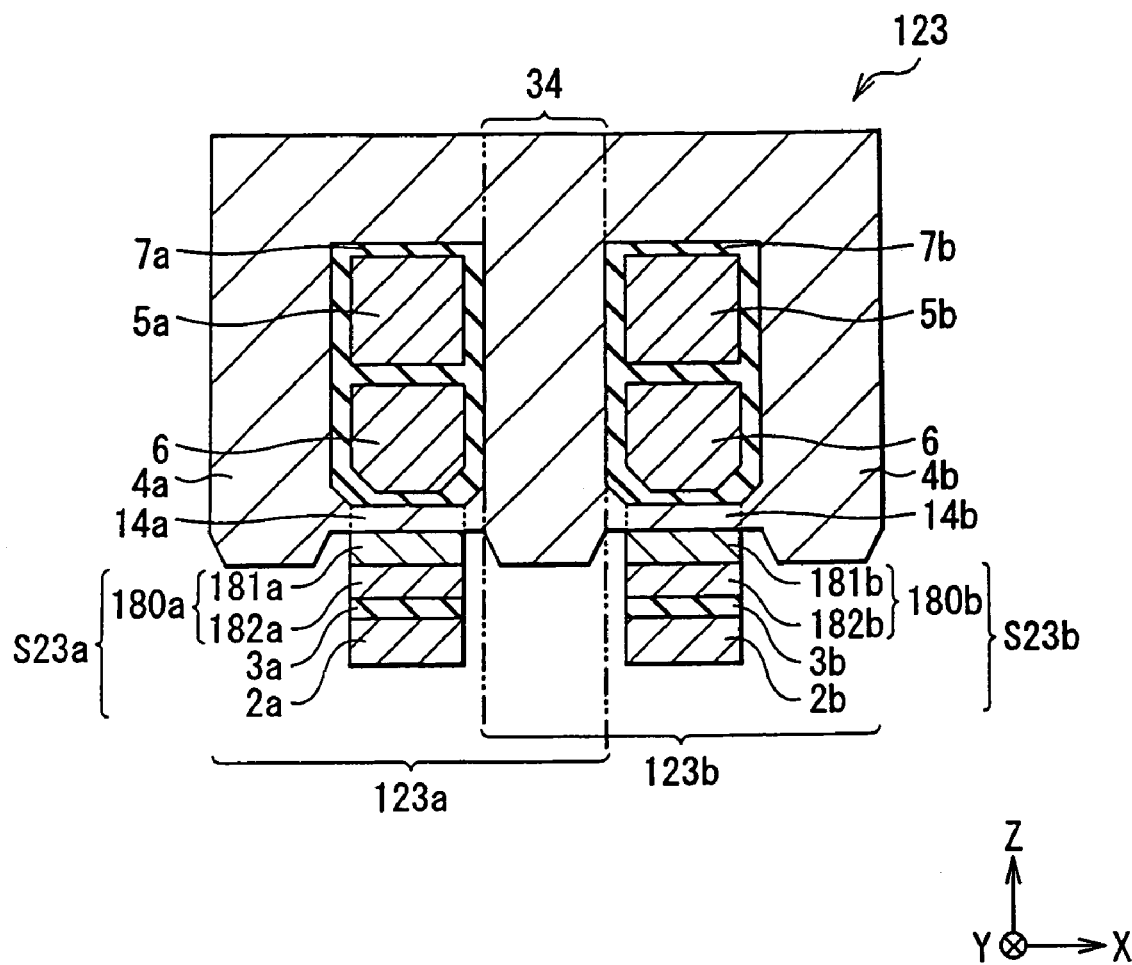
FIG. 39 is a cross section showing a fifth modification of the magnetic memory cell illustrated in FIG. 5.

The configuration of the stacked body is not limited to that of the stacked bodies S20a and S20b shown in FIG. 6 or the stacked bodies S21a and S21b shown in FIGS. 33A and 33B in the foregoing first and second embodiments. For example, like stacked bodies S23a and S23b of a memory cell 123 (fifth modification) shown in FIG. 39, the second magnetic layers 8a and 8b as magneto-sensitive layers may have a two-layered structure including first free magnetization layers 181a and 181b and second free magnetization layers 182a and 182b having a coercive force larger than that of the first free magnetization layers 181*a* and 181*b*, respectively. Although not shown, it is also possible to provide an antiferromagnetic layer on the side opposite to the tunnel barrier layers 3*a* and 3*b* of the first magnetic layers 2*a* and 2*b* in the stacked bodies S20*a* and S20*b* or the stacked bodies S21*a* and S21*b* to thereby stabilize magnetization of the first magnetic layers 2*a* and 2*b*. The stacked body is not limited to the configuration that current flows in the direction orthogonal to the layer stacked face but may be constructed so that current flows along the layer stacked face.

Figures 40A, 40B:
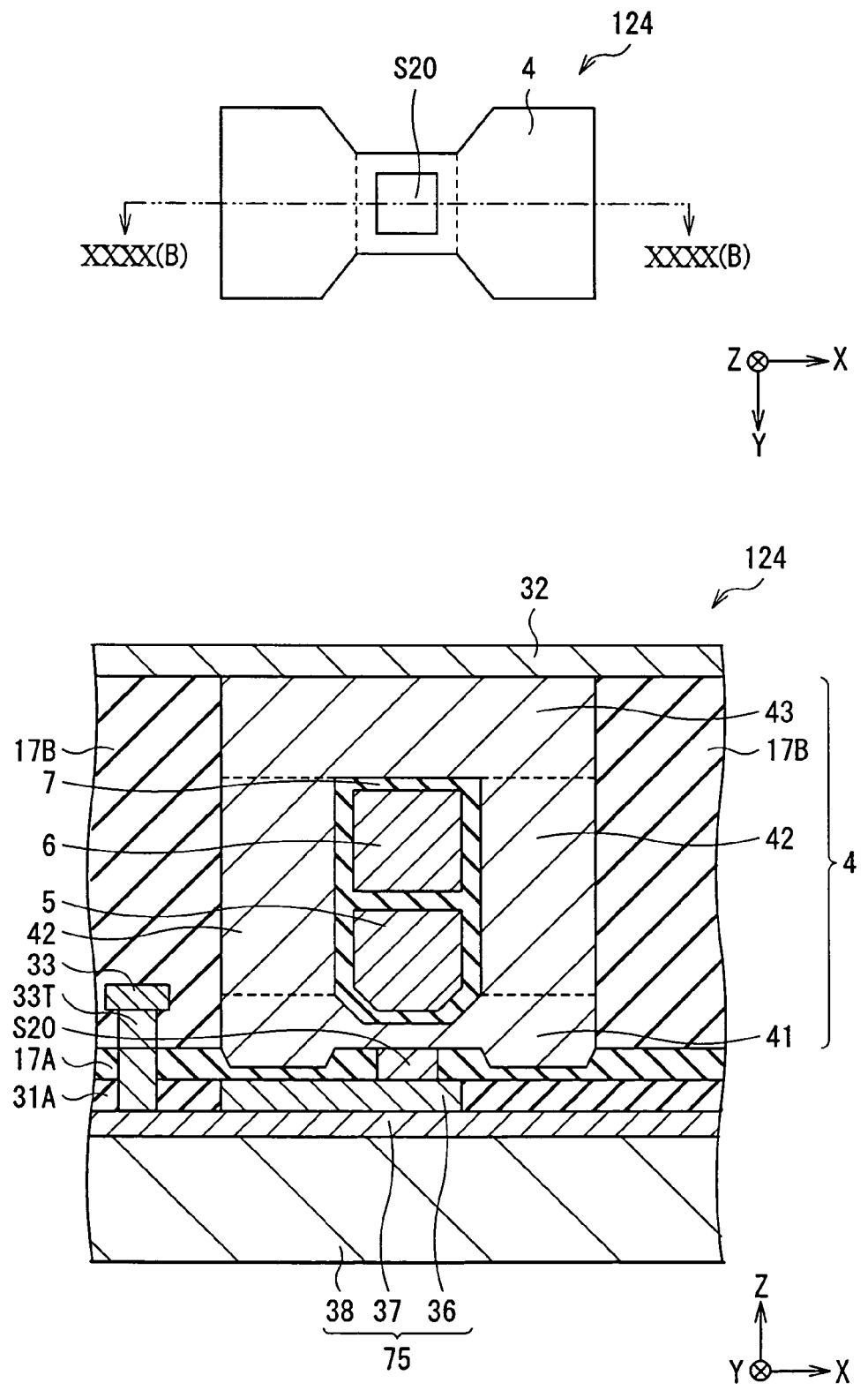

Although the magnetic memory cell having a pair of magneto-resistive elements has been described in the foregoing first and second embodiments, the invention is not limited to the magnetic memory cell. For example, like a memory cell 124 (sixth modification) shown in FIGS. 40A and 40B, a single TMR element 124 having one magnetic yoke 4 and one stacked body S20 may be used as a magnetic memory element. FIG. 40A shows the configuration of an XY plane parallel to the stacked face of the stacked bodies S20*a* and S20*b* in the TMR element 124, and FIG. 40B is a cross section taken along line XXXX(B)—XXXX(B) of FIG. 40A.

Figure 41:
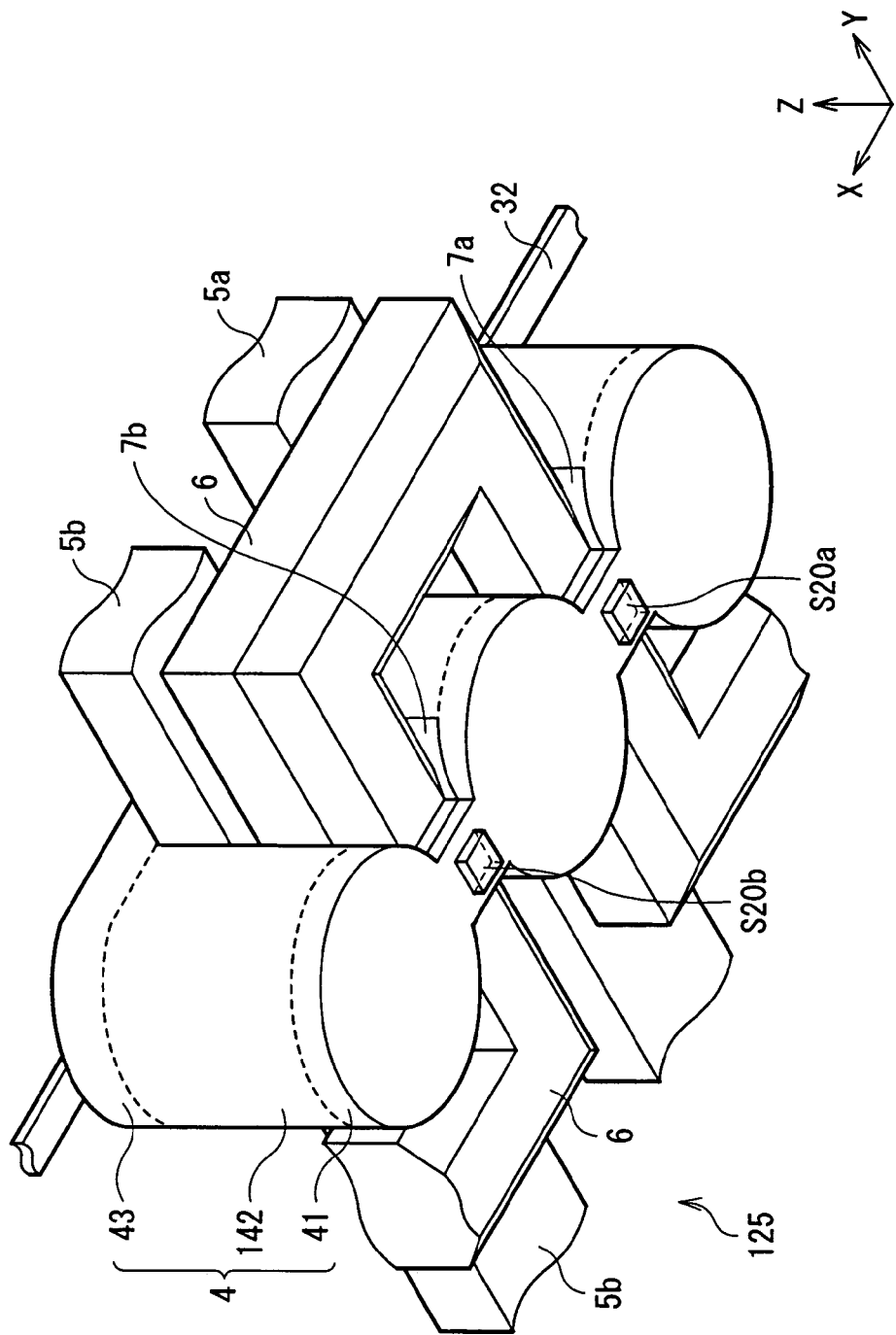
FIG. 41 is a perspective view showing a seventh modification of the magnetic memory cell illustrated in FIG. 5.

In the first and second embodiments, the pillar yoke in the magnetic yoke has a prismatic shape. However, the invention is not limited to the shape. For example, like a memory cell 125 shown in FIG. 41, a pillar yoke 142 having a cylindrical shape may be employed.

Figure 42:
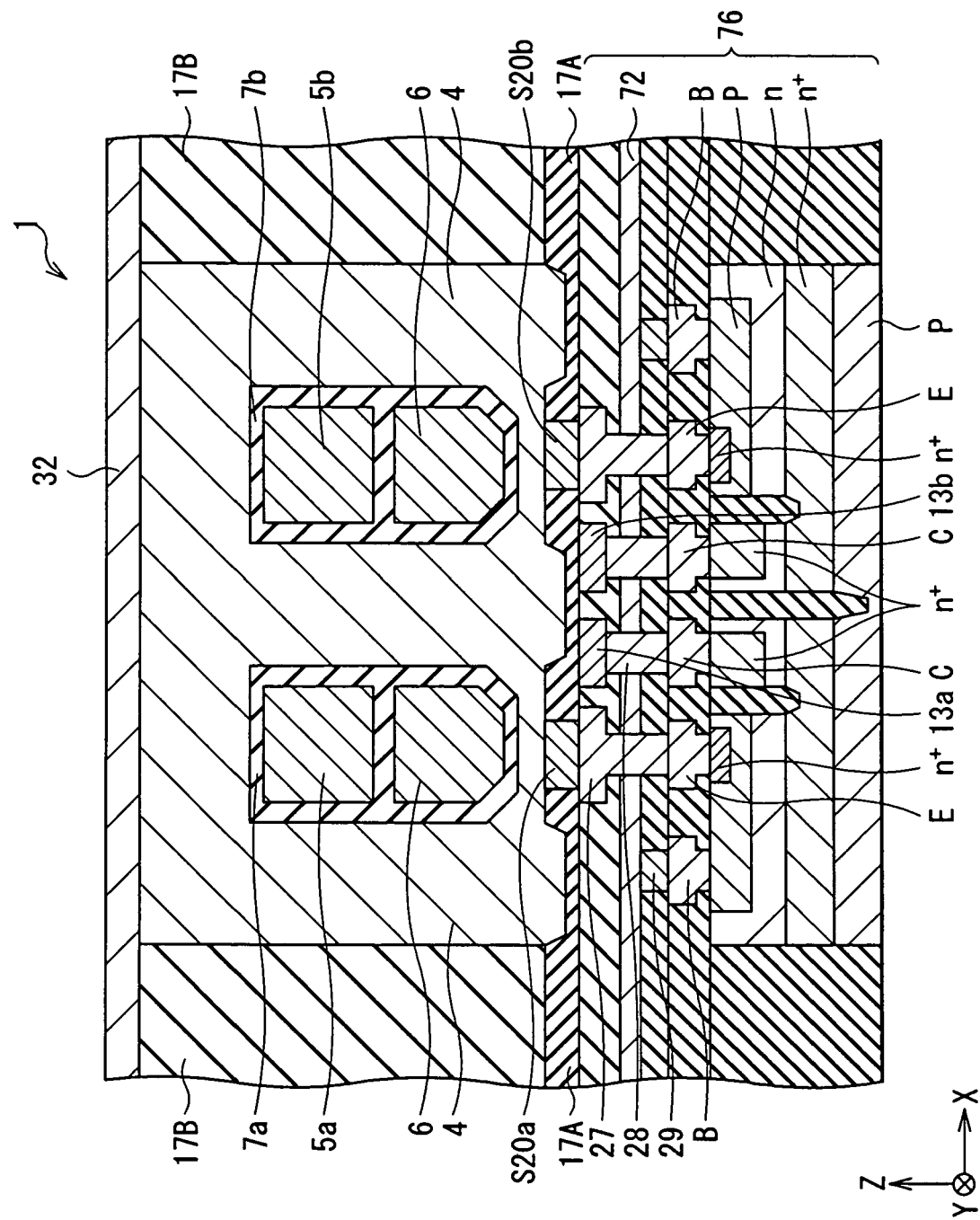
FIG. 42 is a cross section showing a sectional configuration of a modification of a rectifying device in the circuit configuration illustrated in FIG. 10.
Figure 43:
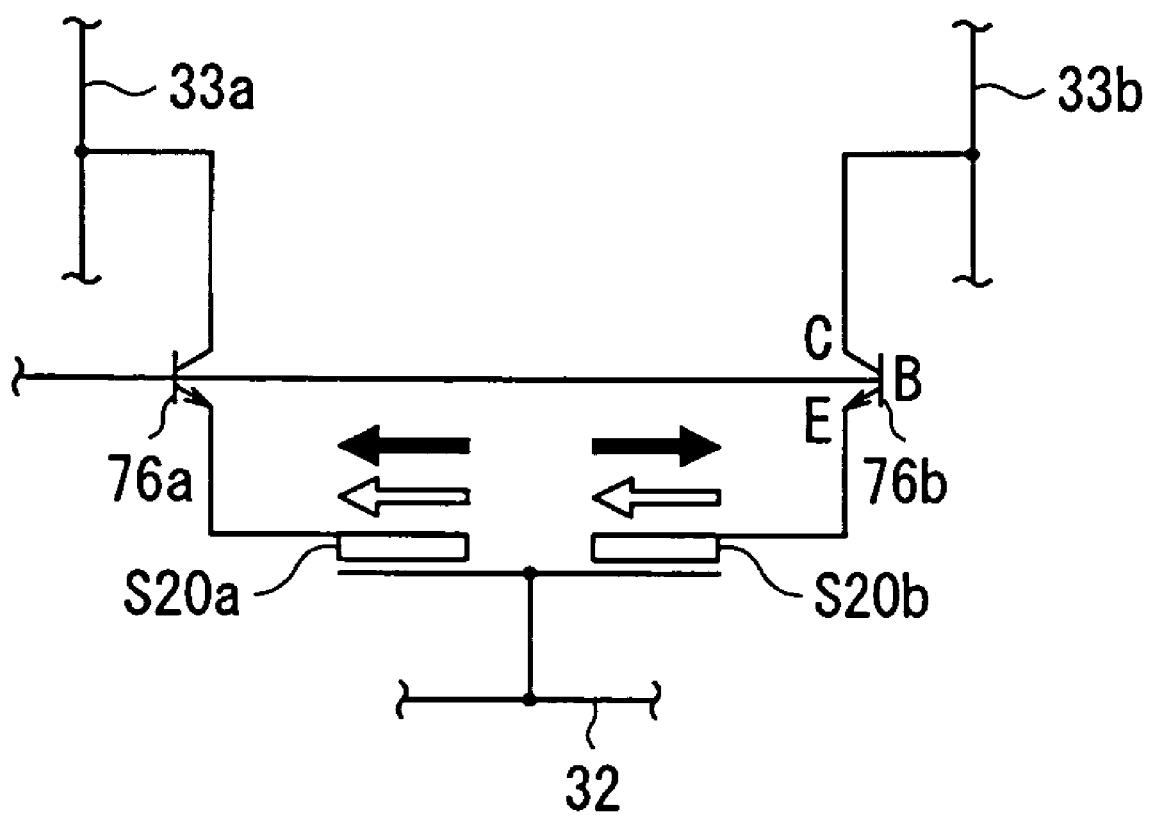
FIG. 43 is a circuit diagram showing a main part of a circuit configuration including a rectifying device as a modification of FIG. 42.

Further, although a pair of diodes is used as a rectifier in the read circuit in the embodiments, the invention is not limited to the configuration. For example, as shown in FIGS. 42 and 43, a pair of bipolar transistors 76*a* and 76*b* may be used. FIG. 42 shows a sectional configuration of the bipolar transistors 76*a* and 76*b*. FIG. 43 shows the configuration of a main part of a circuit in the case where the bipolar transistors 76*a* and 76*b* are provided between the read bit lines 33*a* and 33*b* and the stacked bodies S20*a* and S20*b*. As shown in FIGS. 42 and 43, one end of each of the TMR elements 1*a* and 1*b* in each memory cell 1 is connected to the read bit lines 33*a* and 33*b* via the pair of bipolar transistors 76*a* and 76*b*, respectively, and the other ends are connected to the common read word line 32. More specifically, bases B in the pair of bipolar transistors 76*a* and 76*b* are connected to the word decode line 72, collectors C are connected to the read bit lines 33*a* and 33*b* via the connection layer 29, and emitters E are connected to the stacked parts 20*a* and 20*b* via the connection layer 27, respectively. In this case, when a control signal from the word decode line 72 reaches the bases B in the selected pair of bipolar transistors 76*a* and 76*b*, the collector C and the emitter E are made conductive, and read current flows in the stacked bodies S20*a* and S20*b* (stacked parts 20*a* and 20*b*), thereby reading information.

Obviously many modifications and variations of the present invention are possible in the light of the above teachings. It is therefore to be understood that within the scope of the appended claims, the invention may be practiced otherwise than as specifically described.

What is claimed is:

1. A magneto-resistive element comprising:
   a magnetic yoke disposed in a partial region along an extension direction of a conductor and disposed in the circumferential direction so as to surround the conductor; and
   a stacked body including a magneto-sensitive layer of which magnetization direction changes according to an external magnetic field, and magnetically coupled to the magnetic yoke,
   wherein area of a cross section orthogonal to the circumferential direction of the magnetic yoke is the smallest in a part connected to the stacked body.

2. A magneto-resistive element according to claim 1, wherein the area of the cross section of the magnetic yoke gradually decreases toward the connection part.

3. A magneto-resistive element according to claim 1, wherein width of the magnetic yoke is the smallest in the connection part.

4. A magneto-resistive element according to claim 1, wherein width of the magnetic yoke gradually decreases toward the connection part.

5. A magneto-resistive element according to claim 1, wherein thickness of the magnetic yoke is the smallest in the connection part.

6. A magneto-resistive element according to claim 1, wherein thickness of the magnetic yoke gradually decreases toward the connection part.

7. A magneto-resistive element according to claim 1, wherein the magnetic yoke includes one beam yoke extending in the direction along a layer stack face of the stacked body and having the connection part.

8. A magneto-resistive element according to claim 1, wherein the magnetic yoke includes:
   a pair of pillar yokes facing each other over the conductor and extending in the direction orthogonal to the layer stack face of the stacked body; and
   one beam yoke connected to one end on the stacked body side, of each of the pair of pillar yokes and having the connection part, and has a partially opened sectional shape.

9. A magneto-resistive element according to claim 1, wherein the magnetic yoke includes:
   a pair of pillar yokes facing each other over the conductor and extending in the direction orthogonal to the layer stack face of the stacked body;
   a first beam yoke connected to one end on the stacked body side, of each of the pair of pillar yokes and having the connection part, and
   a second beam yoke connected to the other end of each of the pair of pillar yokes, and has a closed sectional shape.

10. A magneto-resistive element according to claim 1, wherein the connection part also serves as the magneto-sensitive layer.

11. A magnetic memory cell having a pair of magneto-resistive elements each comprising:
    a magnetic yoke disposed in a partial region along an extension direction of a conductor and disposed in the circumferential direction so as to surround the conductor; and
    a stacked body including a magneto-sensitive layer of which magnetization direction changes according to an external magnetic field, and magnetically coupled to the magnetic yoke,
    wherein the pair of magneto-resistive elements shares a part of the magnetic yoke, and
    area of a cross section orthogonal to the circumferential direction of the magnetic yoke is the smallest in a part connected to the stacked body.

12. A magnetic memory cell according to claim 11, wherein the area of the cross section of the magnetic yoke gradually decreases toward the connection part.

13. A magnetic memory device comprising:
    a first write line;
    a second write line extending so as to cross the first write line and constructed so as to extend parallel to the first write line in a portion corresponding to an area of intersection with the first write line; and a magnetic memory cell including a pair of magneto-resistive elements, wherein each of the pair of magneto-resistive elements has: a magnetic yoke disposed in a partial region along an extension direction of the first and second write lines and disposed in the circumferential direction so as to surround the first and second write lines; and a stacked body including a magneto-sensitive layer of which magnetization direction changes according to an external magnetic field, and magnetically coupled to the magnetic yoke, and shares a part of the magnetic yoke, and area of a cross section orthogonal to the circumferential direction of the magnetic yoke is the smallest in a part connected to the stacked body.

14. A magnetic memory device according to claim 13, wherein area of the cross section in the magnetic yoke gradually decreases toward the connection part.

15. A magnetic memory device according to claim 13, wherein width of the magnetic yoke is the smallest in the connection part.

16. A magnetic memory device according claim 13, wherein width of the magnetic yoke gradually decreases toward the connection part.

17. A magnetic memory device according to claim 13, wherein thickness of the magnetic yoke is the smallest in the connection part.

18. A magnetic memory device according to claim 13, wherein thickness of the magnetic yoke gradually decreases toward the connection part.

19. A magnetic memory device according to claim 13, wherein each of the pair of magnetic yokes includes one beam yoke extending in the direction along a layer stack face of the stacked body and having the connection part.

20. A magnetic memory device according to claim 13, wherein each of the pair of the magnetic yokes includes:

a pair of pillar yokes facing each other over the first and second write lines and extending in the direction orthogonal to the layer stack face of the stacked body; and one beam yoke connected to one end on the stacked body side, of each of the pair of pillar yokes and having the connection part, and has a partially opened sectional shape and the pair of magneto-resistive elements shares at least one of the pair of pillar yokes.

21. A magnetic memory device according to claim 13, wherein each of the pair of the magnetic yokes includes:

a pair of pillar yokes facing each other over the first and second write lines and extending in the direction orthogonal to the layer stack face of the stacked body;

a first beam yoke connected to one end on the stacked body side, of each of the pair of pillar yokes and having the connection part; and a second beam yoke connected to the other end of each of the pair of pillar yokes, and has a closed sectional shape and the pair of magneto-resistive elements shares at least one of the pair of pillar yokes.

22. A magnetic memory device according to claim 13, wherein the connection part also serves as the magneto-sensitive layer.

* * * * *